US008680553B2

(12) United States Patent
Saito et al.

(10) Patent No.: US 8,680,553 B2
(45) Date of Patent: Mar. 25, 2014

(54) LIGHT-EMITTING DEVICE, LIGHT-RECEIVING DEVICE AND METHOD OF MANUFACTURING THE SAME

(75) Inventors: Shinichi Saito, Kawasaki (JP); Masahiro Aoki, Kokubunji (JP); Nobuyuki Sugii, Tokyo (JP); Katsuya Oda, Hachioji (JP); Toshiki Sugawara, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 272 days.

(21) Appl. No.: 13/129,115

(22) PCT Filed: Oct. 21, 2009

(86) PCT No.: PCT/JP2009/068106
§ 371 (c)(1),
(2), (4) Date: May 17, 2011

(87) PCT Pub. No.: WO2010/055750
PCT Pub. Date: May 20, 2010

(65) Prior Publication Data
US 2011/0227116 A1    Sep. 22, 2011

(30) Foreign Application Priority Data

Nov. 12, 2008 (JP) ................................. 2008-289948

(51) Int. Cl.
*H01L 33/34* (2010.01)
(52) U.S. Cl.
USPC ............................................. 257/98; 257/441
(58) Field of Classification Search
USPC ................... 257/98, 441, E33.072, E33.035
See application file for complete search history.

(56) References Cited

U.S. PATENT DOCUMENTS

| 2003/0235931 A1 | 12/2003 | Wada et al. |
| 2006/0043381 A1 | 3/2006 | Woerlee et al. |
| 2006/0281234 A1 | 12/2006 | Sugiyama et al. |

(Continued)

FOREIGN PATENT DOCUMENTS

| JP | 62-023193 A | 1/1987 |
| JP | 3-179729 A | 8/1991 |
| JP | 10-256158 A | 9/1998 |
| JP | 2005-530360 A | 10/2005 |

(Continued)

OTHER PUBLICATIONS

J. Menendez et al., "Type-I Ge/GE$_{1-x-y}$SI$_x$Sn$_y$ strained-layer heterostructures with a direct Ge bandgap", Applied Physics Letters, 2004, vol. 85, No. 7, pp. 1175-1177.

*Primary Examiner* — Tran Tran
(74) *Attorney, Agent, or Firm* — Miles & Stockbridge P.C.

(57) ABSTRACT

An object of the present invention is to provide a germanium laser diode that can be easily formed on a substrate such as silicon by using a normal silicon process and can emit light efficiently. A germanium light-emitting device according to the present invention is a germanium laser diode characterized in that tensile strain is applied to single-crystal germanium serving as a light-emitting layer to be of a direct transition type, a thin semiconductor layer made of silicon, germanium or silicon-germanium is connected adjacently to both ends of the germanium light-emitting layer, the thin semiconductor layer has a certain degree of thickness capable of preventing the occurrence of quantum confinement effect, another end of the thin semiconductor layer is connected to a thick electrode doped with impurities at a high concentration, the electrode is doped to a p type and an n type, a waveguide is formed so as not to be in direct contact with the electrode, and a mirror is formed at an end of the waveguide.

10 Claims, 114 Drawing Sheets

(56) References Cited

U.S. PATENT DOCUMENTS

| | | |
|---|---|---|
| 2007/0145394 A1 | 6/2007 | Shimizu et al. |
| 2008/0079022 A1 | 4/2008 | Yamamoto et al. |
| 2008/0128713 A1 | 6/2008 | Saito et al. |
| 2009/0057689 A1 | 3/2009 | Yamamoto et al. |

FOREIGN PATENT DOCUMENTS

| | | |
|---|---|---|
| JP | 2006-505934 A | 2/2006 |
| JP | 2006-351612 A | 12/2006 |
| JP | 2007-173590 A | 7/2007 |
| JP | 2007-294628 A | 11/2007 |
| JP | 2008-091572 A | 4/2008 |
| JP | 2009-54873 A | 3/2009 |

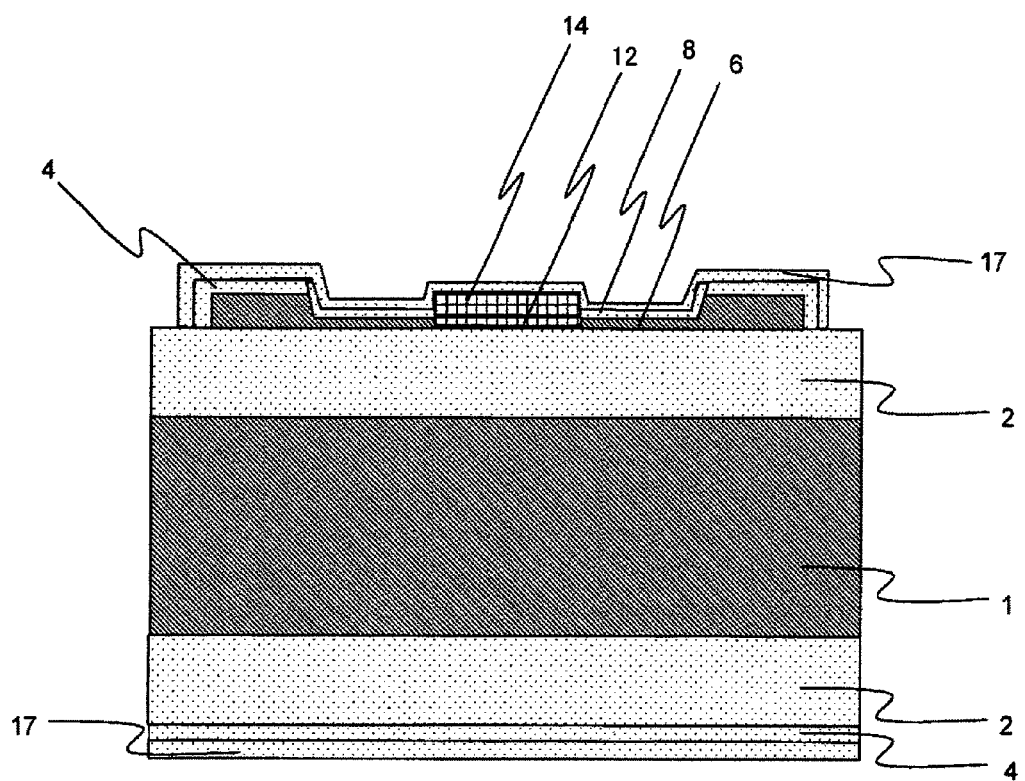

LIGHT-EMITTING DEVICE, LIGHT-RECEIVING DEVICE AND METHOD OF MANUFACTURING THE SAME

TECHNICAL FIELD

The present invention relates to a light-emitting device, a light-receiving device and a method of manufacturing these devices, and more particularly to a germanium laser diode, a germanium photodiode and a method of manufacturing these diodes using tensile strain.

BACKGROUND ART

In a broad band network that supports the Internet industry, optical communications have been adopted. For the transmission and reception of light in the optical communications, a laser diode using a compound semiconductor of a III-V group, a II-VI group or the like has been used.

Among various structures proposed for a compound semiconductor laser, a double hetero structure is a common example. In the double hetero structure, compound semiconductors of two different types are used, and a compound semiconductor with a small band gap is interposed between compound semiconductors with a larger band gap. To fabricate a double hetero structure, each of compound semiconductors with conductivity types of an n type, an undoped i type and a p type are epitaxially grown on a substrate successively so as to be stacked in a vertical direction. At this time, it is required to pay attention to a band structure of the undoped i-type compound semiconductor interposed therebetween, and it is important that a band gap thereof is smaller than that of each of the n-type and p-type compound semiconductors, the conduction band level of the i-type compound semiconductor is lower than the conduction band level of the n-type compound semiconductor, and the valence band level of the i-type compound semiconductor is higher than the valence band level of the p-type compound semiconductor. That is, the structure is such that electrons and holes are both confined in an i-type region.

Therefore, since electrons and holes tend to be in the same region, the probability of the collision and pair annihilation between the electrons and the holes increases, and as a result, the luminous efficiency can be increased. Also, the refractive index tends to increase as the band gap decreases. Therefore, by selecting a material with the refractive index of the i-type compound semiconductor smaller than the refractive indexes of the n-type and p-type compound semiconductors, light is also confined in the i-type compound semiconductor. In addition, by devising an air-ridge structure or a distributed Bragg reflector (abbreviated as DBR) mirror structure, a contrivance for confining the light more effectively in a resonator is made. The light confined in the semiconductor resonator in this manner efficiently induces recoupling between the electron and the hole forming a population inversion, which thus leads to laser oscillation.

As described above, through the optical communications using the compound semiconductor which efficiently emits light, a large amount of long-distance information communications are instantaneously conducted. More specifically, information processing and storing are performed on an LSI based on silicon, and information transmission is performed by a laser based on a compound semiconductor.

If a IV-group semiconductor such as silicon or germanium can be caused to emit light efficiently, an electronic device and a light-emitting device can be both integrated on a silicon chip, and therefore its industrial value is enormous.

However, since silicon and germanium in a bulk state are indirect transition semiconductors, it is difficult to cause them to emit light efficiently. An indirect transition band structure indicates a band structure in which either one of a momentum where energy of a conduction band is minimum and a momentum where energy of a valence band is minimum is not "0". In the case of silicon and germanium, the minimum energy point of the valence band is positioned at a Γ point where a momentum is "0", but the minimum energy point of the conduction band is positioned at a point far away from the Γ point. That is, electrons in the conduction band of silicon and germanium in a bulk state have an enormous momentum. On the other hand, a hole in the valence band has almost no momentum. For the light emission of a semiconductor device, an electron and a hole collide with each other for pair annihilation, and a difference in energy therebetween has to be extracted as light. At that time, the laws of conservation of energy and momentum have to be both satisfied. Therefore, in silicon and germanium in a bulk state, in the course where an electron and a hole simply collide with each other, the law of conservation of momentum and the law of conservation of energy cannot be simultaneously satisfied. In such a circumstance, for example, only electron-hole pairs that have managed to simultaneously satisfy the law of conservation of momentum and the law of conservation of energy by absorbing or emitting phonon, which is a quantum of lattice vibration in a crystal, are converted to light. This process can be physically present, but the probability of occurrence of such a phenomenon is small because this process is a high-order scattering process in which an electron, a hole, a photon and a phonon simultaneously collide with each other. Thus, it is known that silicon and germanium in a bulk state which are indirect transition type semiconductors have an extremely low luminous efficiency.

By contrast, in most of direct transition compound semiconductors, the minimum point of energy is present at a Γ point in both of the conduction band and the valence band. Therefore, the law of conservation of momentum and the law of conservation of energy can be both satisfied. Thus, the luminous efficiency is high in this type of compound semiconductors.

As a method of changing silicon to a direct transition semiconductor, a method using a nano structure has been known. Candidates of the nano structure include nano particles, nano wires and nano thin films, and they are characterized to have low-dimensional structures such as a zero-dimensional structure, a one-dimensional structure and a two-dimensional structure, respectively. In the silicon in a nano structure like this, since a region in which electrons move is spatially restricted, the momentum of electrons is restricted and the effective momentum of electrons decreases. As a result of the so-called quantum confinement effect like this, when an electron and a hole collide with each other, the law of conservation of momentum becomes established, and light can be emitted efficiently. Since the surface of silicon is extremely prone to being oxidized, the surface of the nano structure tends to be covered with silicon dioxide, which is an insulator. Therefore, although silicon having a nano structure emits light with photoexcitation, it is difficult to cause this silicon to efficiently emit light with current injection.

However, as disclosed in Japanese Patent Application Laid-Open Publication No. 2007-294628, a device has been invented, in which ultrathin single-crystal silicon is efficiently caused to emit light by directly connecting an electrode to silicon having a nano structure and injecting a carrier in a direction horizontal to a substrate.

As a technique of transfiguring an indirect transition semiconductor to a direct transition semiconductor, in addition to the method using a low-dimensional nano structure, a method applying tensile strain has also been known. For example, Japanese Unexamined Patent Application Publication No. 2005-530360 discloses a method in which germanium is epitaxially grown directly on silicon and tensile strain is applied to germanium by using a difference in thermal expansion coefficient between silicon and germanium. Since germanium can be made as a direct transition semiconductor when this technique is used, the sensitivity as a light-receiving device can be increased. Also, since the band gap can be decreased by applying tensile strain, it is possible to create a light-receiving device having a sensitivity in a 1.5 μm band used in the information communications using an optical fiber.

Also, Japanese Unexamined Patent Application Publication No. 2008-91572 discloses a technique in which tensile strain is applied to germanium by epitaxially growing quantum dots of germanium directly on silicon, thereby forming a light-receiving device having a sensitivity in a long-wavelength band.

Furthermore, Japanese Unexamined Patent Application Publication No. 2007-173590 discloses a technique of forming a light-emitting device by applying tensile strain to silicon.

As another method using an indirect transition semiconductor as a light-emitting device, Japanese Unexamined Patent Application Publication No. 2006-505934 discloses a device structure using an SOI (Silicon On Insulator) substrate, in which a portion of silicon that emits light is thickened and a thin silicon portion is disposed adjacent to the thick silicon portion. Since a current becomes difficult to flow through the thin silicon portion when this device structure is used, it can be thought that light can be efficiently emitted even when the thick silicon portion remains as an indirect transition semiconductor.

PRIOR ART DOCUMENTS

Patent Documents

Patent Document 1: Japanese Unexamined Patent Application Publication No. 2007-294628
Patent Document 2: Japanese Unexamined Patent Application Publication No. 2005-530360
Patent Document 3: Japanese Unexamined Patent Application Publication No. 2008-91572
Patent Document 4: Japanese Unexamined Patent Application Publication No. 2007-173590
Patent Document 5: Japanese Unexamined Patent Application Publication No. 2006-505934
Patent Document 6: Japanese Unexamined Patent Application Publication No. 2006-351612

Non-patent Documents

Non-Patent Document 1: Applied Physics Letters, 2004, Volume 85, pp. 1175-1177, J. Menendez and J. Kouvetakis

SUMMARY OF THE INVENTION

Problems to be Solved by the Invention

As described above, long-distance information communications are performed through optical communications and a compound semiconductor is used in an optical device therefor. Although a laser made of a compound semiconductor is extremely efficient, there is a problem that the integration thereof has not been progressed because the compound semiconductor is an expensive material and is made of a plurality of elements and difficult to control. This disadvantage is such that, for example, if the yield at the time of making one laser or light-emitting device from a compound semiconductor is 70%, the yield becomes 50% when two lasers or devices are combined. While a term of an opto electronic IC (hereinafter abbreviated as OEIC) does exist, it is practically difficult to implement an OEIC in the case of an optical device using a compound semiconductor.

On the other hand, in the case of an LSI using silicon and a product subjected to state-of-the-art micromachining, more than one hundred million metal-insulator-semiconductor field-effect-transistors have already been integrated, and such LSIs have been mass-produced and commercialized. In other words, in the case of a device using silicon, a high-quality single-crystal silicon substrate is readily available, and therefore, a plurality of devices can be made with yield of nearly 100%. Thus, even when a large amount of devices are integrated on the same chip, it is possible to increase the yield as a chip to a practical level also in terms of cost. Therefore, it is desired to manufacture highly-efficient light-emitting devices and light-receiving devices based on a IV-group semiconductor such as silicon or germanium homologous thereto inexpensively and with a high degree of reliability in a silicon process line whose infrastructure is well-organized.

In the light-emitting device of ultrathin single-crystal silicon disclosed in Japanese Unexamined Patent Application Publication No. 2007-294628, silicon itself is caused to emit light. Therefore, if light from that light-emitting device leaks from a waveguide, the light is sometimes absorbed into a portion of silicon where an electronic circuit is mounted, which causes a problem of an erroneous operation in the electronic circuit. Ultrathin germanium can be used in place of silicon. Even in that case, however, since the band gap is increased due to a quantum confinement effect, the light-emitting wavelength becomes a short wavelength, and a similar problem occurs. Therefore, it is desired to fabricate a light-emitting device of germanium with a light-emission principle other than the quantum confinement effect. Since the band gap of germanium is smaller than the band gap of silicon, the light emitted from germanium with a small quantum confinement effect is not absorbed into silicon, and there is no fear of causing an erroneous operation in the electronic circuit.

Also, for performing the high-speed optical information transmission by using a light-emitting device of germanium, it is not sufficient to cause light emission simply as an LED (Light-Emitting Diode), and it is necessary to cause laser oscillation as an LD (Laser Diode). If laser oscillation is possible, direct modulation can be made at higher speed, and since laser light goes through a waveguide with directivity, it can be used for the purpose of optical wiring between chips or inside a chip. For the laser oscillation, it is not sufficient to simply convert a current to light, and it is necessary to form a resonator structure capable of efficiently confining light at a light-emitting portion.

However, in the conventional technology, for example, in Japanese Unexamined Patent Application Publication No. 2007-173590, since a high-concentration impurity-doped region serving as an electrode exists inside a portion where light is confined, it has the problem that the confined light is absorbed by carriers in the electrode. As described above, in a semiconductor laser using a known compound semiconductor, since the semiconductor material of a light-emitting part has a refractive index larger than that of a semiconductor material to be an electrode, light is confined apart from the electrode. Therefore, the problem described above does not occur. However, when a PIN light-emitting diode is formed of germanium and its diffusion layer, since the electrode and the light-emitting layer are made of the same material, light cannot be effectively confined. More specifically, there is a problem that the technique of transfiguring germanium to a direct transition structure by applying tensile strain and the light confinement have to be both achieved.

Furthermore, for efficient light emission, not only light has to be confined but also carriers have to be effectively confined. In the conventional semiconductor laser made of compound semiconductors, with the double hetero structure described above, the so-called Type-I band alignment can be designed, and electrons and holes can be confined in the same semiconductor light-emitting layer. However, it is difficult to obtain good interface characteristics by connecting a semiconductor material that can be connected to germanium in Type I. For example, the connection of silicon and germanium is the connection of the so-called Type II, and therefore, carriers cannot be effectively confined in germanium. As a candidate for forming the Type I connection to germanium, a junction between Ge and $Ge_{1-x-y}Si_xSn_y$ has been theoretically suggested in Non-Patent Document 1. According to Non-Patent Document 1, it is demonstrated by a theoretical band computation that tensile strain can be applied to Ge by using tin (Sn) and silicon (Si) and a junction of Type I can be obtained. However, the actual use of a Ge substrate in a silicon process has not become a common practice, and a technique of growing a crystal of $Ge_{1-x-y}Si_xSn_y$ has not been established. Therefore, it is difficult to fabricate an excellent interface between Ge and $Ge_{1-x-y}Si_xSn_y$. As a technique for effectively achieving the band alignment of Type I for a IV-group semiconductor, Japanese Unexamined Patent Application Publication No. 2006-505934 discloses a light-emitting device structure in which a silicon that is so thin that a quantum confinement effect occurs is formed on both ends of a thickly-formed silicon. It is thought in this structure that the band gap of the thin-film portion of silicon increases compared with the band gap of the thickly-formed portion of silicon by a quantum confinement effect and therefore the substantial carrier confinement of Type I is possible. In this device structure, however, since the thick silicon portion at the center is an indirect transition semiconductor, luminous efficiency is low and the recoupling life is short, and therefore, modulation cannot be made at high speed. Moreover, since a current flows through the portion thin enough to cause the quantum confinement effect, the problem of the increase in external resistance occurs. Thus, it is desired to devise a structure which can be fabricated by using an existing silicon process technology and in which carriers can be effectively injected into a germanium light-emitting layer without requiring the band alignment of Type I and a manufacturing technique for fabricating the structure.

Still further, to achieve a semiconductor laser having a light-emitting layer made of germanium, high-quality crystallinity of germanium is important. Although a germanium single-crystal substrate is available, a germanium substrate is hardly used in the existing silicon process step and the use of a germanium substrate is not practical in consideration of an application purpose such as mounting with an electronic circuit. On the other hand, when a silicon substrate or an SOI (Silicon On Insulator) substrate is used, a technique of epitaxially growing germanium on silicon is required. However, since the lattice constant of silicon and the lattice constant of germanium are significantly different from each other, when germanium is epitaxially grown directly on silicon, many crystal defects or dislocations are created. In the situation where many crystal defects exist, the non-radiative recombination of carriers occurs near the defects, and therefore laser oscillation cannot be made. Moreover, when germanium in which many crystal defects exist is used as a light-receiving device, electron-hole pairs tend to be generated from these defects. Therefore, a dark current flowing even when light does not enter is increased, and the problem of the increase of power consumption at the time of standby occurs. Japanese Unexamined Patent Application Publication No. 2006-351612 discloses a condensed oxidizing method as a method of forming a high-quality germanium layer on an SOI substrate. This is a technology in which, after SiGe having a low germanium concentration is epitaxially grown on an SOI substrate so as not to cause a crystal defect, its surface is oxidized to selectively oxidize silicon and the concentration of germanium left unoxidized is increased, thereby forming a GOI (Germanium On Insulator) substrate. However, since an application to an LSI is assumed in this technology, only Ge having an extremely small film thickness of several nm can be formed and this technology cannot be applied to light-emitting and light-receiving devices that require a certain degree of film thickness. More specifically, it is desired to form germanium having a film thickness sufficient for use as a light-emitting device or a light-receiving device and having an extremely high quality of crystallinity on a silicon substrate or an SOI substrate.

A first object of the present invention is to provide a germanium light-emitting device (germanium laser diode) that can be easily formed on a substrate such as silicon by using a normal silicon process and also emits light efficiently.

A second object of the present invention is to provide a highly-sensitive germanium light-receiving device (germanium photodiode) having a small dark current and capable of high-speed operation.

Means for Solving the Problems

The following is a brief description of an outline of the typical invention disclosed in the present application.

A germanium light-emitting device according to the present invention is a germanium laser diode having following features. That is, tensile strain is applied to a single-crystal germanium film serving as a light-emitting layer to be a direct transition type, a thin semiconductor layer made of silicon, germanium or silicon-germanium is connected adjacently to both ends of the germanium light-emitting layer, the thin semiconductor layer has a certain degree of thickness which does not cause a quantum confinement effect, another end of the thin semiconductor layer is connected to a thick electrode doped with impurities at a high concentration, the electrode is doped to a p type and an n type, a waveguide is formed so as not to directly make contact with the electrode, and a mirror is formed at an end of the waveguide.

For the achievement of carrier confinement independent of the Type-I connection described above, in the germanium laser diode of the present invention, the film thickness of the single-crystal germanium film serving as a light-emitting layer itself is reduced. Since the film itself is thin, by letting a high-density current flow therethrough, the concentration of carriers can be inevitably increased. While the film thickness is reduced, it is desired that a certain degree of film thickness capable of preventing the occurrence of the quantum confinement effect is maintained so as to prevent the problem of the increase of parasitic resistance described above. Preferably, the film thickness of the germanium light-emitting layer is larger than 3 nm because the quantum confinement effect becomes conspicuous at the thickness of 3 nm or smaller, and is smaller than a luminous wavelength (λ to 1500 nm) for the restriction of an oscillation mode. In consideration of actual fabrication floating or the like, the film thickness of the germanium light-emitting layer is preferably 10 nm or larger and 500 nm or smaller. In this manner, in the present invention, the film thickness of germanium is made smaller to effectively increase the concentration of carriers, thereby increasing the probability that an electron and a hole collide with each other in a pair to generate photons. Specifically, as shown in embodiments further below, by fabricating an electrode of silicon or silicon-germanium, the concentration of carriers of about $1 \times 10^{20}$ [$1/cm^3$] can be achieved. This is a concentration of carriers sufficient for forming a population inversion with germanium. From a simple computation using a state density and Fermi distribution function, we have derived that carriers of an electron concentration of $8 \times 10^{15}$ [$1/cm^3$] or higher and a hole concentration of $4 \times 10^{18}$ [$1/cm^3$] or higher are required in order to form a population inversion with germanium. This is larger by one order of magnitude or more compared with an electron concentration of $4 \times 10^{17}$ [$1/cm^3$] required for GaAs, which is a typical compound semiconductor. The impurity solubility limit concentration of a single-crystal germanium film is lower than the impurity solubility limit concentration of single-crystal silicon. Therefore, for the achievement of this high-concentration diffusion layer, only the use of a germanium diffusion layer is not sufficient, and it is quite effective to use a silicon or silicon-germanium diffusion layer electrode.

Still further, the germanium light-receiving device according to the present invention is a germanium photodiode having following features. That is, the device is fabricated by using an SOI substrate in which silicon dioxide is formed on a silicon substrate. A single-crystal germanium film to be a light-receiving layer is formed on the silicon dioxide. Single-crystal germanium doped with impurities at a high concentration to a p type and an n type is connected adjacently to the single-crystal germanium light-receiving layer.

Effects of the Invention

The effects obtained by typical embodiments of the invention disclosed in the present application will be briefly described below.

According to the present invention, a germanium laser diode and a germanium photodiode which can be easily formed by using a silicon process whose infrastructure is well-organized can be provided on an SOI substrate inexpensively and with a high degree of reliability.

According to the present invention, by applying tensile strain without using a quantum confinement effect, highly-efficient light emission from a germanium light-emitting device can be achieved. Also, by applying tensile strain, the technology of transfiguring germanium to a direct transition structure and the light confinement to prevent attenuation of light due to the electrode can be both achieved. Also, in the germanium laser diode according to the present invention, by fabricating an electrode of high-concentration silicon-germanium, the concentration of carriers of single-crystal germanium serving as a light-emitting layer can be increased to a degree capable of sufficiently forming the population inversion without using a combination of materials to achieve the band alignment of Type I. As a result, laser oscillation can be achieved.

When the manufacturing method according to the present invention is used, germanium having a film thickness sufficient for use as a light-emitting device or a light-receiving device and having an extremely high quality of crystallinity can be formed on a silicon substrate or an SOI substrate.

Also, since germanium is hardly influenced by the quantum confinement effect, energy of laser light from the germanium laser diode according to the present invention is smaller than the band gap of silicon and is not absorbed into silicon, and there is no fear of causing an erroneous operation in the electronic circuit. As a result, an opto electronic IC OEIC and an electronic circuit can be mounted together.

BRIEF DESCRIPTIONS OF THE DRAWINGS

FIG. 1N is a sectional view showing the manufacturing process of the germanium laser diode according to the first embodiment of the present invention;

FIG. 1O is a sectional view showing the manufacturing process of the germanium laser diode according to the first embodiment of the present invention;

BEST MODE FOR CARRYING OUT THE INVENTION

Figure 1A:
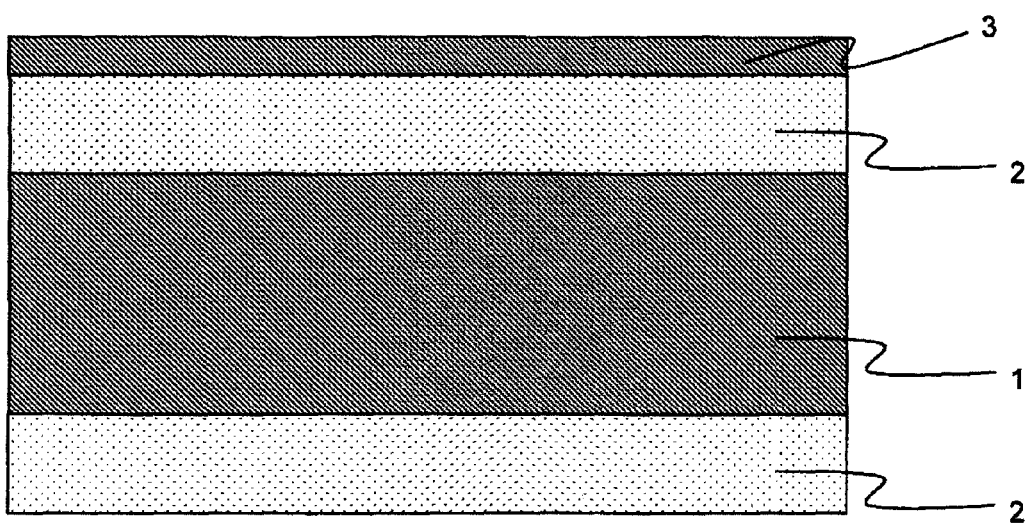
FIG. 1A is a sectional view showing a manufacturing process of a germanium laser diode according to a first embodiment of the present invention.

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, it is needless to say that various modifications such as a change of combination of materials and manufacturing processes can be made in addition to the methods described in the following embodiments.

Specific embodiments will be described below. The views shown in the drawings are not necessarily accurate in the scale, and are schematically drawn with putting an emphasis on an important portion so as to clarify the logic.

First Embodiment

In the present embodiment, a germanium laser diode created by a method easily achieved by a normal silicon process and a method of manufacturing the germanium laser diode will be disclosed.

Figure 1B:
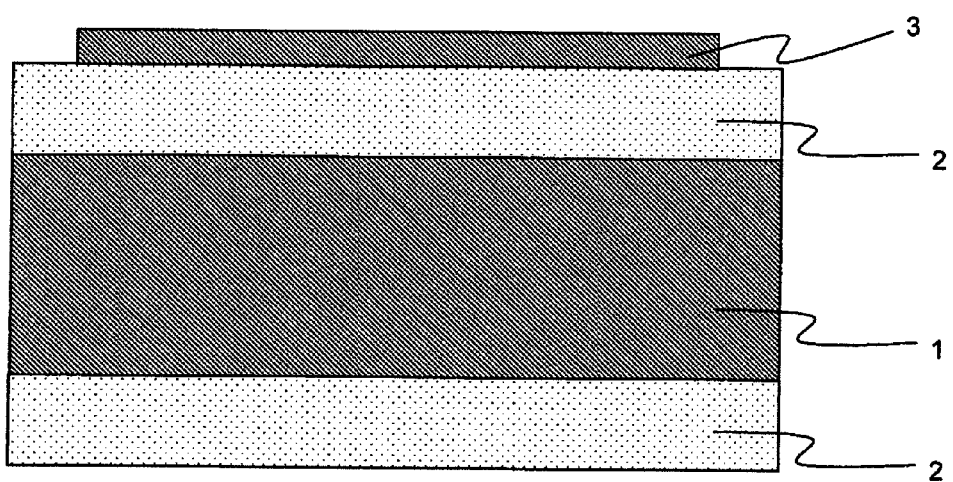
FIG. 1B is a sectional view showing the manufacturing process of the germanium laser diode according to the first embodiment of the present invention.
Figure 1C:
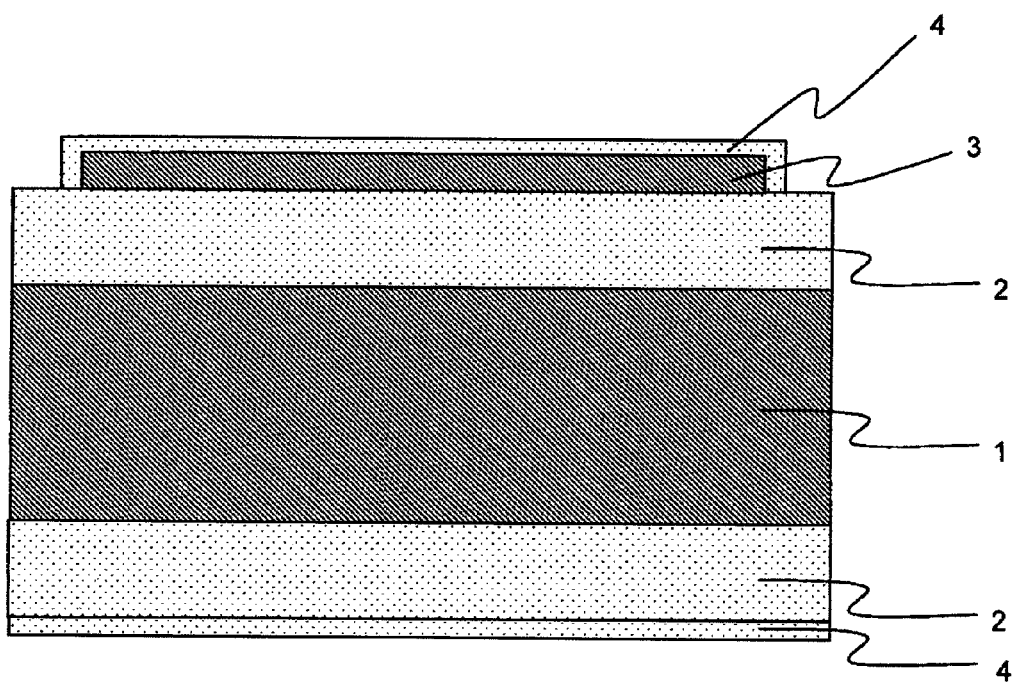
FIG. 1C is a sectional view showing the manufacturing process of the germanium laser diode according to the first embodiment of the present invention.
Figure 1D:
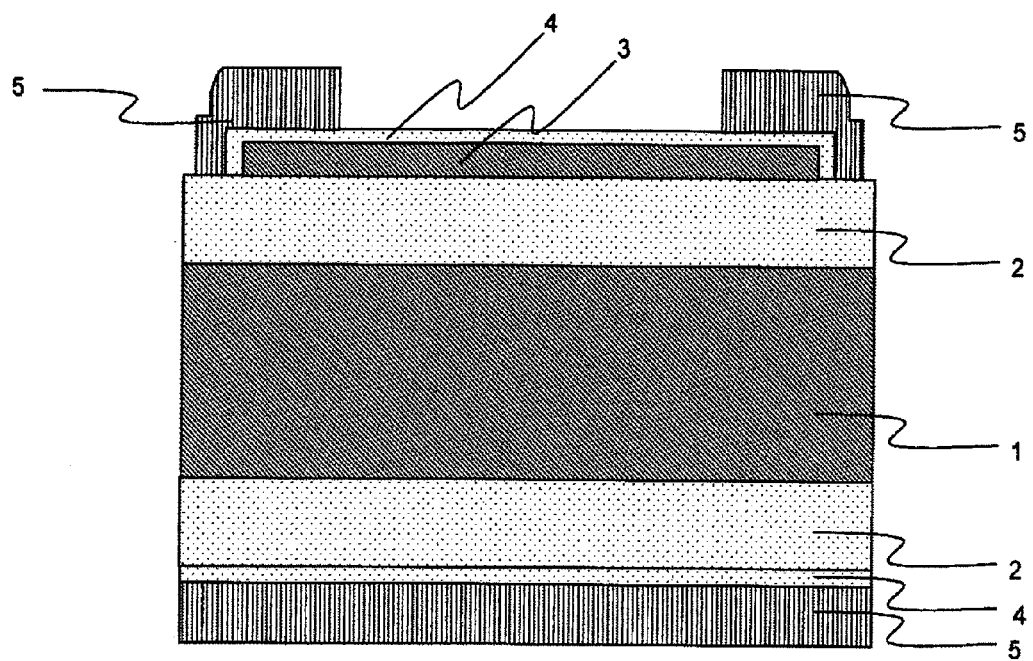
FIG. 1D is a sectional view showing the manufacturing process of the germanium laser diode according to the first embodiment of the present invention.
Figure 1E:
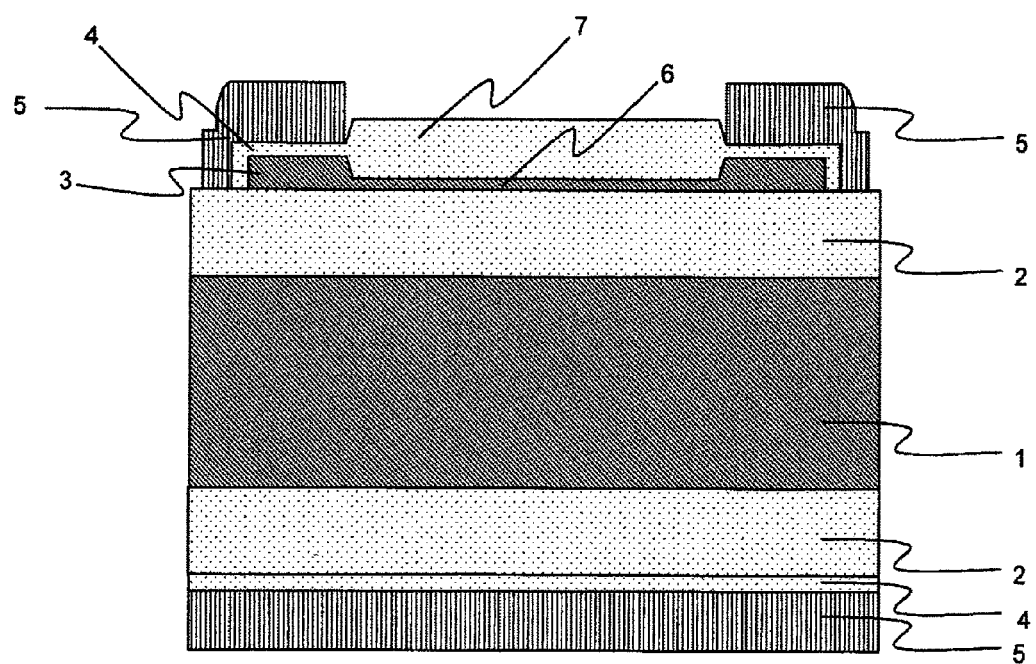
FIG. 1E is a sectional view showing the manufacturing process of the germanium laser diode according to the first embodiment of the present invention.
Figure 1F:
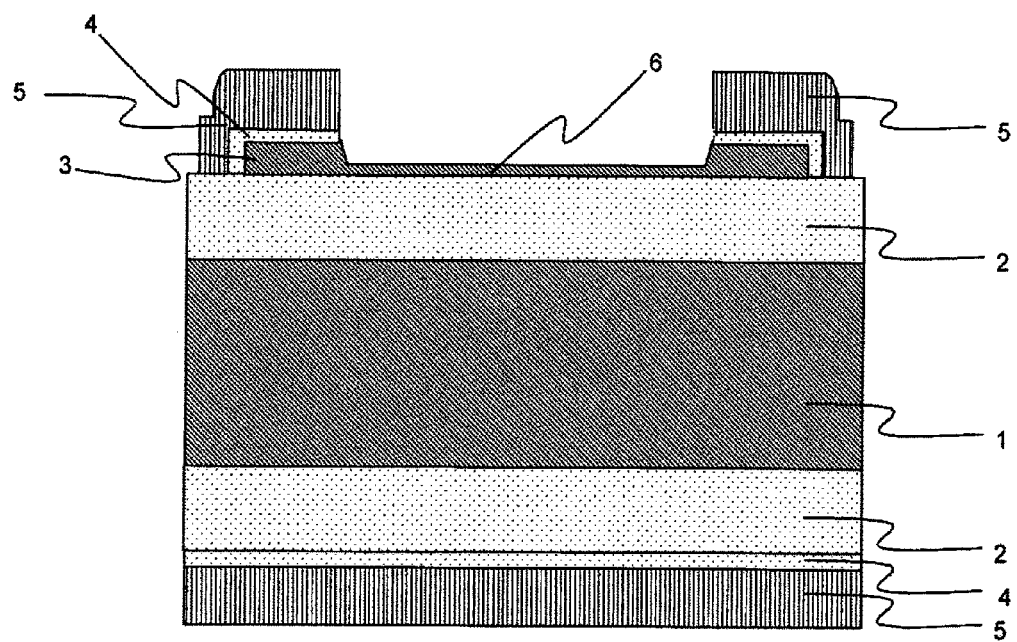
FIG. 1F is a sectional view showing the manufacturing process of the germanium laser diode according to the first embodiment of the present invention.
Figure 1G:
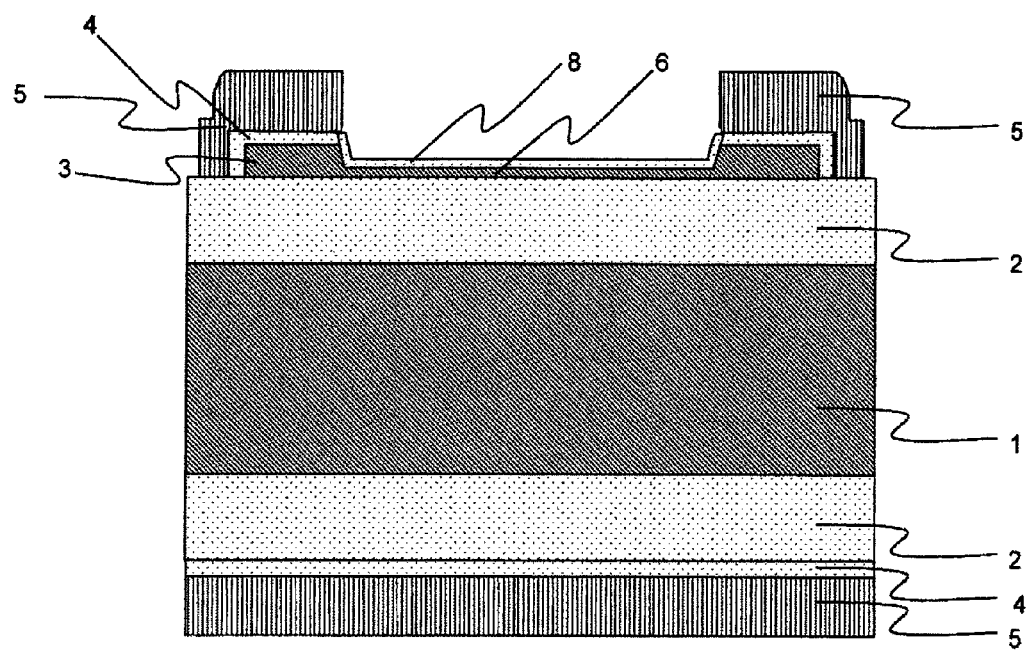
FIG. 1G is a sectional view showing the manufacturing process of the germanium laser diode according to the first embodiment of the present invention.
Figure 1H:
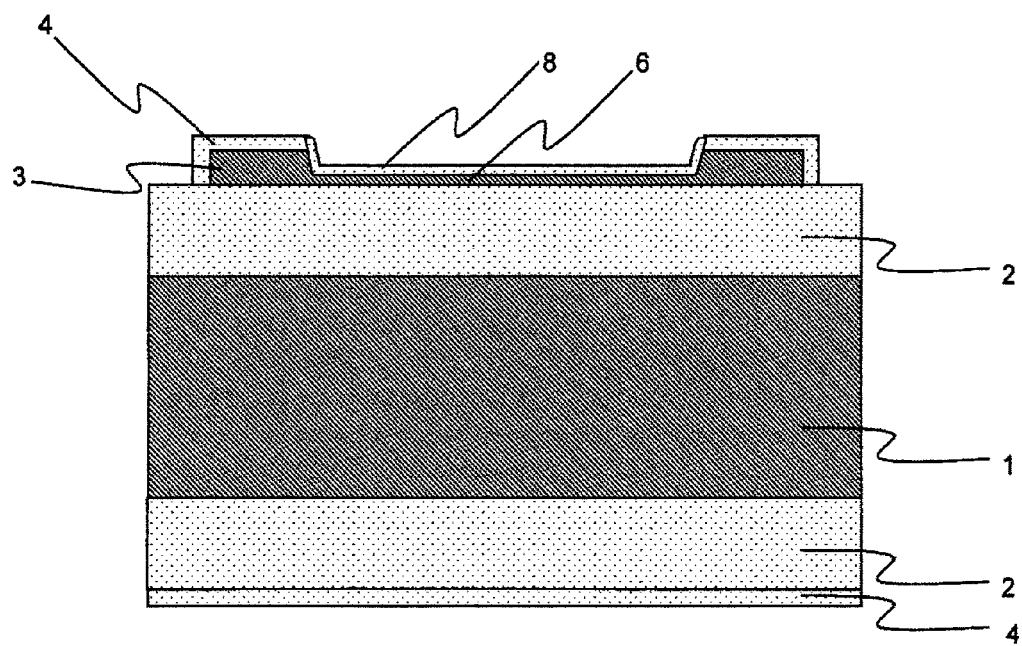
FIG. 1H is a sectional view showing the manufacturing process of the germanium laser diode according to the first embodiment of the present invention.
Figure 1I:
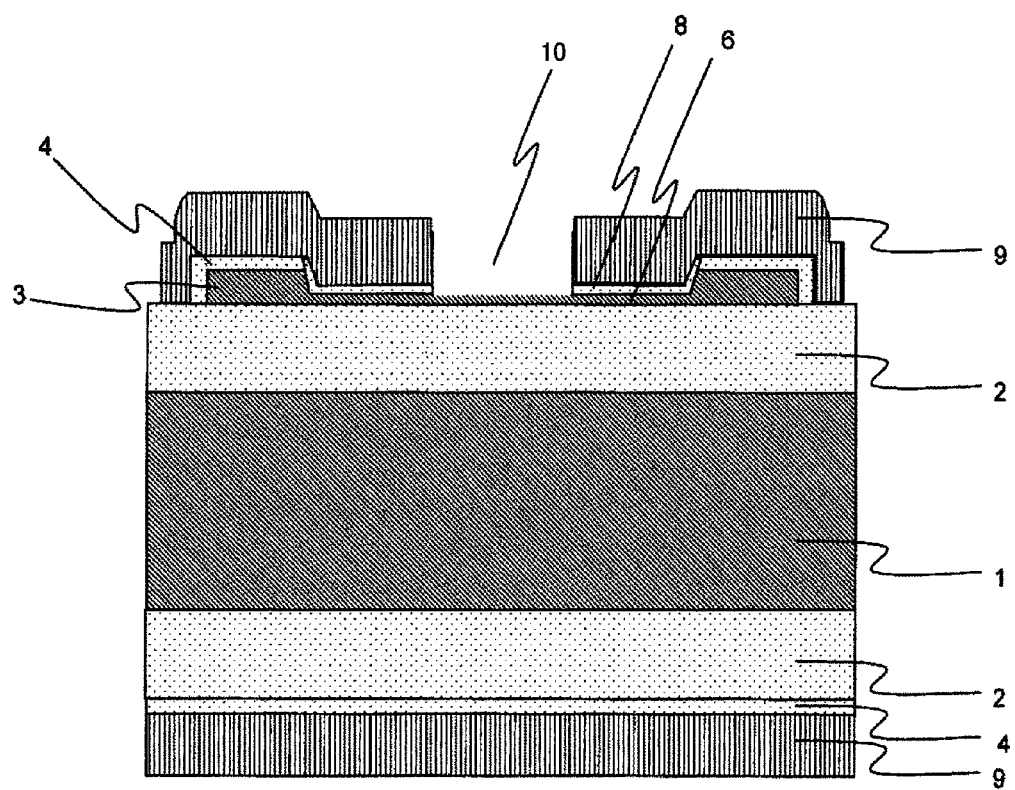
FIG. 1I is a sectional view showing the manufacturing process of the germanium laser diode according to the first embodiment of the present invention.
Figure 1J:
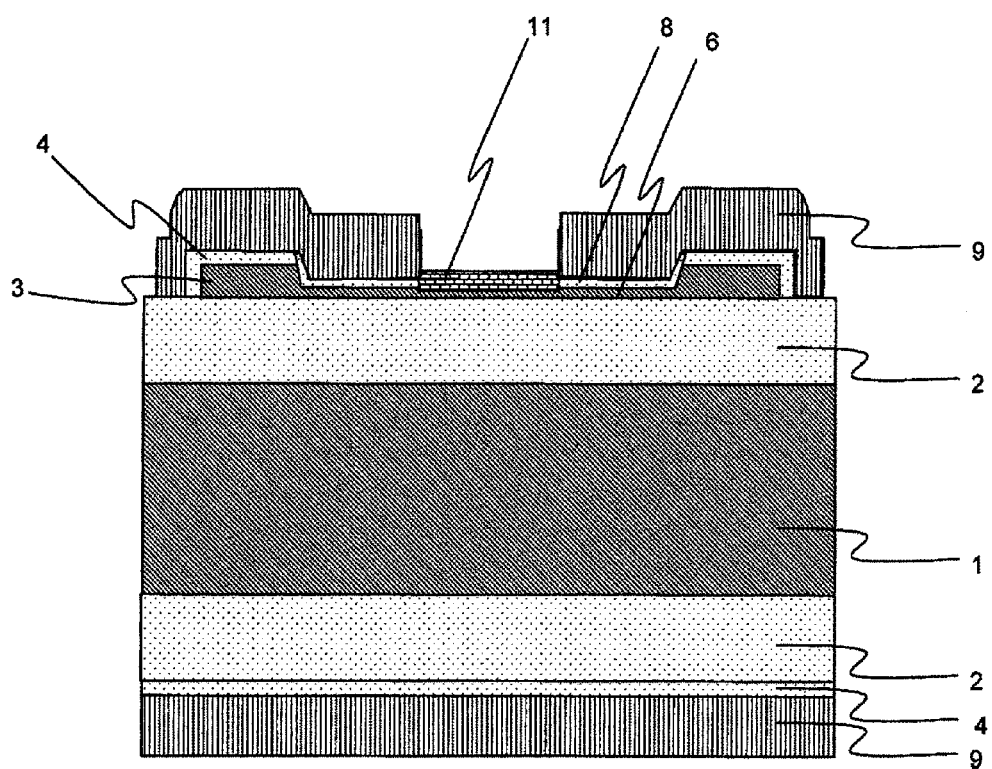
FIG. 1J is a sectional view showing the manufacturing process of the germanium laser diode according to the first embodiment of the present invention.
Figure 1K:
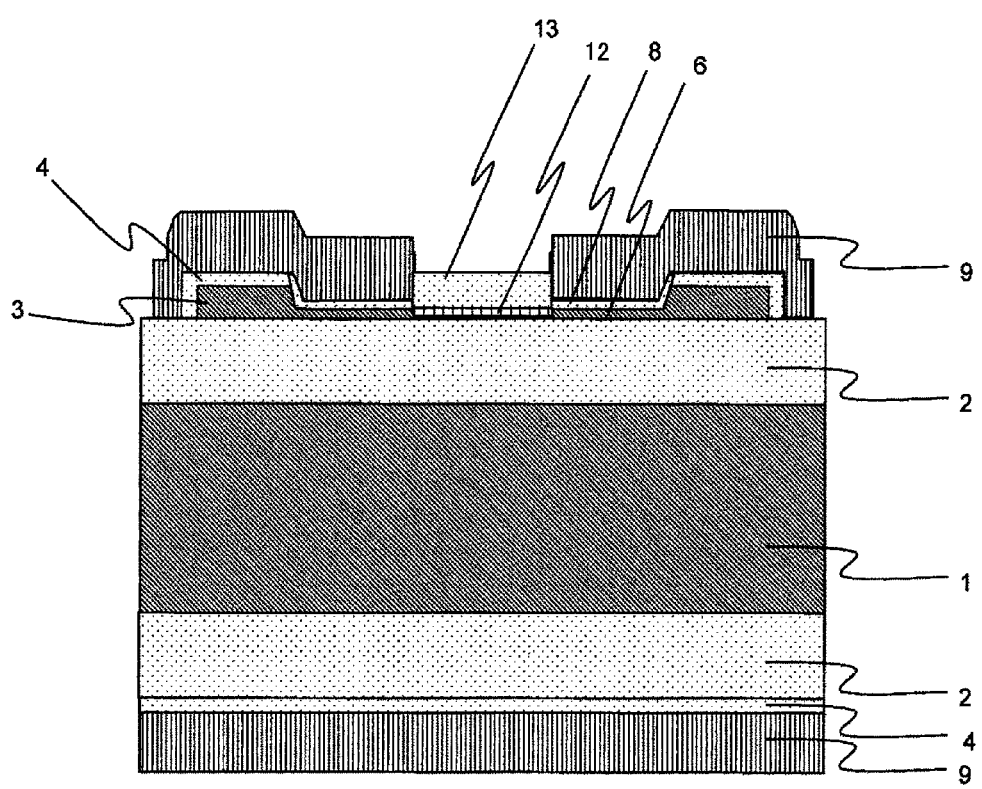
FIG. 1K is a sectional view showing the manufacturing process of the germanium laser diode according to the first embodiment of the present invention.
Figure 1L:
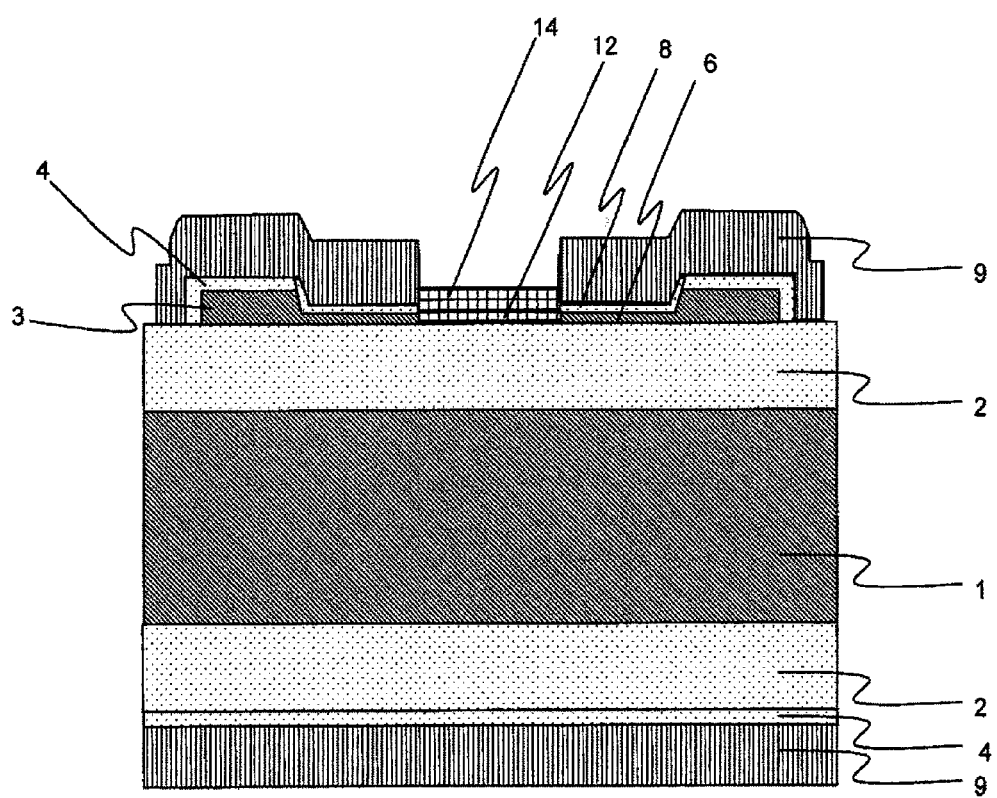
FIG. 1L is a sectional view showing the manufacturing process of the germanium laser diode according to the first embodiment of the present invention.
Figure 1M:
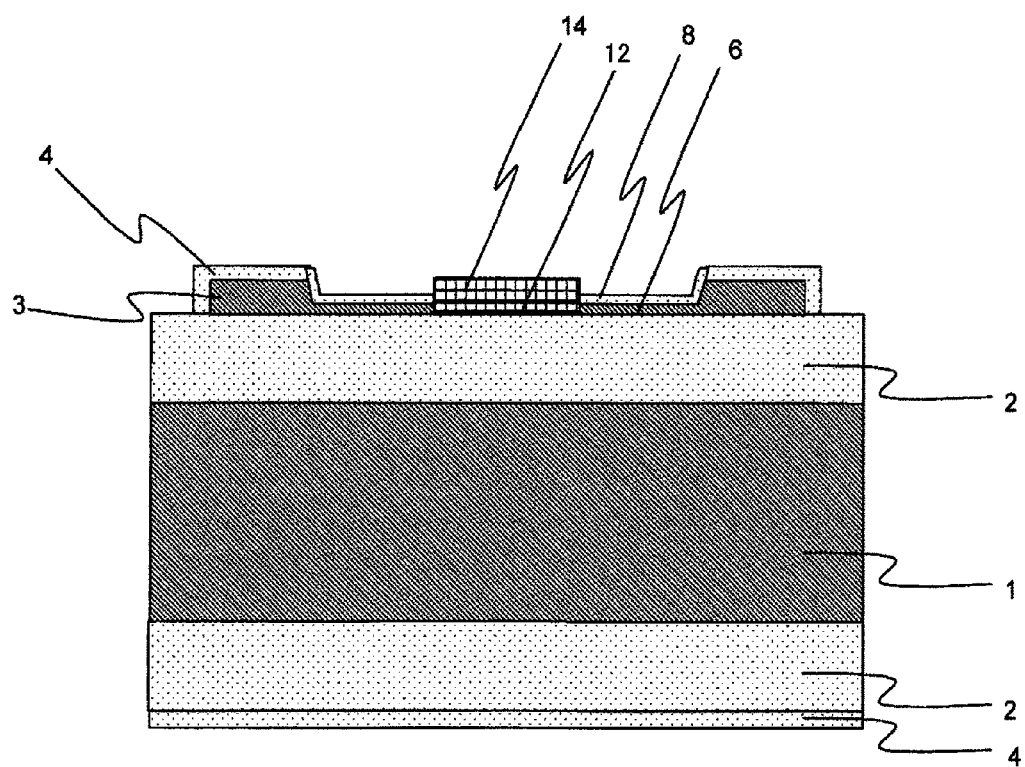
FIG. 1M is a sectional view showing the manufacturing process of the germanium laser diode according to the first embodiment of the present invention.
Figure 10:
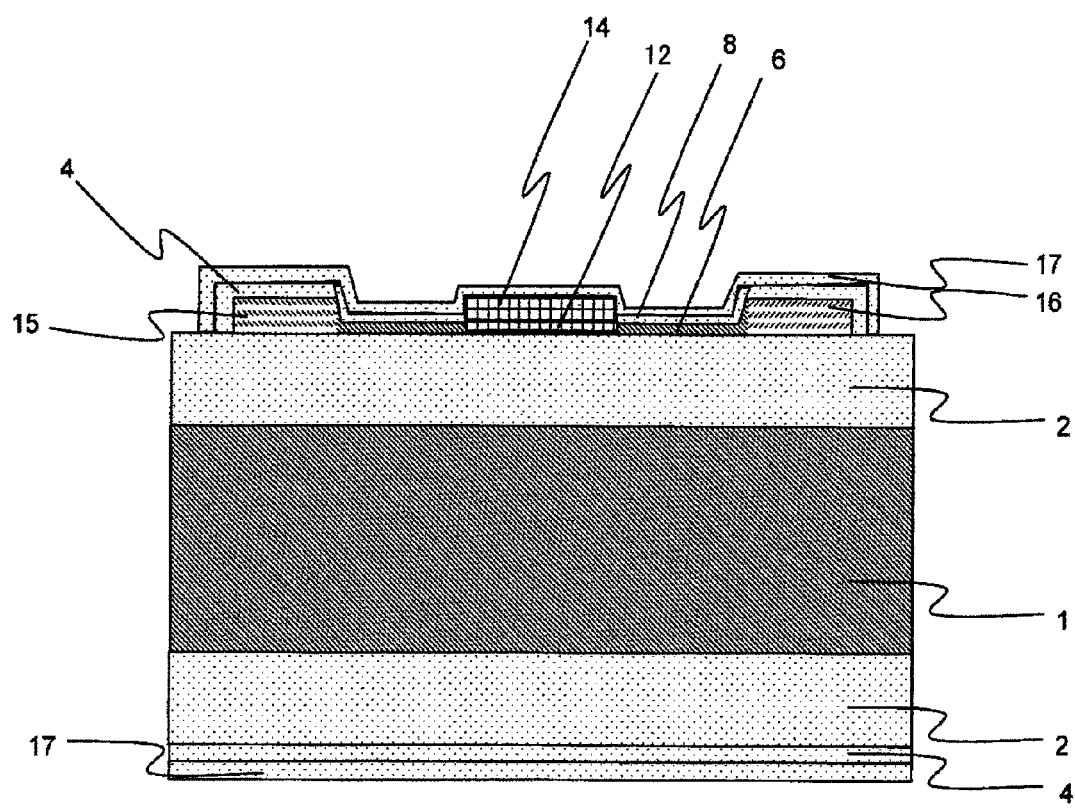
FIG. 10A is a sectional view showing a manufacturing process of a germanium photodiode according to a fourth embodiment of the present invention.
FIG. 10B is a sectional view showing the manufacturing process of the germanium photodiode according to the fourth embodiment of the present invention.
FIG. 10C is a sectional view showing the manufacturing process of the germanium photodiode according to the fourth embodiment of the present invention.
FIG. 10D is a sectional view showing the manufacturing process of the germanium photodiode according to the fourth embodiment of the present invention.
FIG. 10E is a sectional view showing the manufacturing process of the germanium photodiode according to the fourth embodiment of the present invention.
FIG. 10F is a sectional view showing the manufacturing process of the germanium photodiode according to the fourth embodiment of the present invention.
FIG. 10G is a sectional view showing the manufacturing process of the germanium photodiode according to the fourth embodiment of the present invention.
FIG. 10H is a sectional view showing the completed germanium photodiode according to the fourth embodiment of the present invention.
Figure 1P:
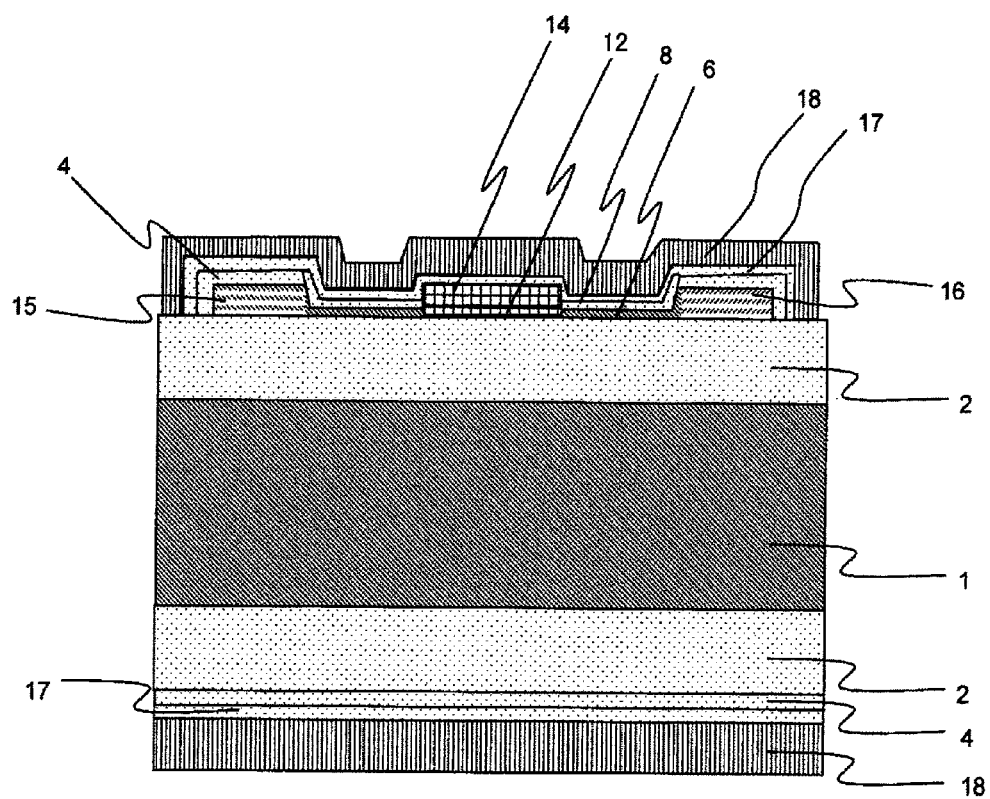
FIG. 1P is a sectional view showing the manufacturing process of the germanium laser diode according to the first embodiment of the present invention.
Figure 1Q:
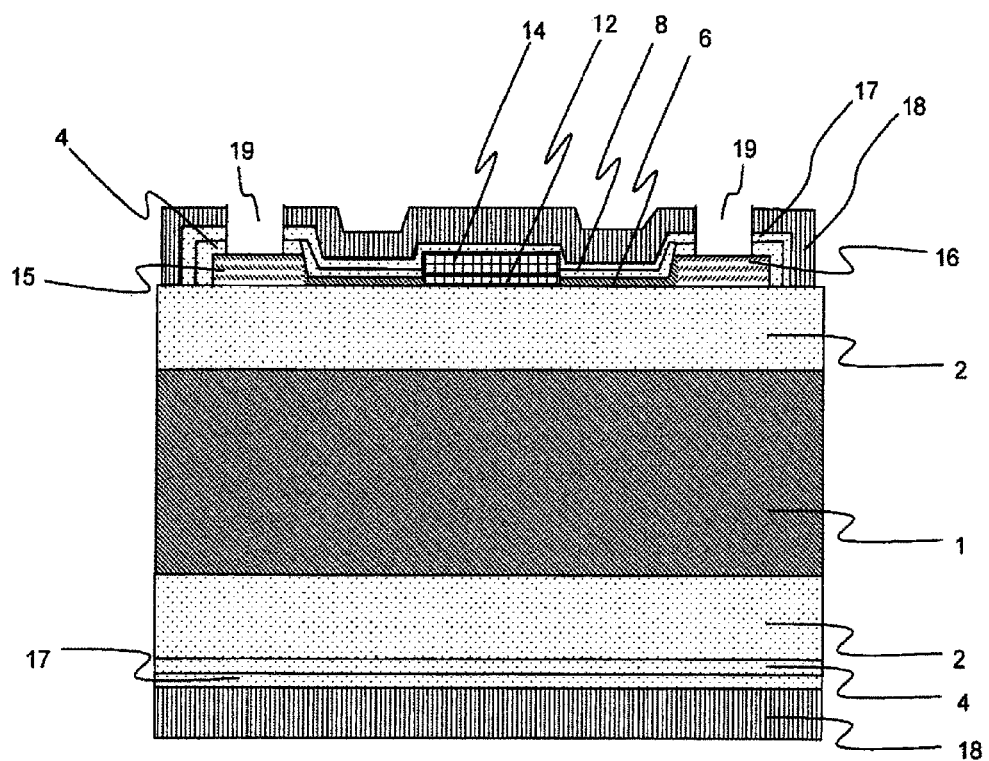
FIG. 1Q is a sectional view showing the manufacturing process of the germanium laser diode according to the first embodiment of the present invention.
Figure 1R:
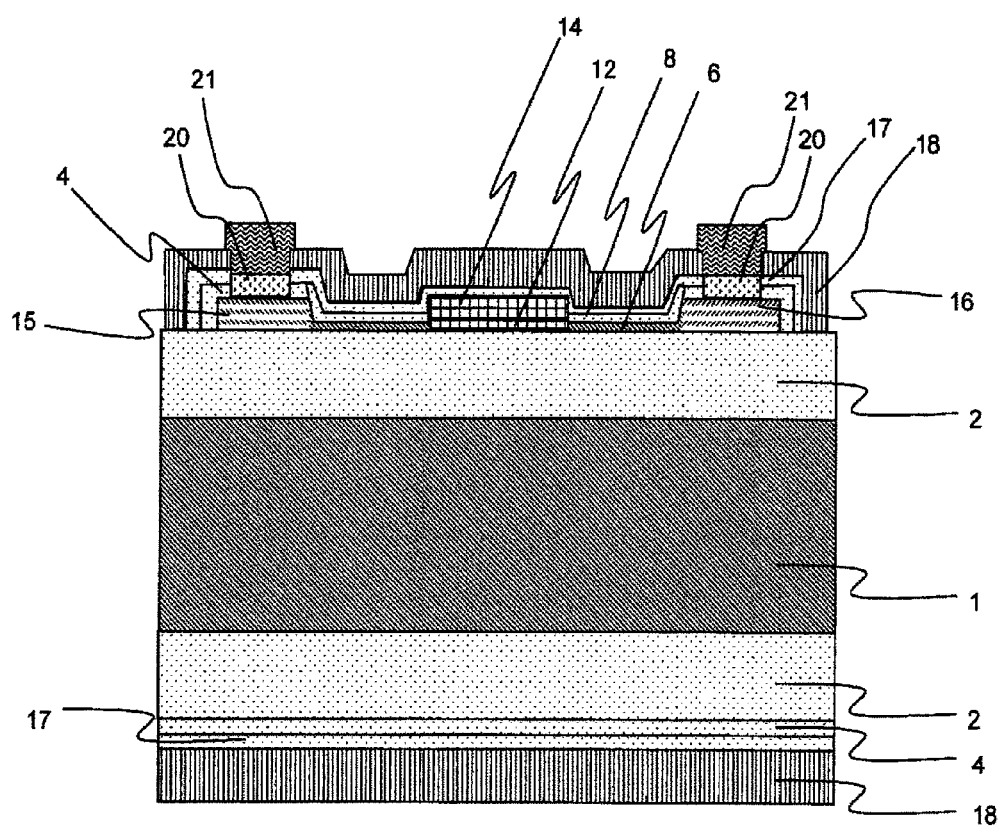
FIG. 1R is a sectional view showing the completed germanium laser diode according to the first embodiment of the present invention.
Figure 2A:
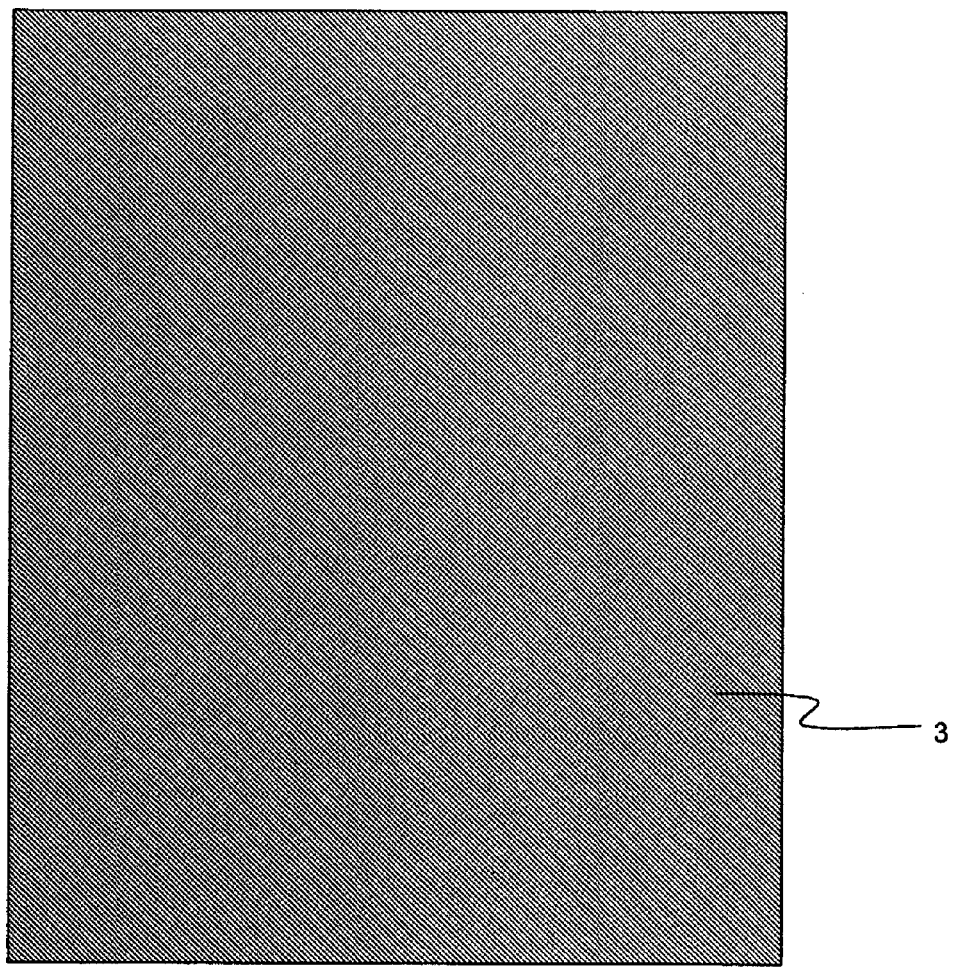
FIG. 2A is a view showing the manufacturing process of the germanium laser diode according to the first embodiment of the present invention seen from above.
Figure 2B:
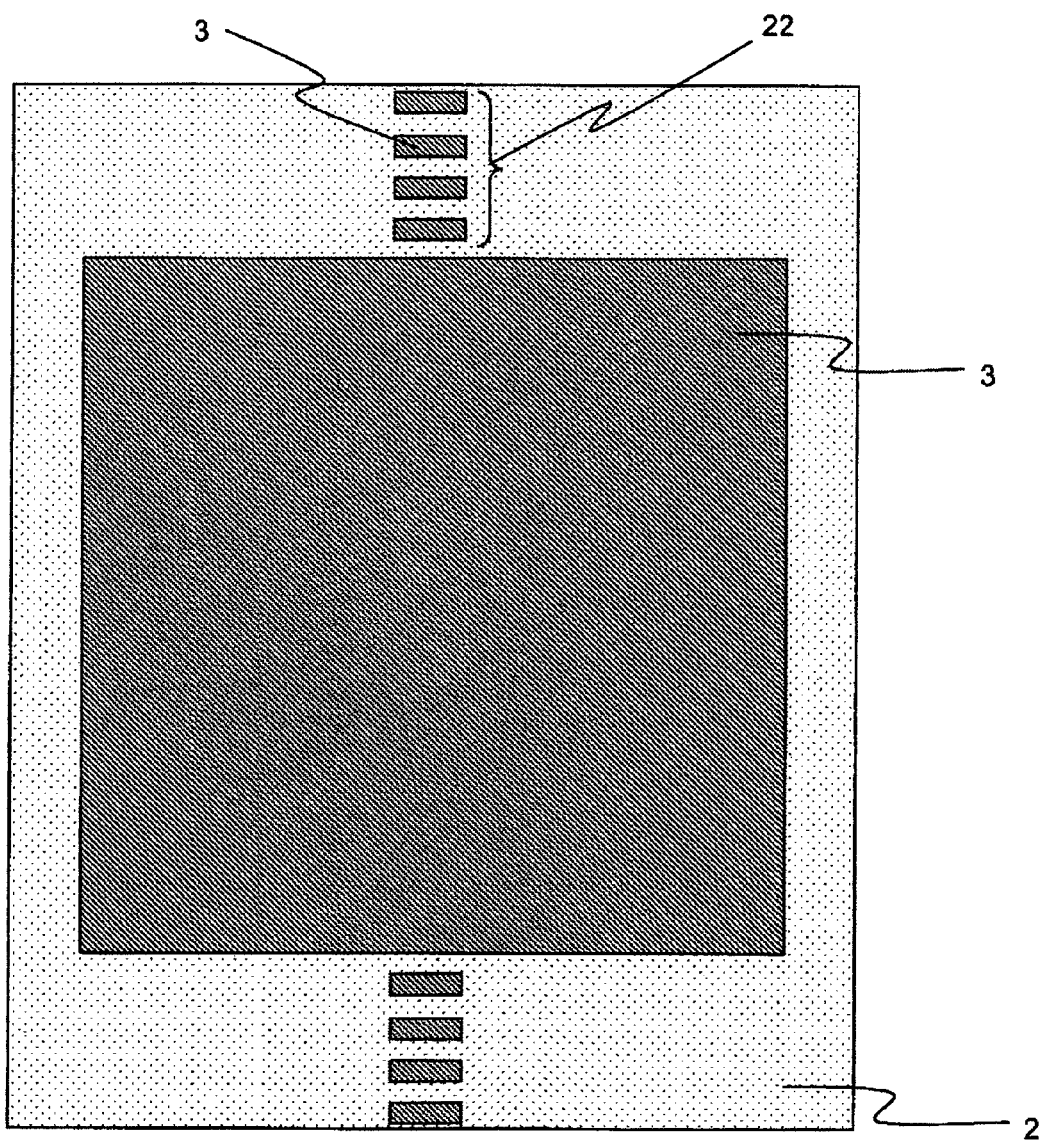
FIG. 2B is a view showing the manufacturing process of the germanium laser diode according to the first embodiment of the present invention seen from above.

FIG. 1A to FIG. 1R each depicts a sectional structure in the order of a manufacturing process. Also, FIG. 2A to FIG. 2R depict schematic drawings viewed from above a substrate in the order of a manufacturing process. Here, FIG. 1A to FIG. 1R are sectional views in a lateral direction of FIG. 2A to FIG. 2R, respectively. For example, FIG. 1R depicts a sectional structure taken along a cutting-plane line 23 in FIG. 2R. Furthermore, FIG. 3A to FIG. 3R each depicts a sectional structure taken along a cutting-plane line 24 in FIG. 2R. The cutting-plane lines 23 and 24 are orthogonal to each other in the same plane, the cutting-plane line 23 extends in an X direction in the drawing, and the cutting-plane line 24 extends in a Y direction in the drawing. The drawings of a completed device in the present embodiment are FIG. 1R, FIG. 2R and FIG. 3R.

The manufacturing process will be sequentially described below.

Figure 3A:
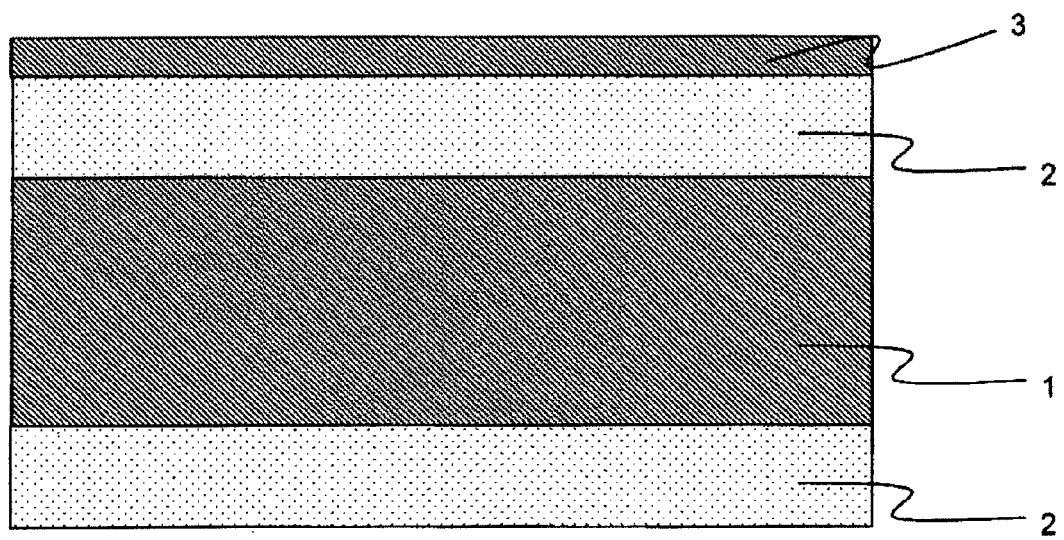
FIG. 3A is a sectional view showing the manufacturing process of the germanium laser diode according to the first embodiment of the present invention.

First, as depicted in FIG. 1A, FIG. 2A and FIG. 3A, an SOI (Silicon On Insulator) substrate in which a silicon substrate 1 as a support substrate, a silicon dioxide film 2 as a buried insulating film (which may be hereinafter referred to as a BOX (Buried Oxide) layer) and a silicon film 3 as a semiconductor layer are stacked in this order is prepared. The silicon film 3 in the test production of the present embodiment before being processed has an initial film thickness of 200 nm. Also, the silicon dioxide film 2 has a film thickness of 2000 nm. Since light is spread to a material having a large refractive index, in order to prevent light from being diffused to the silicon substrate 1, an SOI substrate having the thick the BOX layer (silicon dioxide film 2) is used in the present embodiment in the above-described manner.

As evident from FIG. 1A, the silicon dioxide film 2 is also formed on a back surface side of the silicon substrate 1. This is to prevent a warp of the silicon substrate 1 (wafer). Since the thick silicon dioxide film 2 of 2000 nm is formed, a strong compressive stress is applied to the silicon substrate 1, and the overall strain of the wafer is prevented by forming the films with the same thickness on the front surface and the back surface (main surface and back surface opposite to the main surface). Attention has to be paid so that this silicon dioxide film 2 on the back surface is also not lost during the process. If the silicon dioxide film 2 on the back surface is lost during the process of cleaning and wet etching, the wafer becomes warped and cannot be sucked onto an electrostatic chuck, which raises a fear that the subsequent manufacturing processes cannot be performed.

Figure 3B:
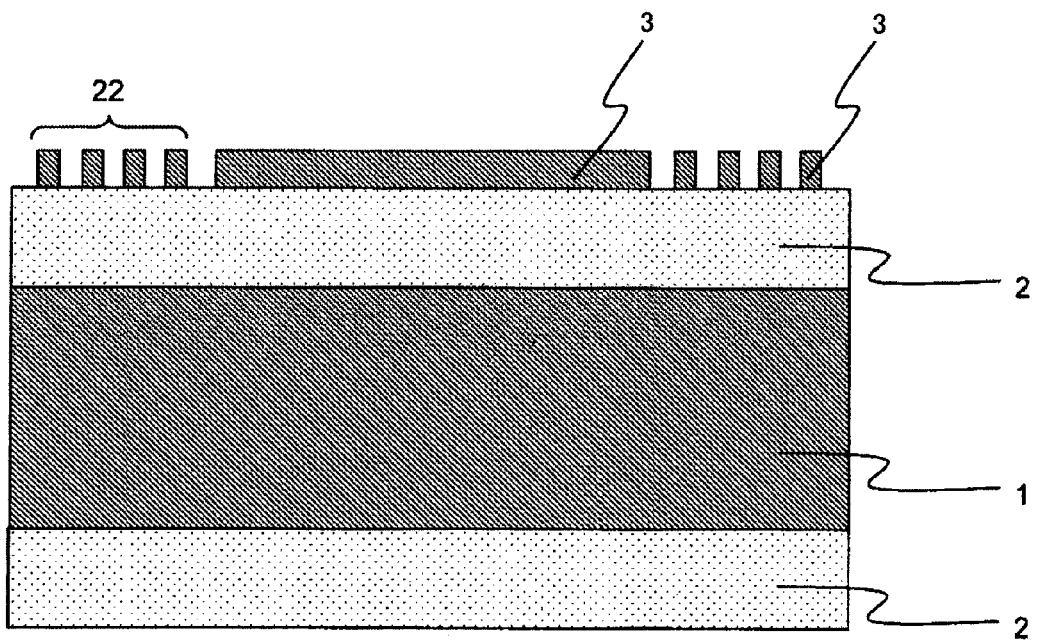
FIG. 3B is a sectional view showing the manufacturing process of the germanium laser diode according to the first embodiment of the present invention.

Next, after a resist is applied, the resist is left only in a desired region exposed through a mask by photolithography, and then anisotropic dry etching is performed. By this means, as depicted in FIG. 1B, FIG. 2B and FIG. 3B, the silicon film 3 is processed in a mesa shape. Although only one device is shown in each drawing for simplification, it goes without saying that many devices are simultaneously formed on the substrate. Since a silicon process is used, many devices can be integrated with high yields. With this process, electric separation among the devices can be established. Also, as depicted in FIG. 2B viewed from above, DBR mirrors 22 made up of isolated small pieces of the silicon film 3 are also simultaneously formed by this anisotropic dry etching. The DBR mirror 22 is a dielectric mirror configured from a difference in refractive index between silicon and its surrounding insulating film, and can achieve a reflectance as high as 99.9% or higher. Since mirrors having such a high reflectance can be formed by a silicon process in a simple manner, the laser oscillation can be achieved even when light emission from germanium is extremely weak. In designing the DBR mirror 22, the width of each of the small pieces of the silicon film 3 and an interval therebetween are important parameters, and these are designed to be approximately one fourth of a luminous wavelength in a medium. Also, only four small pieces of the silicon film 3 are drawn in each of the DBR mirrors 22 in FIG. 3B. In practice, however, the reflectance can be increased by increasing the number of these small pieces of the silicon film 3. In the present embodiment, the mirrors are made with the number of these small pieces being changed as 4, 10, 20 and 100 by way of trial, and it is confirmed that the oscillation threshold current density becomes lower and the reflectance of the DBR mirror 22 becomes higher as the number of small pieces is increased.

Also, in place of processing the silicon film 3 in a mesa shape like in the present embodiment, the device isolation may be performed by a STI (Shallow Trench Isolation) process or a LOCOS (Local Oxidation of Silicon) process as shown in the following embodiments.

Figure 2C:
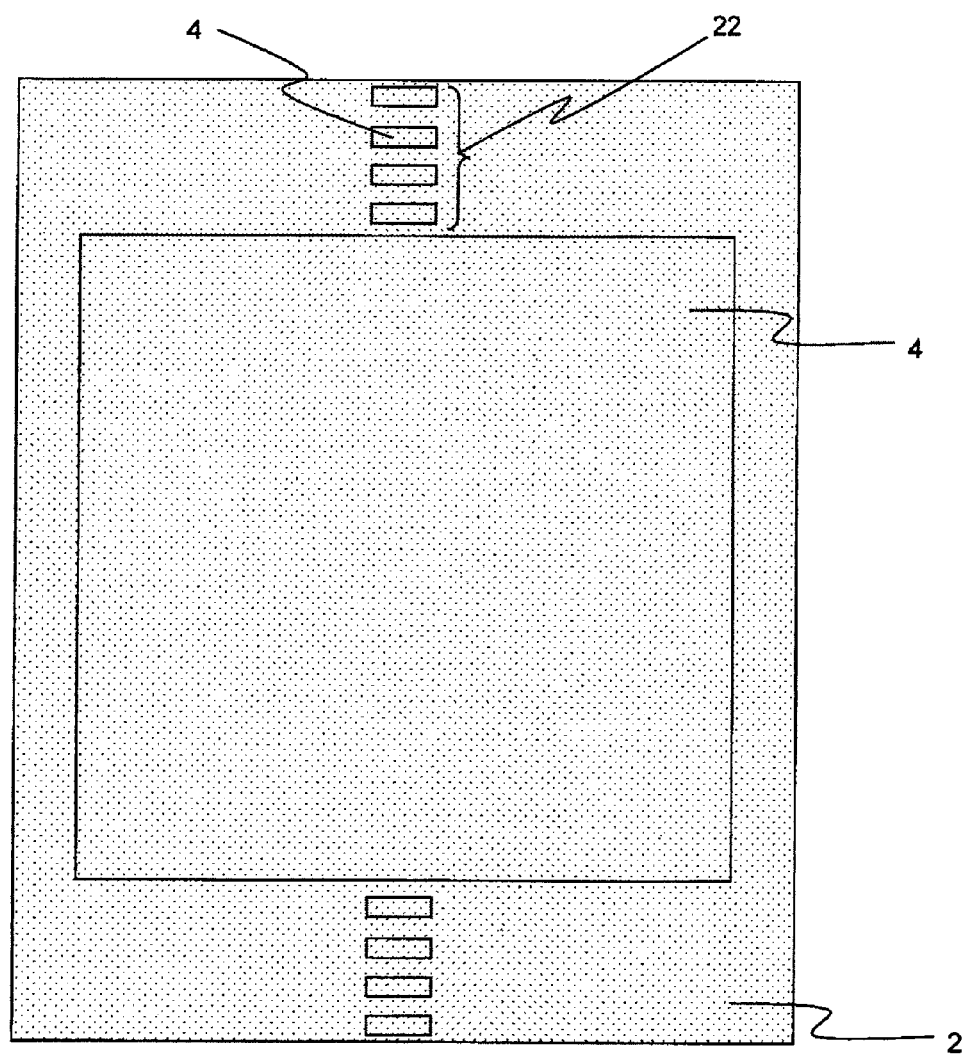
FIG. 2C is a view showing the manufacturing process of the germanium laser diode according to the first embodiment of the present invention seen from above.
Figure 3C:
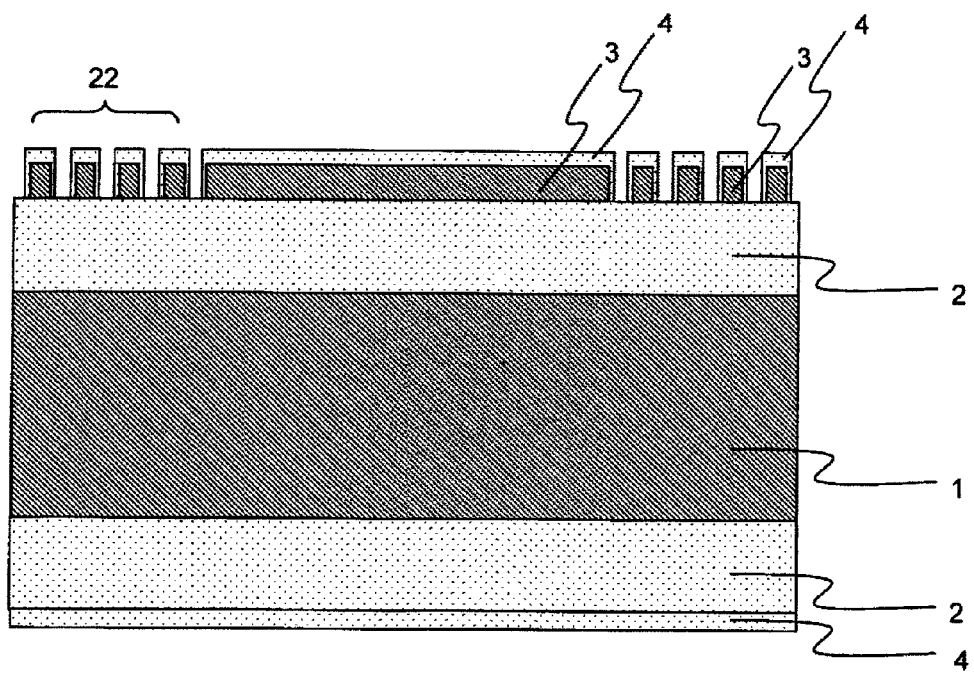
FIG. 3C is a sectional view showing the manufacturing process of the germanium laser diode according to the first embodiment of the present invention.

Subsequently, after a cleaning process is performed, about 15 nm of the surface of the silicon film 3 is oxidized in order to protect the surface of the silicon film 3, thereby forming a silicon dioxide film 4 having a thickness of approximately 30 nm as an insulating film as depicted in FIG. 1C, FIG. 2C and FIG. 3C. This silicon dioxide film 4 plays a role of not only reducing damages that the substrate suffers due to ion implantation to be introduced in a following process but also suppressing impurities coming out into the air in an activation heat treatment. On this occasion, the silicon dioxide film 4 is formed also on the back surface side of the silicon substrate 1. Also, the silicon dioxide film 4 is not necessarily required to be formed by a thermal oxidation process, and a process of depositing the film only on a front surface side (device formation surface side) of the SOI substrate by using an apparatus for CVD (Chemical Vapor Deposition) or the like may be used.

Figure 2D:
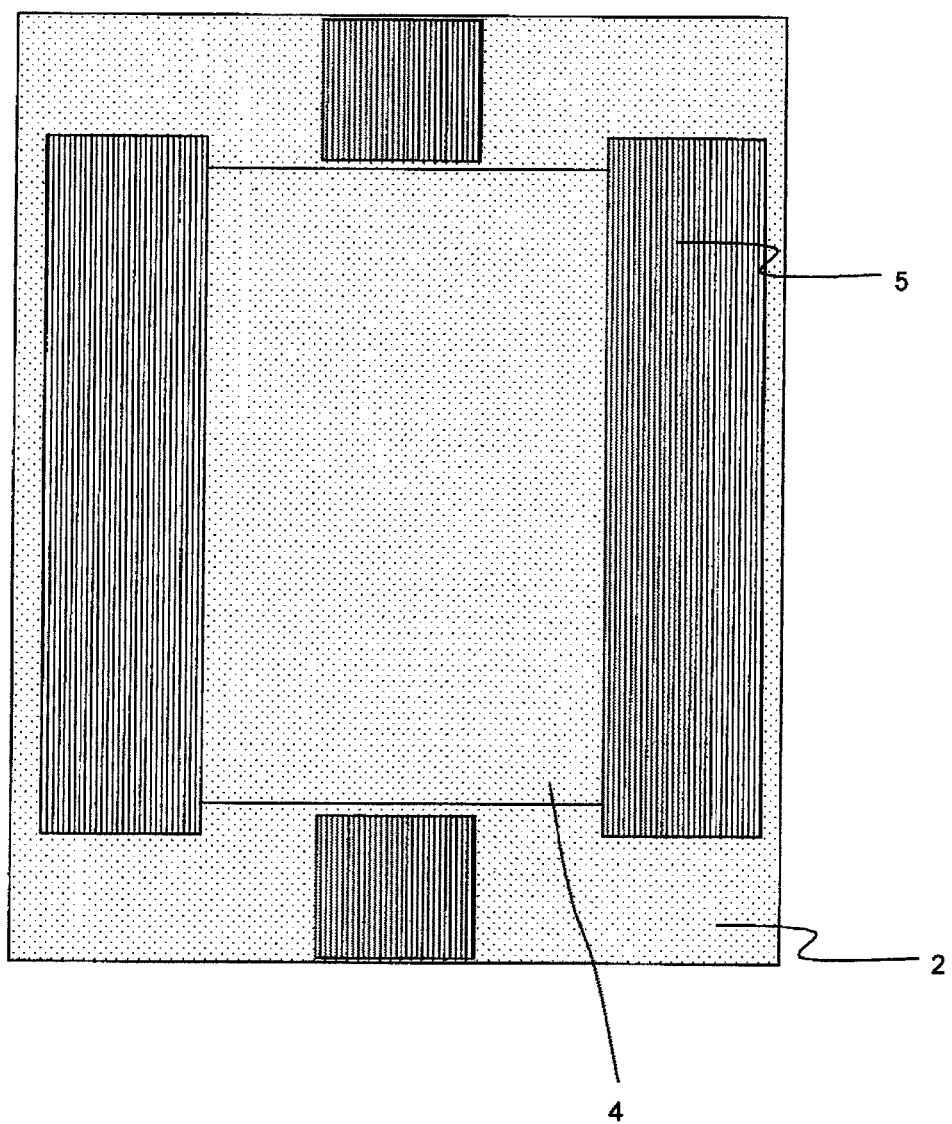
FIG. 2D is a view showing the manufacturing process of the germanium laser diode according to the first embodiment of the present invention seen from above.
Figure 3D:
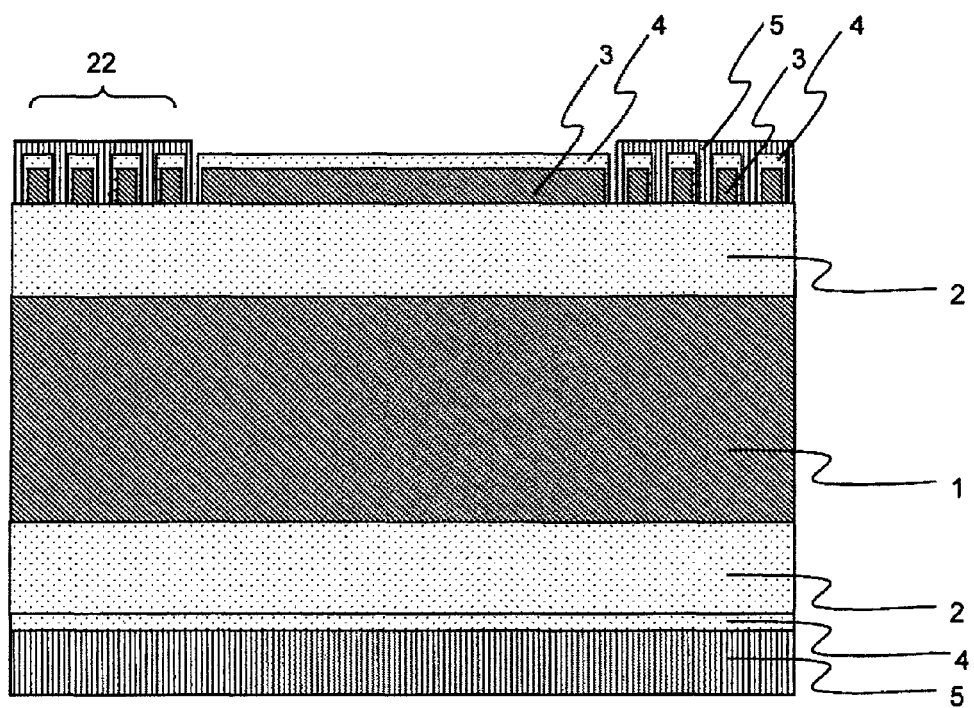
FIG. 3D is a sectional view showing the manufacturing process of the germanium laser diode according to the first embodiment of the present invention.

Next, a silicon nitride film 5 is deposited on the entire surface on the device formation surface side of the SOI substrate including the surface of the silicon film 3 so as to have a thickness of about 100 nm. Then, a resist is left only in a desired region by resist patterning using photolithography. Thereafter, the silicon nitride film 5 is processed by using anisotropic dry etching, thereby obtaining the state of FIG. 1D, FIG. 2D and FIG. 3D. As depicted in FIG. 1D, the silicon nitride film 5 is formed also on the back surface side of the silicon substrate 1. Here, as depicted in FIG. 2D viewed from above, the fact that the DBR mirrors 22 are covered with the silicon nitride film 5 is important. By this means, the silicon film 3 present in the portion of the DBR mirrors 22 is prevented from being oxidized in a following oxidizing process.

Figure 2E:
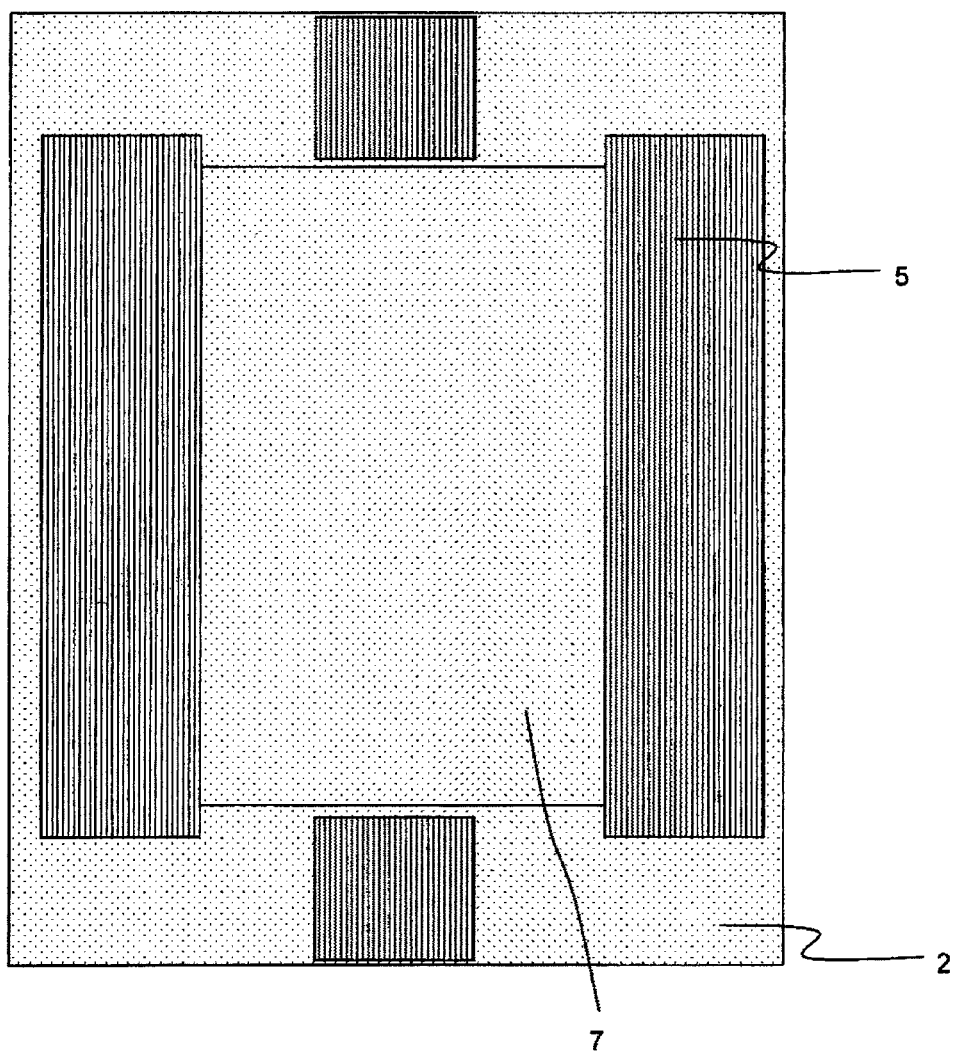
FIG. 2E is a view showing the manufacturing process of the germanium laser diode according to the first embodiment of the present invention seen from above.
Figure 3E:
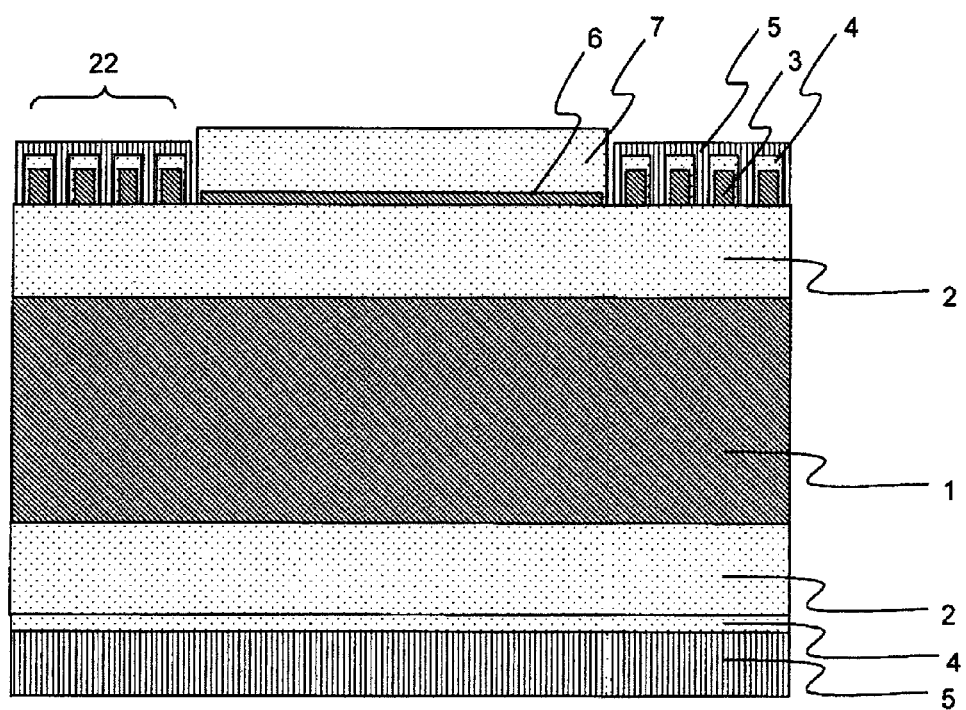
FIG. 3E is a sectional view showing the manufacturing process of the germanium laser diode according to the first embodiment of the present invention.

Subsequently, by a cleaning process and wet etching using hydrofluoric acid, the silicon dioxide film 4 existing in an opening on the front surface (device formation surface side) is removed. Thereafter, the silicon film 3 is reduced in thickness by performing an oxidizing process to form a thin-film silicon film 6, and simultaneously, a thermal oxidation film 7 is formed on the front surface (device formation surface side), thereby obtaining the state of FIG. 1E, FIG. 2E and FIG. 3E. In this process, by using the silicon nitride film 5 as a mask material for the oxidation, the silicon film 3 is locally oxidized.

Here, the silicon dioxide film 4 on the front surface (device formation surface side) is partially removed before the oxidation in consideration of damages occurring on the silicon dioxide film 4 through the cleaning process and others. If the oxidizing process is performed with the damaged film being left, silicon is unevenly oxidized, resulting in the variations in film thickness. At this time, the oxidized film thickness of the thermal oxidation film 7 is adjusted to about 330 nm so that the thin-film silicon film 6 has the film thickness of 20 nm.

Figure 2F:
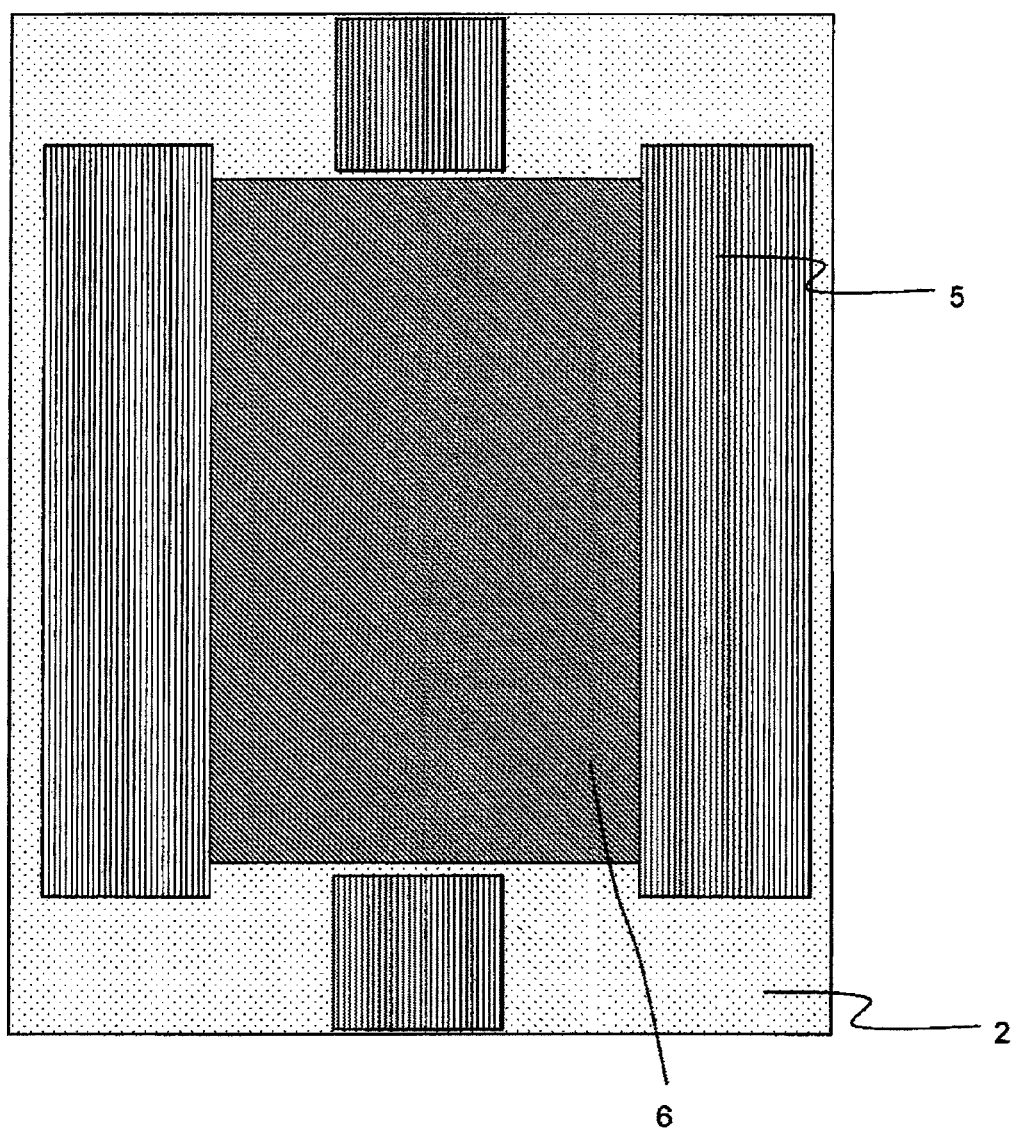
FIG. 2F is a view showing the manufacturing process of the germanium laser diode according to the first embodiment of the present invention seen from above.
Figure 3F:
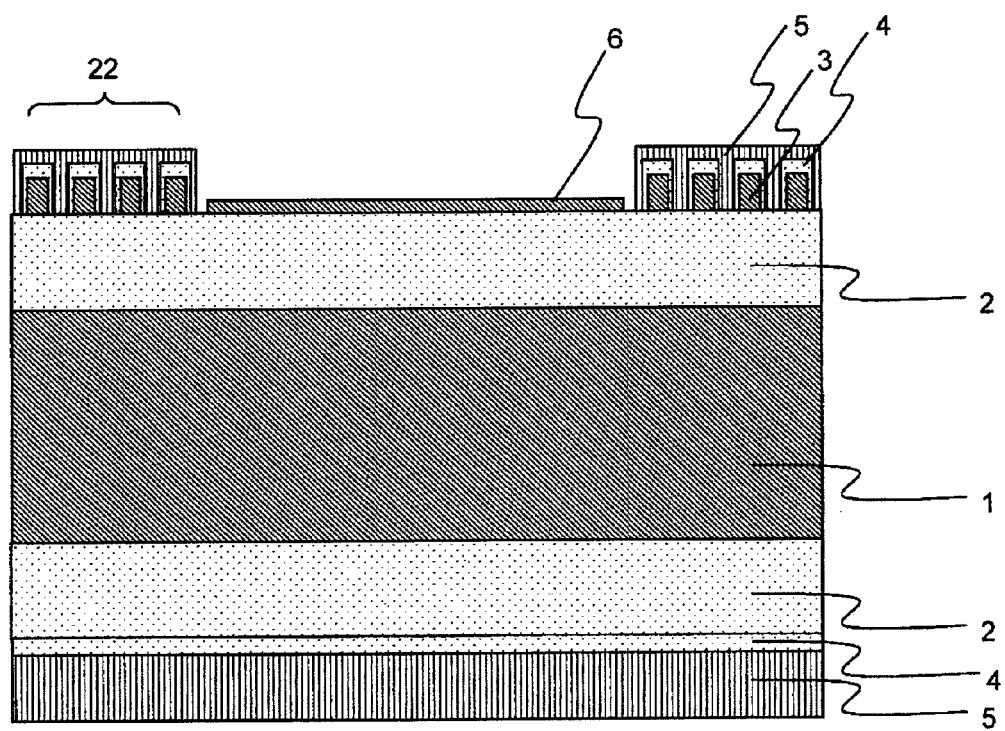
FIG. 3F is a sectional view showing the manufacturing process of the germanium laser diode according to the first embodiment of the present invention.

Subsequently, the thermal oxidation film 7 existing in the opening on the front surface (device formation surface side) is removed by wet etching using hydrofluoric acid, thereby obtaining the state of FIG. 1F, FIG. 2F and FIG. 3F.

Figure 2G:
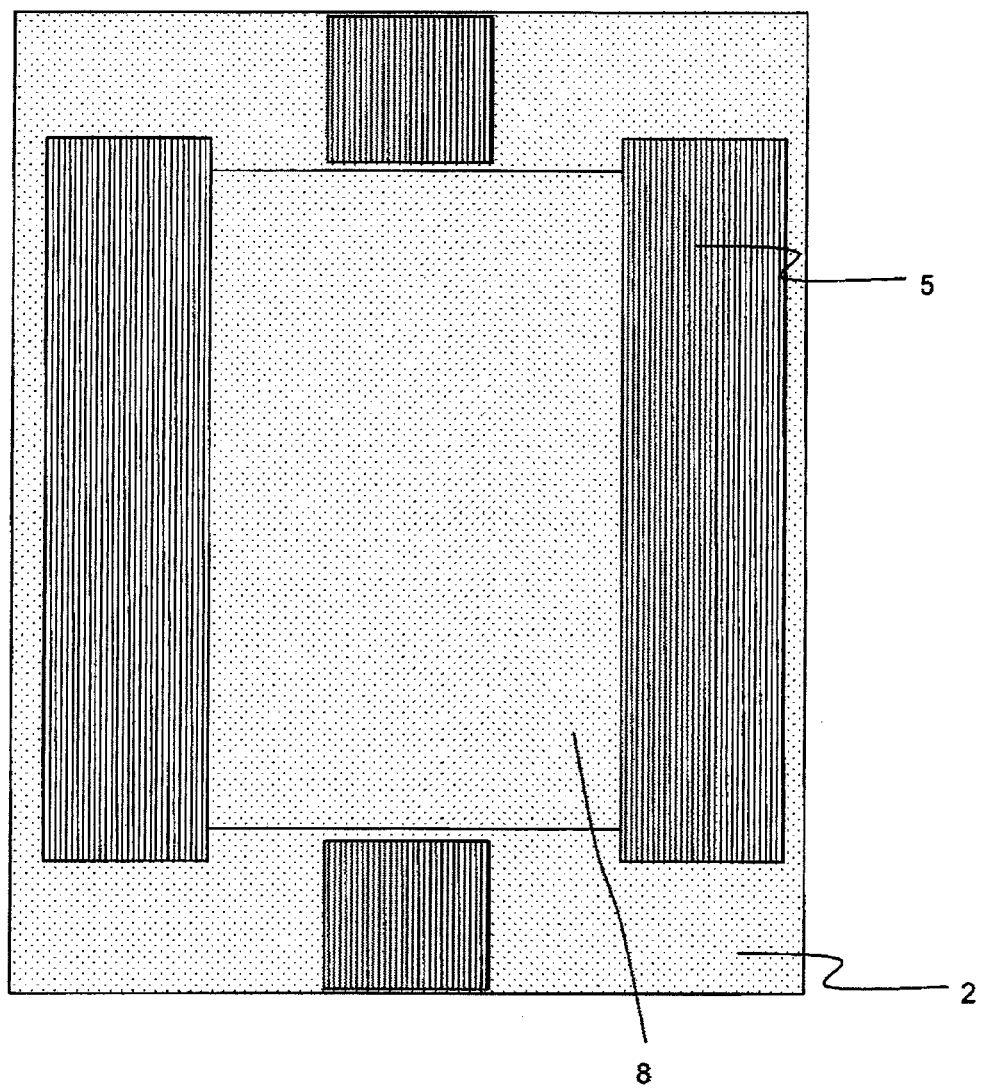
FIG. 2G is a view showing the manufacturing process of the germanium laser diode according to the first embodiment of the present invention seen from above.
Figure 3G:
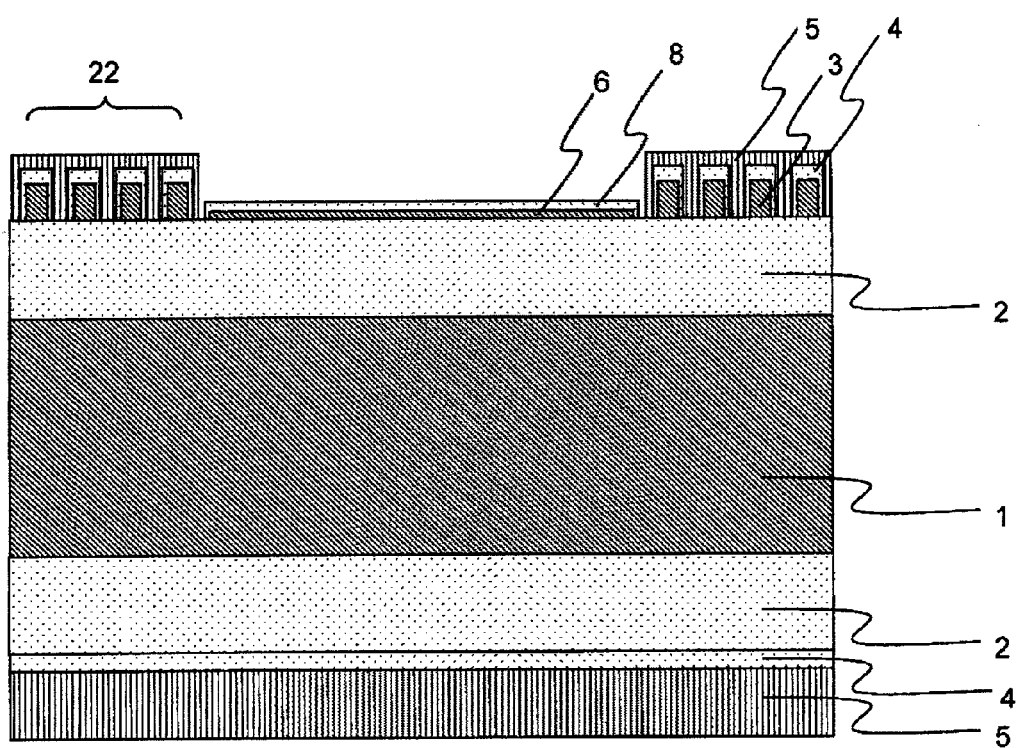
FIG. 3G is a sectional view showing the manufacturing process of the germanium laser diode according to the first embodiment of the present invention.

Subsequently, by performing an oxidizing process again, the film thickness of the thin-film silicon film 6 is reduced to 10 nm, thereby obtaining the state of FIG. 1G, FIG. 2G and FIG. 3G. At this time, the film thickness of a thermal oxidation film 8 formed by a thermal oxidizing process is 20 nm. In this manner, by dividing a local oxidizing process into a plurality of steps, an effect of mitigating a stress occurring at an interface portion between the silicon film 3 left thickly and the thin-film silicon film 6 is achieved. Also, by increasing the film thickness of the thin-film silicon film 6 to a degree of 10 nm at which a quantum confinement effect does not occur, an increase in electric resistance occurring when a current flows through the thin-film silicon film 6 is prevented.

Figure 2H:
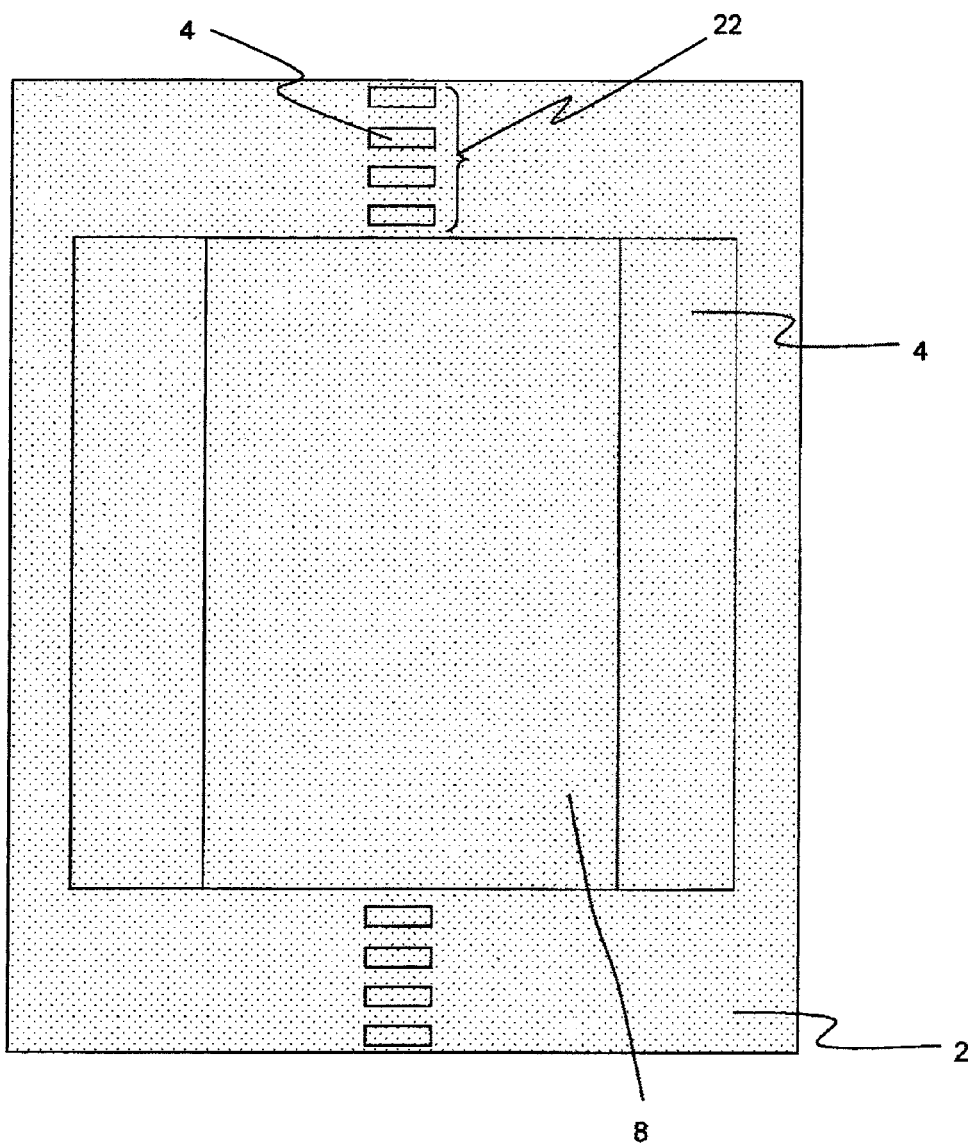
FIG. 2H is a view showing the manufacturing process of the germanium laser diode according to the first embodiment of the present invention seen from above.
Figure 3H:
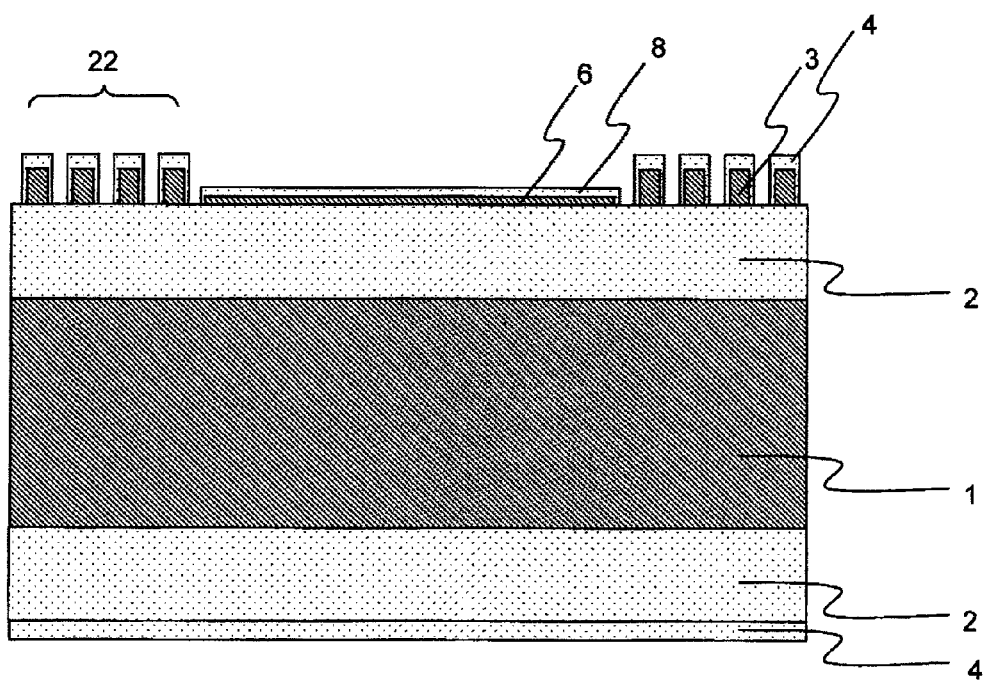
FIG. 3H is a sectional view showing the manufacturing process of the germanium laser diode according to the first embodiment of the present invention.

Subsequently, by a cleaning process and wet etching with thermal phosphoric acid, the silicon nitride film 5 is removed, thereby obtaining the state of FIG. 1H, FIG. 2H and FIG. 3H.

Figure 2I:
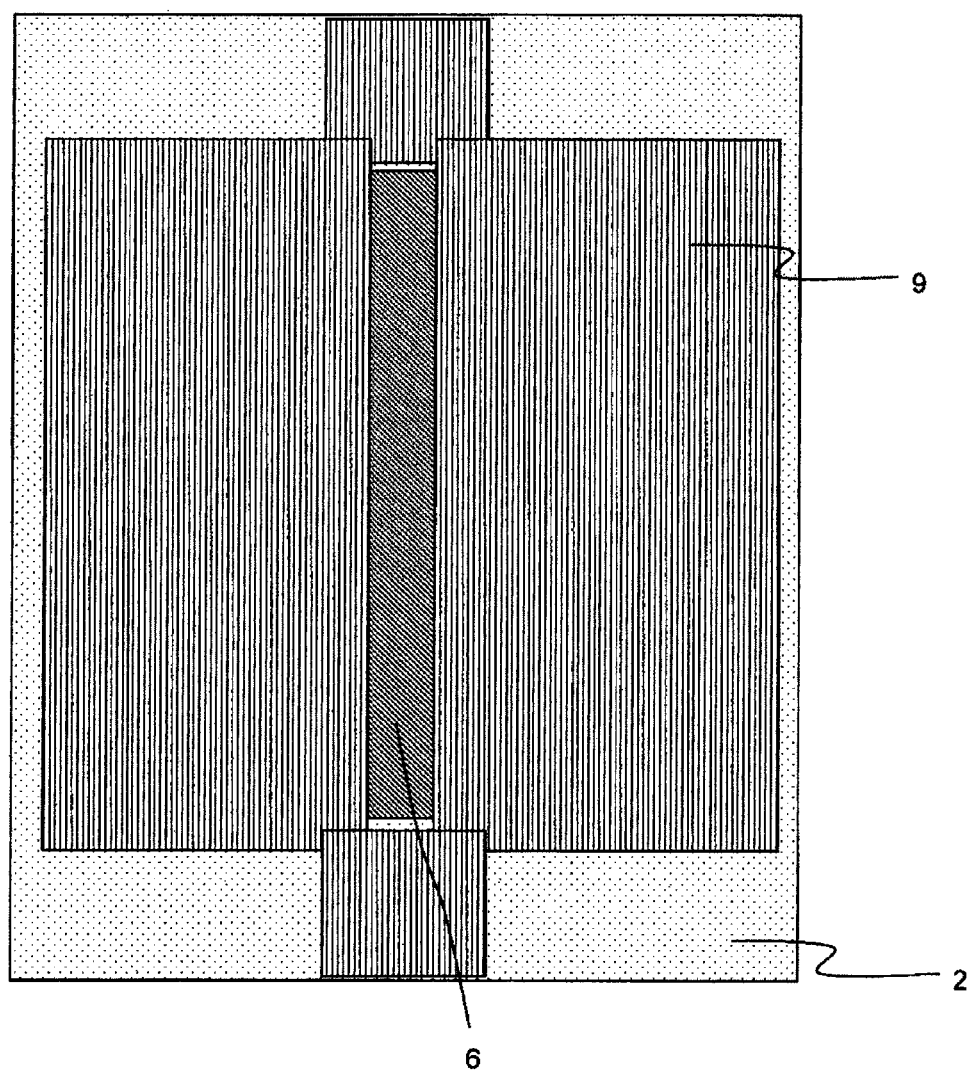
FIG. 2I is a view showing the manufacturing process of the germanium laser diode according to the first embodiment of the present invention seen from above.
Figure 2J:
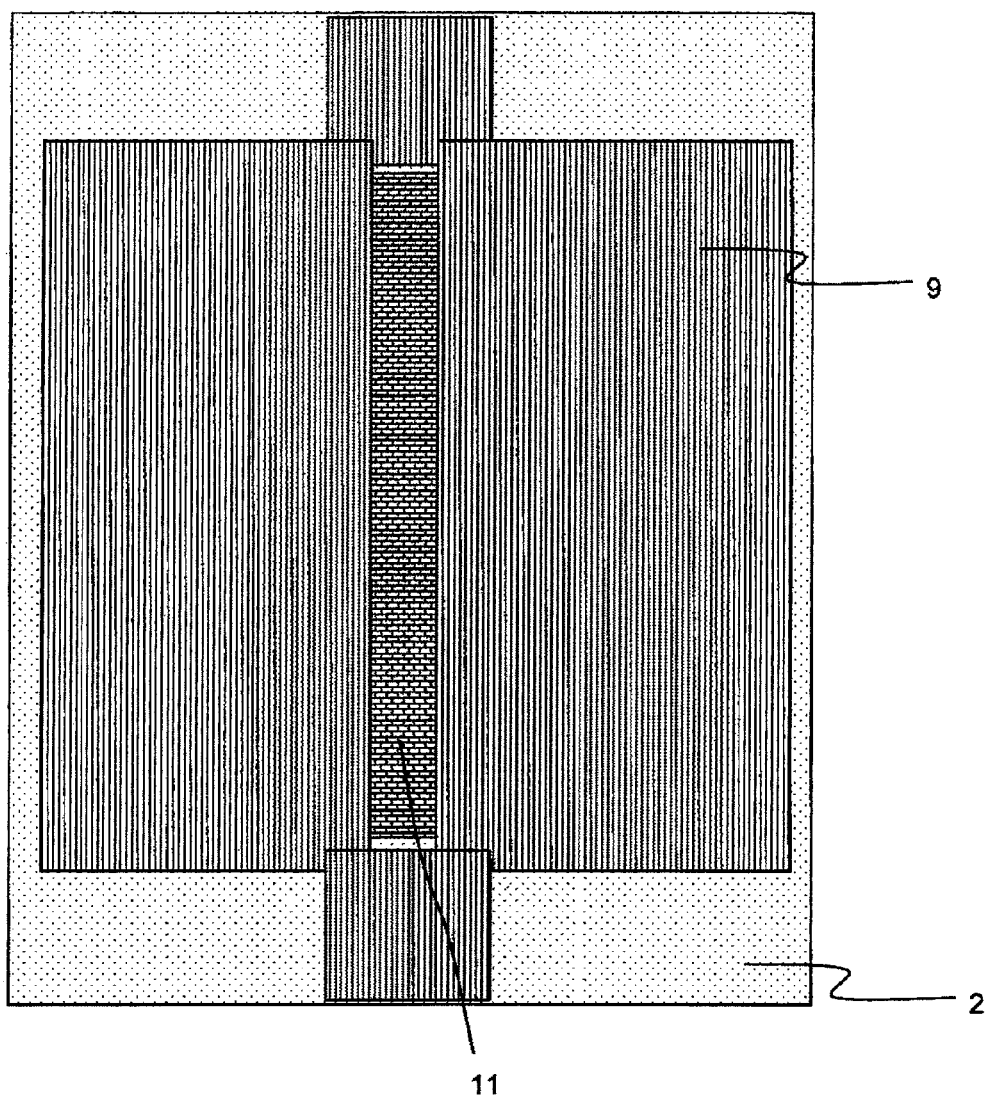
FIG. 2J is a view showing the manufacturing process of the germanium laser diode according to the first embodiment of the present invention seen from above.
Figure 3I:
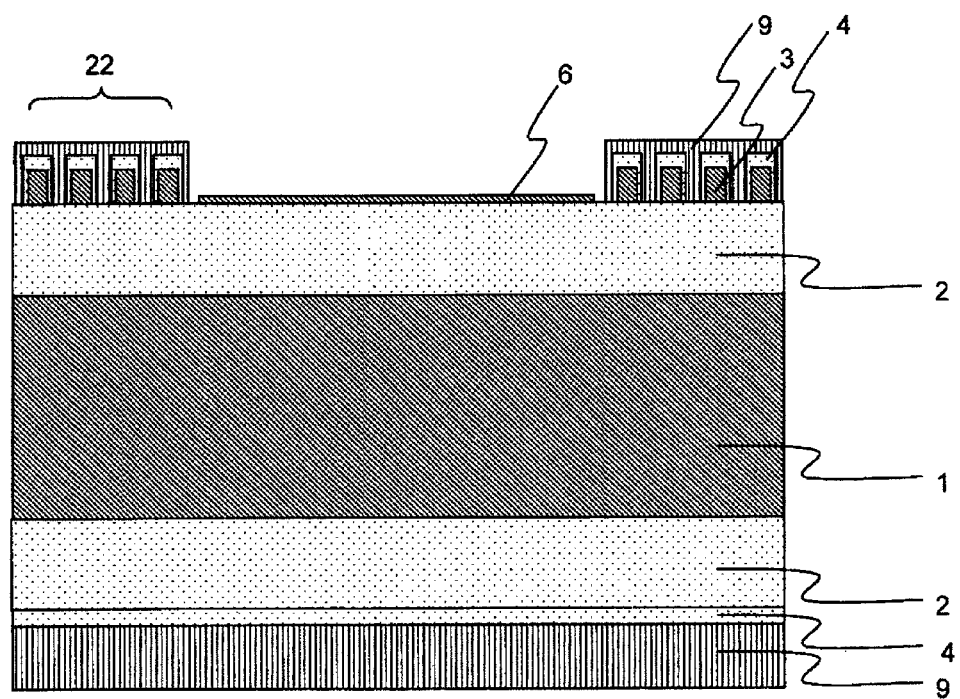
FIG. 3I is a sectional view showing the manufacturing process of the germanium laser diode according to the first embodiment of the present invention.
Figure 3J:
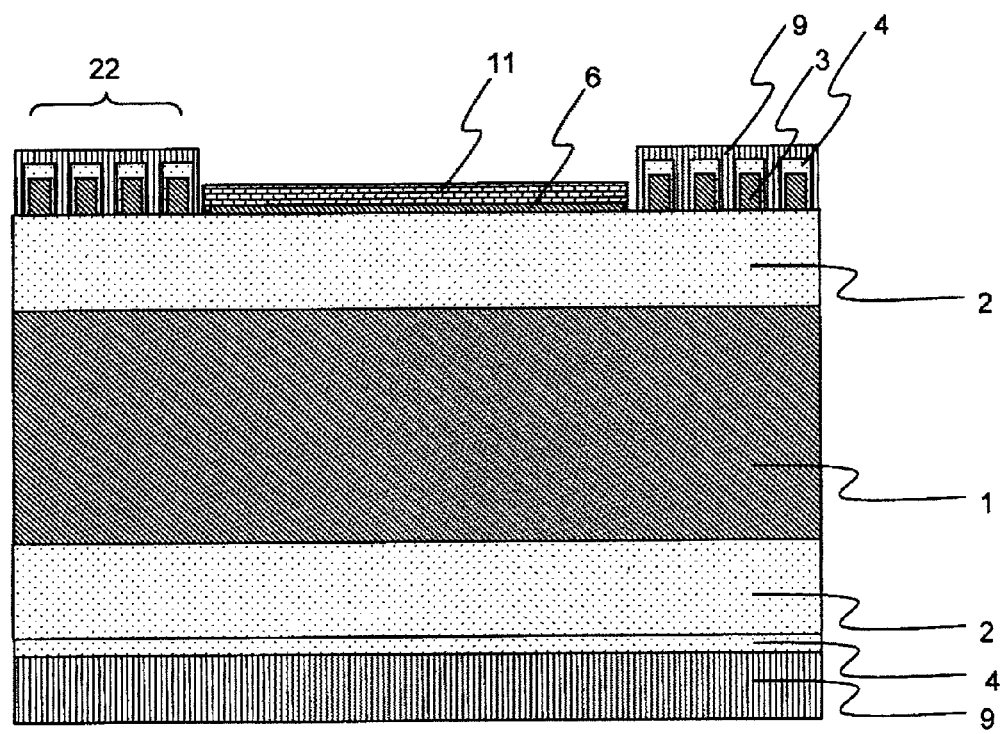
FIG. 3J is a sectional view showing the manufacturing process of the germanium laser diode according to the first embodiment of the present invention.

Next, a silicon nitride film 9 is deposited on the entire surface on the device formation surface side of the silicon substrate 1 so as to have a thickness of about 100 nm. Then, a resist is left only in a desired region by resist patterning using photolithography. Thereafter, after the silicon nitride film 9 is processed by using anisotropic dry etching, the thermal oxidation film 8 present in an opening 10 is removed by wet etching using hydrofluoric acid, thereby obtaining the state of FIG. 1I, FIG. 2I and FIG. 3I. As depicted in FIG. 1I, the silicon nitride film 9 is formed also on the back surface side of the silicon substrate 1. Here, as depicted in FIG. 2I viewed from above, the fact that the DBR mirrors 22 are covered with the silicon nitride film 9 is important. By this means, silicon germanium is prevented from being epitaxially grown on the silicon film 3 present in the portion of the DBR mirrors 22 in a following selective epitaxial growth process.

Next, after the surface is cleaned by a cleaning process, a silicon-germanium film 11 made of 80% silicon and 20% germanium is selectively epitaxially grown so as to have the film thickness of 15 nm only in the opening 10. Here, a mixing ratio of silicon and germanium and film thickness thereof are set so as to satisfy the conditions where no defect is created in the epitaxial growth. As well known, the creation of a defect when silicon-germanium is epitaxially grown on silicon can be prevented by forming a film thinner than a critical thickness defined by the concentration of germanium. The critical thickness can be increased as the concentration of germanium becomes lower. Under the conditions used in the present embodiment, no crystal defect or dislocation is created.

Figure 2K:
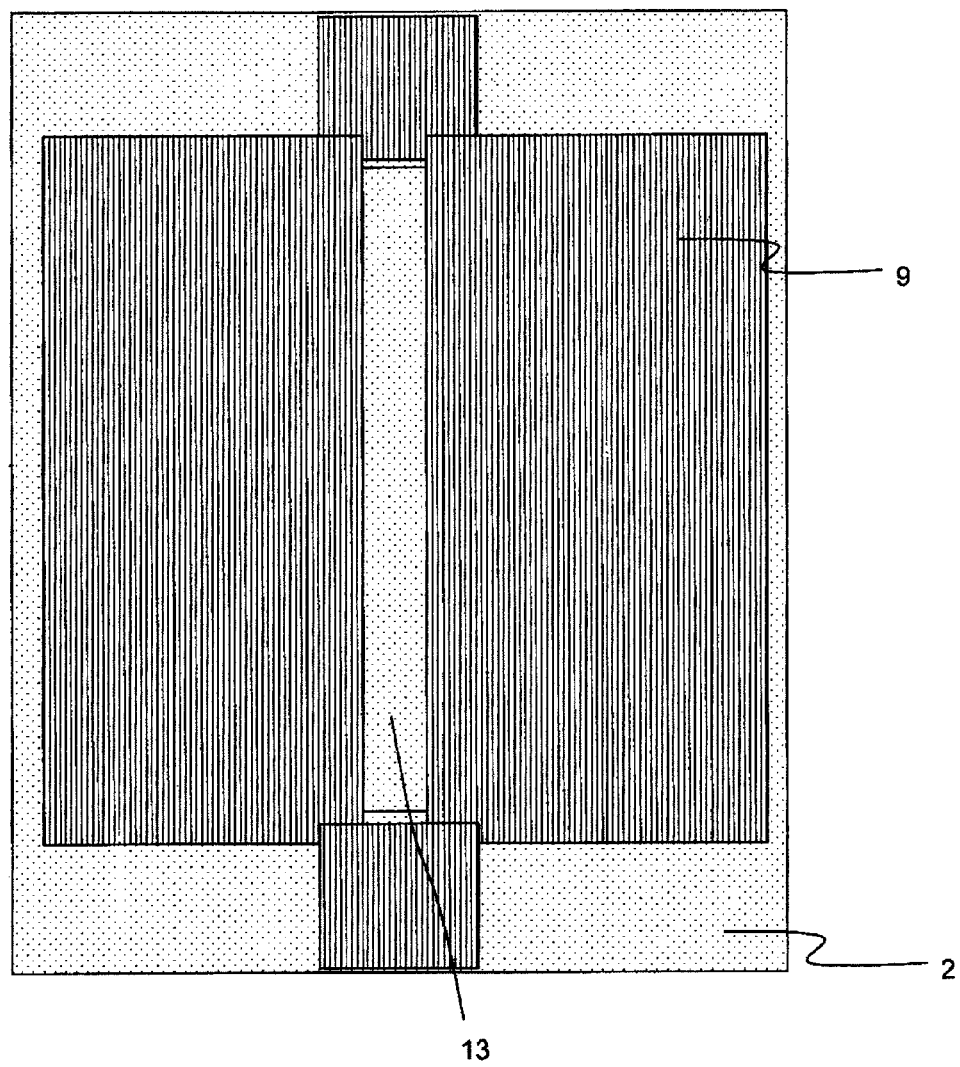
FIG. 2K is a view showing the manufacturing process of the germanium laser diode according to the first embodiment of the present invention seen from above.
Figure 3K:
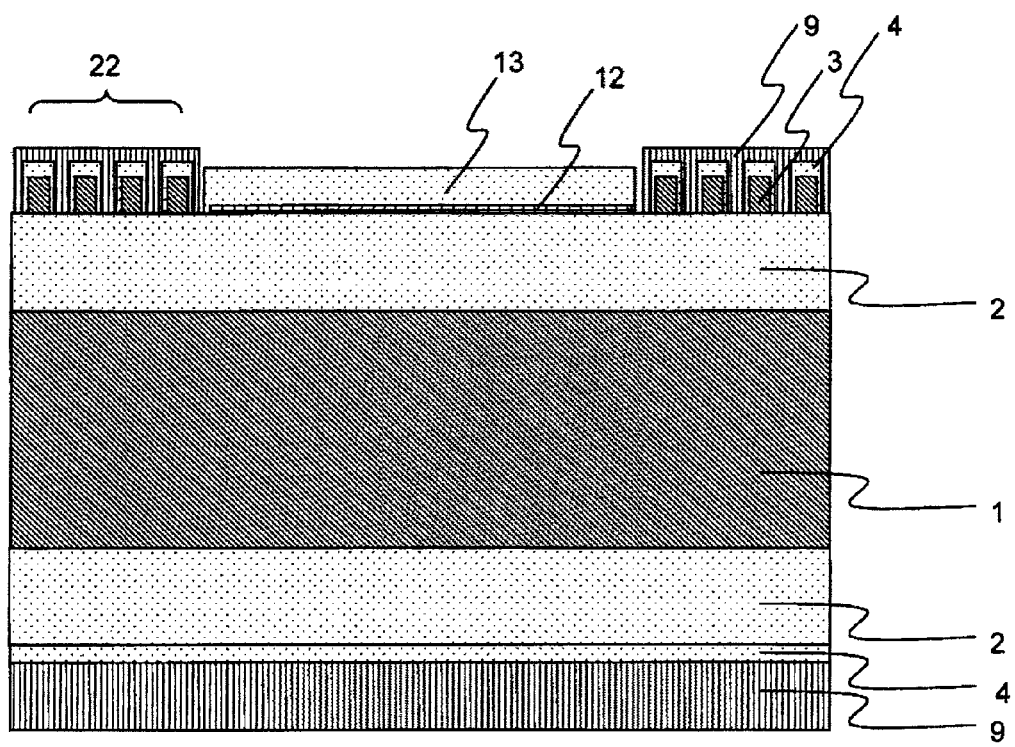
FIG. 3K is a sectional view showing the manufacturing process of the germanium laser diode according to the first embodiment of the present invention.

Next, by performing an oxidizing process, silicon present in the silicon-germanium film 11 is selectively oxidized, and an oxidizing process is performed so that the thermal oxidation film 13 has a film thickness of 44 nm, thereby obtaining the state of FIG. 1K, FIG. 2K and FIG. 3K in which a condensed ultra-thin single-crystal germanium film 12 having a thickness of about 3 nm is formed.

Figure 2L:
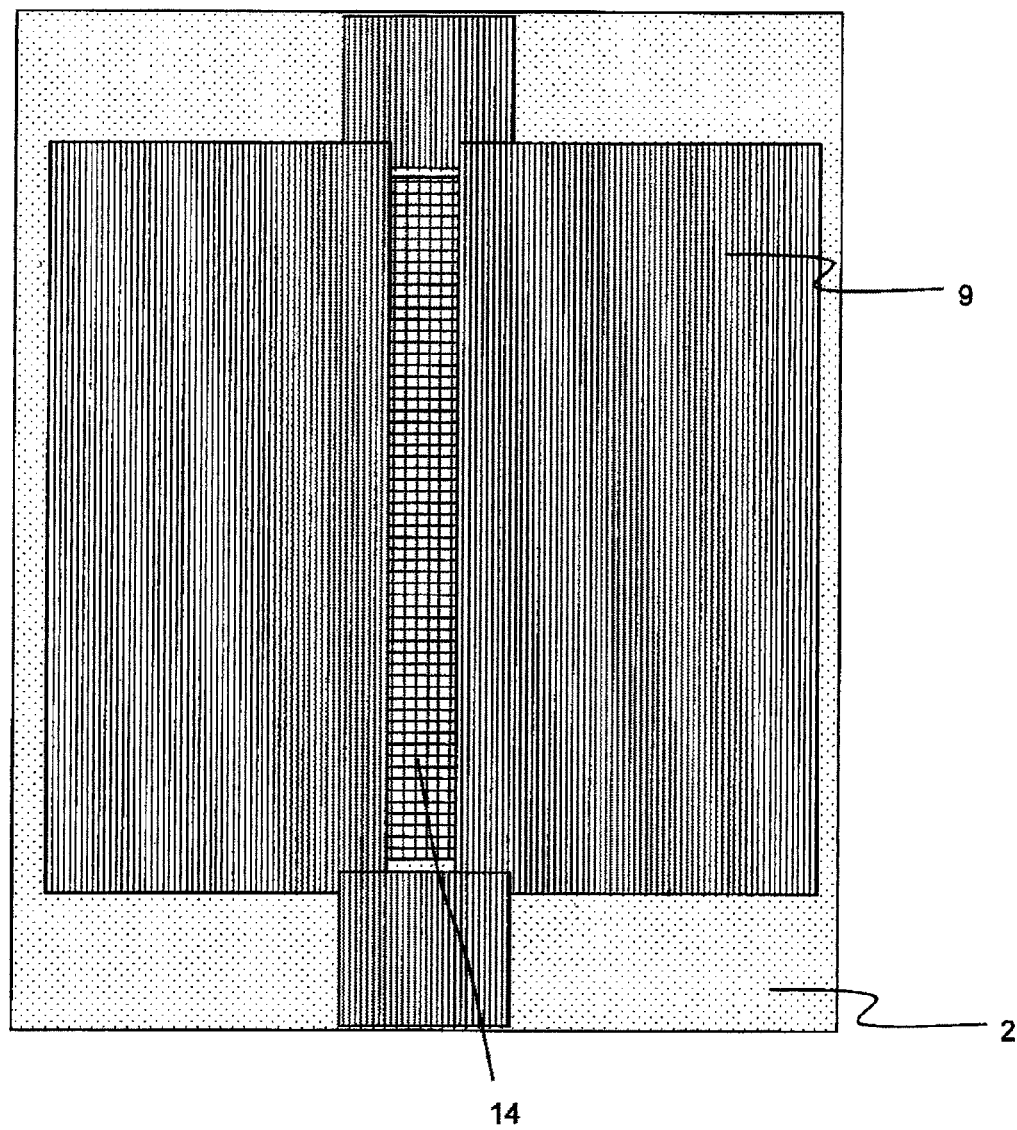
FIG. 2L is a view showing the manufacturing process of the germanium laser diode according to the first embodiment of the present invention seen from above.
Figure 3L:
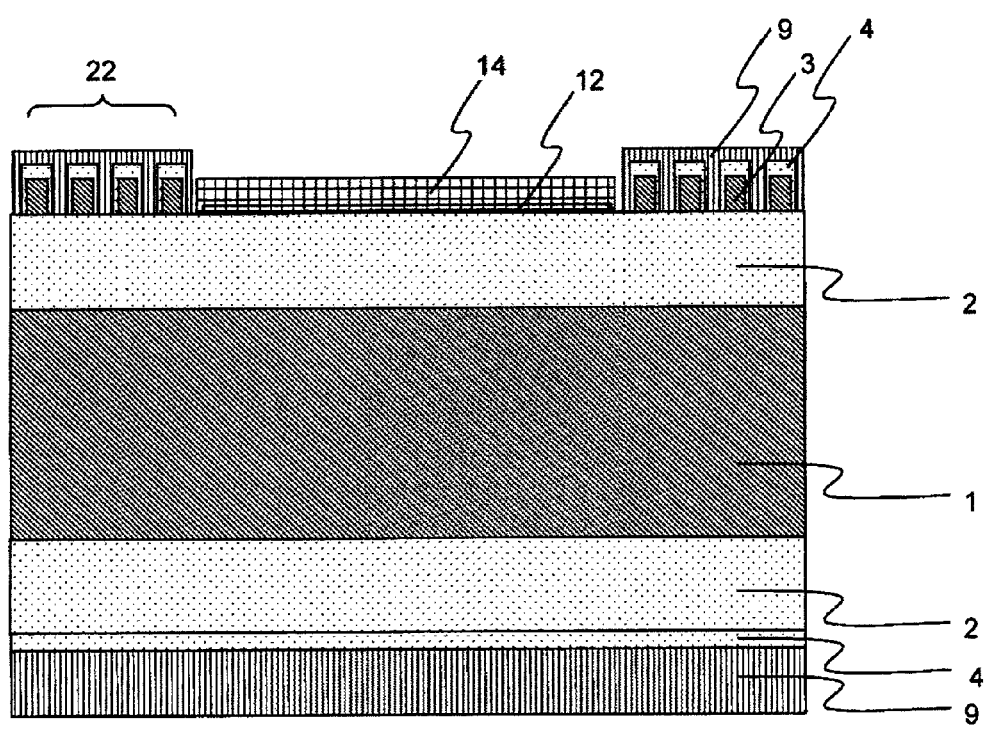
FIG. 3L is a sectional view showing the manufacturing process of the germanium laser diode according to the first embodiment of the present invention.

Subsequently, after the thermal oxidation film 13 is removed by wet etching, the front surface side (device formation surface side) of the SOI substrate is cleaned by a cleaning process. Then, a pure germanium film 14 is selectively epitaxially grown only in the opening 10 so as to have the film thickness of 200 nm, thereby obtaining the state of FIG. 1L, FIG. 2L and FIG. 3L. In this crystal growth, the interface characteristics between the ultra-thin single-crystal germanium film 12 and the selectively-grown germanium film 14 are excellent, and no crystal defect or dislocation is created. The germanium film 14 not only serves as a light-emitting part but also functions as a waveguide for effectively confining light because the germanium film 14 has a refractive index larger than that of its surrounding insulating film.

Here, the fact that the germanium film 14 serving also as a waveguide is physically separated from the silicon film 3 serving as an electrode is important. As a result, light confined in a resonator can be amplified without being absorbed by the electrode.

Figure 2M:
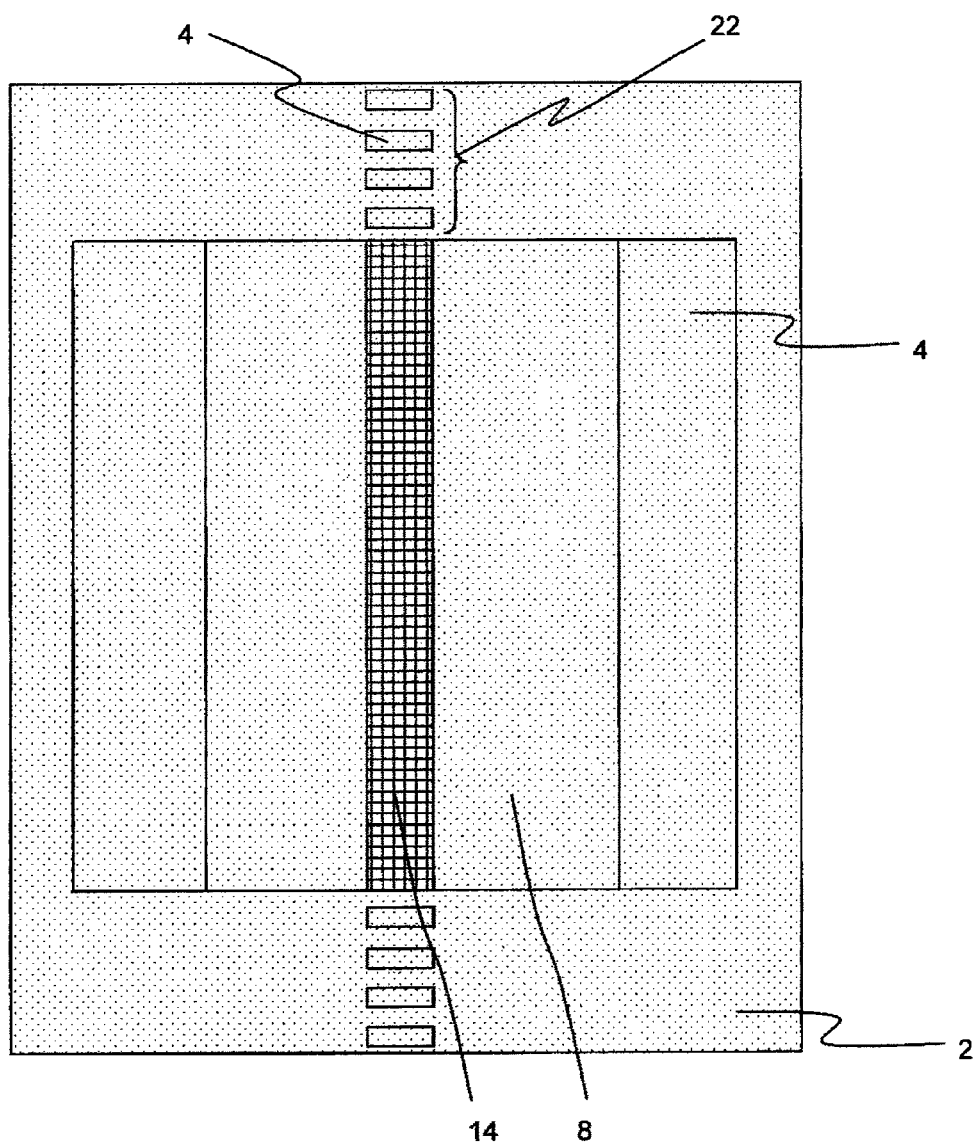
FIG. 2M is a view showing the manufacturing process of the germanium laser diode according to the first embodiment of the present invention seen from above.
Figure 3M:
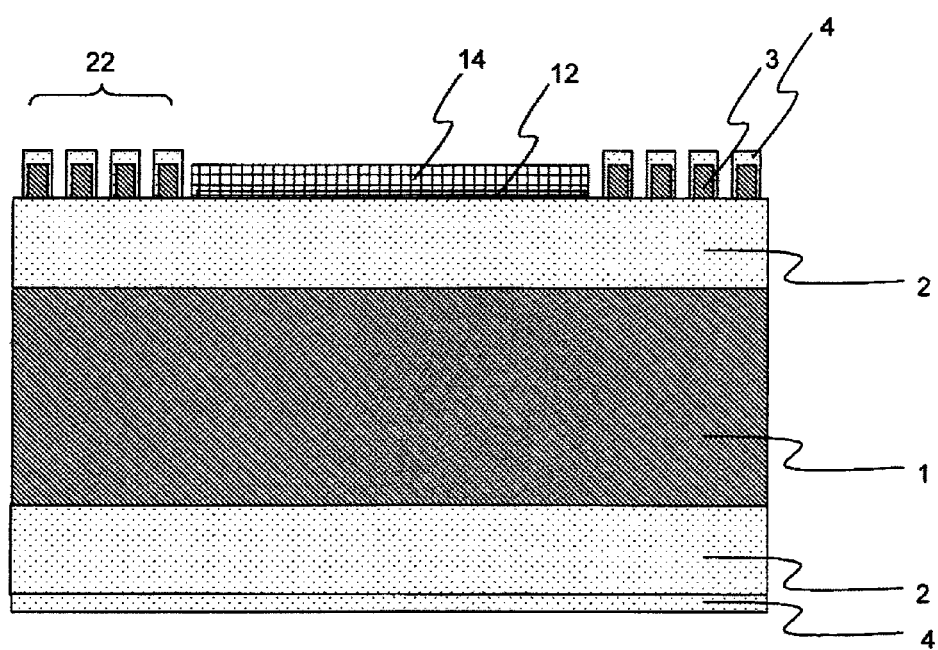
FIG. 3M is a sectional view showing the manufacturing process of the germanium laser diode according to the first embodiment of the present invention.

Next, the silicon nitride film 9 is removed by wet etching and a cleaning process, thereby obtaining the state of FIG. 1M, FIG. 2M and FIG. 3M. Here, as depicted in FIG. 2M and FIG. 3M, it is important that the DBR mirrors 22 are connected to the ends of the germanium film 14 as a waveguide. Since the optical waveguide and the DBR mirror are connected in this manner, they function as an optical resonator.

Figure 2N:
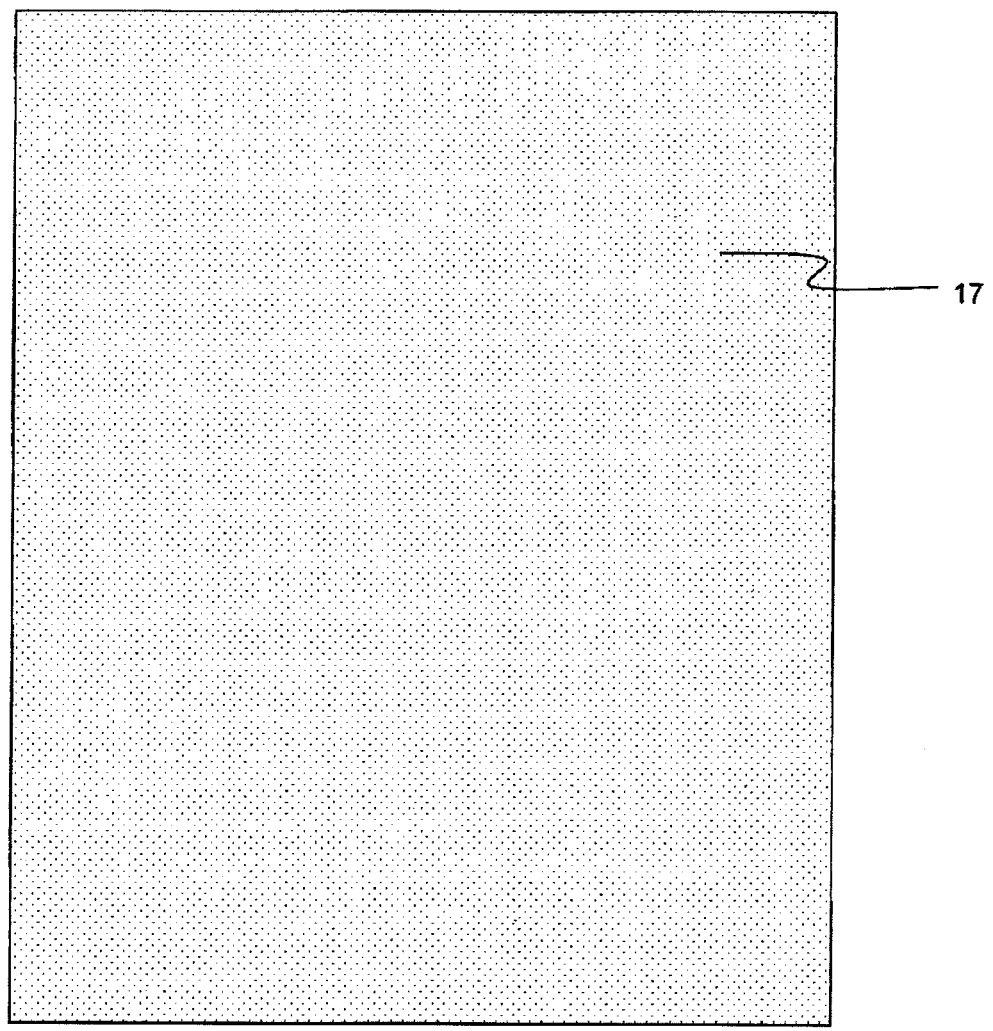
FIG. 2N is a view showing the manufacturing process of the germanium laser diode according to the first embodiment of the present invention seen from above.
Figure 3N:
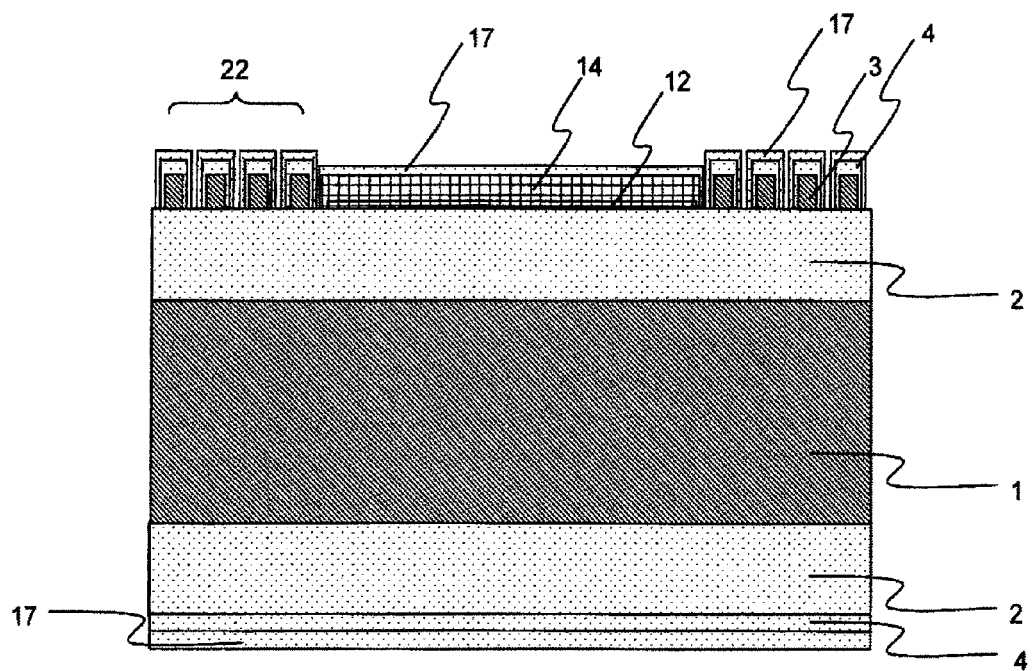
FIG. 3N is a sectional view showing the manufacturing process of the germanium laser diode according to the first embodiment of the present invention.

Subsequently, a silicon dioxide film 17 for protecting the front surface side (device formation surface side) of the silicon substrate 1 is formed by a CVD process on the front surface side (device formation surface side) of the silicon substrate 1 so as to have a film thickness of about 30 nm, thereby obtaining the state of FIG. 1N, FIG. 2N and FIG. 3N.

Subsequently, impurities are put into a desired region in the silicon film 3 by ion implantation. At this time, the ion implantation is controlled so that almost no impurity is implanted into the germanium film 14. This is because, if high-concentration impurities are left in the light-emitting part, impurities become a center of non-radiative recombination to decrease the luminous efficiency, and therefore, a low impurity concentration is preferable in the light-emitting part. In the impurity implantation, after the resist is first left only in a desired region by the resist patterning using photolithography, $BF_2$ (boron difluoride) ions are ion-implanted with a dose amount of $1\times10^{15}$ [$1/cm^2$], thereby forming a p-type diffusion layer electrode 15 as an anode electrode in the silicon film 3.

Subsequently, after the resist is removed, a resist is again left only in a desired region by the resist patterning using photolithography. Then, P (phosphorus) ions are ion-implanted with a dose amount of $1\times10^{15}$ [$1/cm^2$], thereby forming an n-type diffusion layer electrode 16 as a cathode electrode in the silicon film 3. In this ion implanting process, since an ion-implanted portion of the silicon film 3 is amorphized, the crystallinity deteriorates. Therefore, the fact that only the surface of the silicon film 3 is amorphized and crystallized silicon is left in a region of the silicon film 3 adjacent to the BOX layer (silicon dioxide film 2) is important though not shown in the drawings. If the acceleration voltage of ion implantation is set too high, the entire silicon film 3 in the ion-implanted region is amorphized. Therefore, the single crystallinity is not recovered even if an annealing process is performed thereafter, and silicon disadvantageously becomes a polycrystal. When the ion implanting conditions set in the present embodiment are used, since crystal silicon is left in the region adjacent to the BOX layer (silicon dioxide film 2), the crystallinity can be recovered by an activation heat treatment after ion implantation or the like. For the efficient light emission, excellent single crystallinity is extremely important.

Figure 2O:
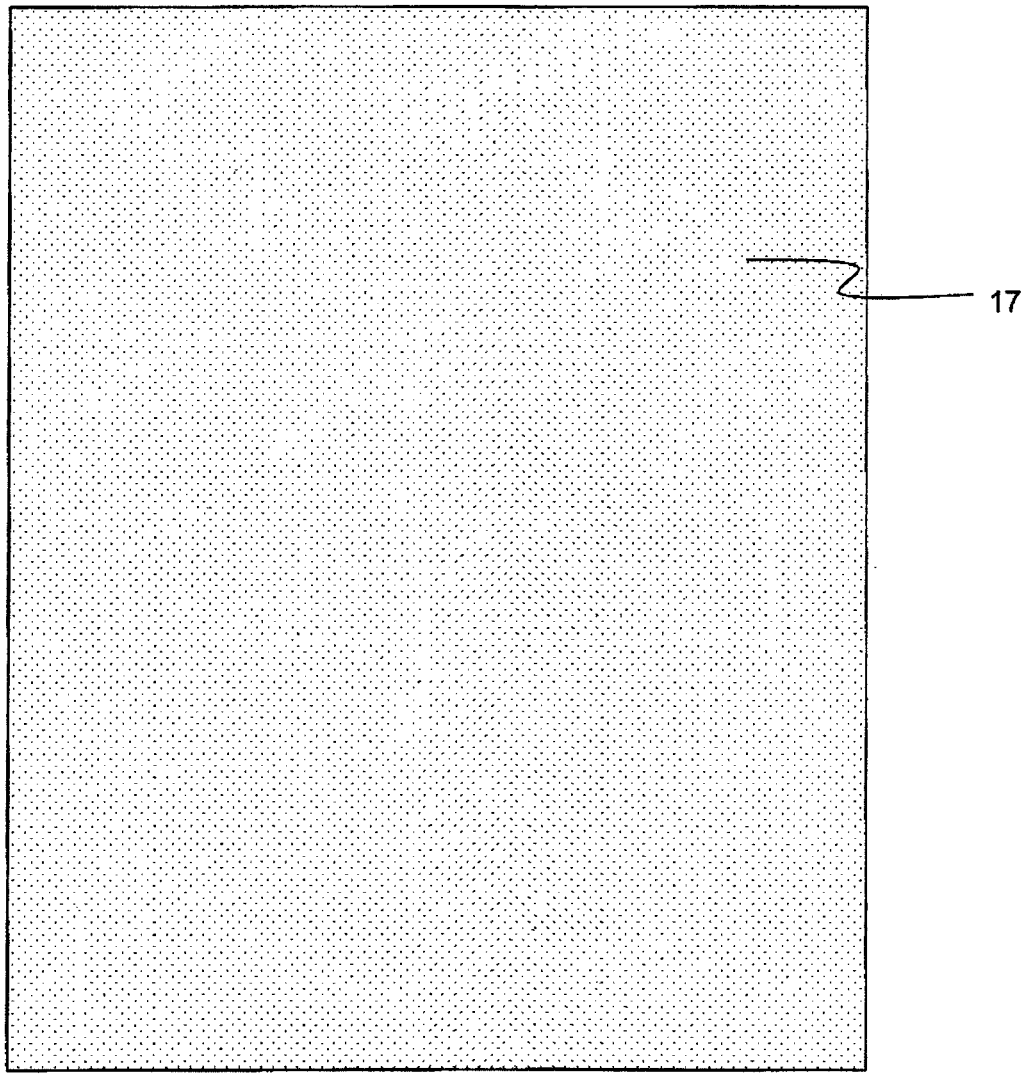
FIG. 2O is a view showing the manufacturing process of the germanium laser diode according to the first embodiment of the present invention seen from above.
Figure 3O:
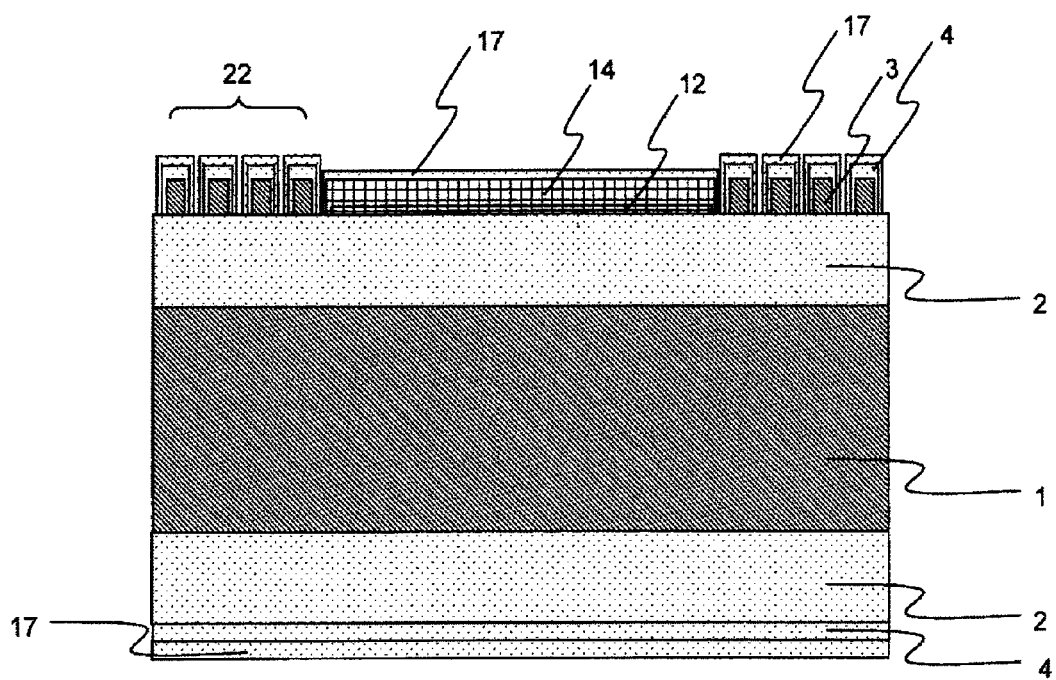
FIG. 3O is a sectional view showing the manufacturing process of the germanium laser diode according to the first embodiment of the present invention.

Subsequently, by performing an annealing process in a nitrogen atmosphere at 900° C. for twenty minutes, the impurities are activated and simultaneously crystallinity of the silicon film 3 is recovered, thereby obtaining the state of FIG. 1O, FIG. 2O and FIG. 3O.

Figure 2P:
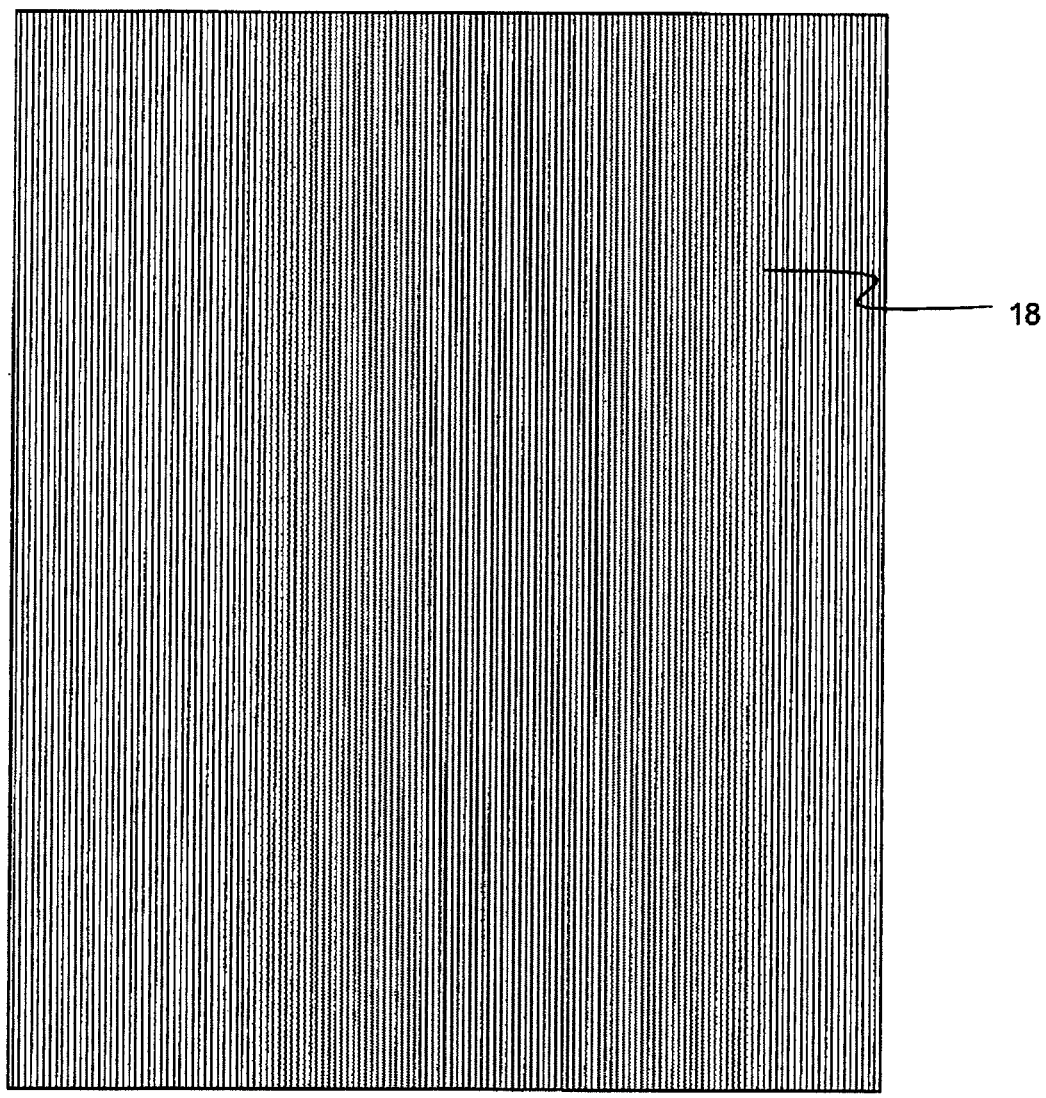
FIG. 2P is a view showing the manufacturing process of the germanium laser diode according to the first embodiment of the present invention seen from above.
Figure 3P:
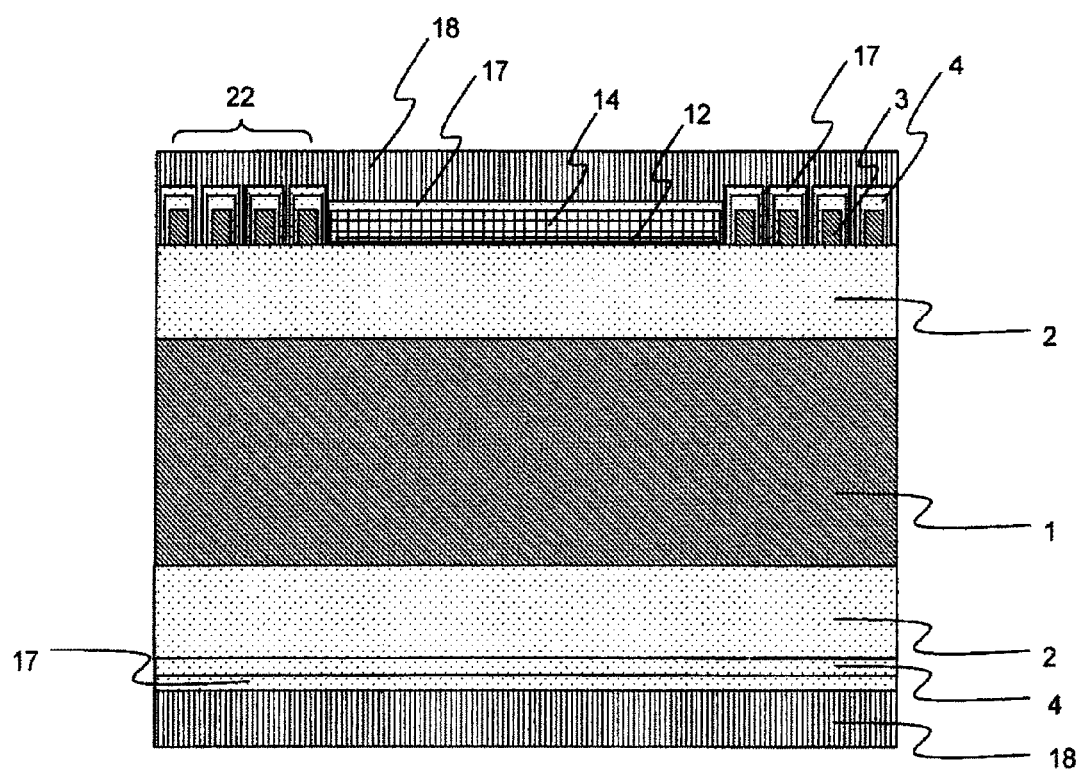
FIG. 3P is a sectional view showing the manufacturing process of the germanium laser diode according to the first embodiment of the present invention.

Next, a silicon nitride film 18 is deposited on the entire surface on the device formation surface side of the silicon substrate 1 so as to have a thickness of about 200 nm, thereby obtaining the state of FIG. 1P, FIG. 2P and FIG. 3P. In the silicon nitride film 18, the amount of nitrogen and hydrogen is optimized so that the silicon nitride film has an internal stress in a film shrinking direction. As a result, tensile strain is applied to the germanium film 14 serving as a light-emitting layer in a planar direction (horizontal direction) of the silicon substrate 1. The film stress is approximately 1 GPa. By applying strong tensile strain in this manner, the germanium film 14 becomes a direct transition one, and in fact, an increase in luminous intensity by photoluminescence is confirmed.

Here, the silicon nitride film 18 is a film which applies (generates) tensile strain to the germanium film 14 to be a light-emitting layer, and a lattice constant of the germanium film 14 to which the tensile strain is applied by this silicon nitride film 18 in a planar direction of the silicon substrate 1 is larger than a lattice constant in an equilibrium state (bulk state).

Figure 2Q:
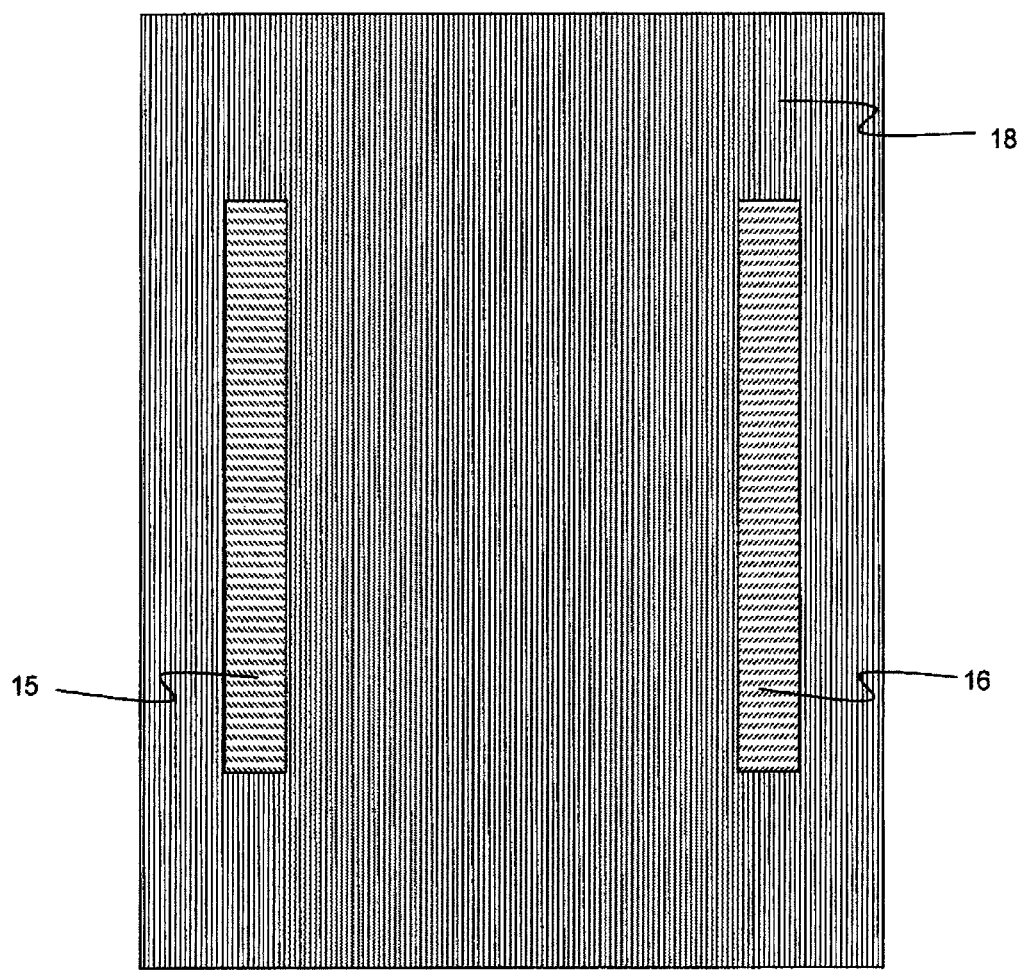
FIG. 2Q is a view showing the manufacturing process of the germanium laser diode according to the first embodiment of the present invention seen from above.
Figure 2R:
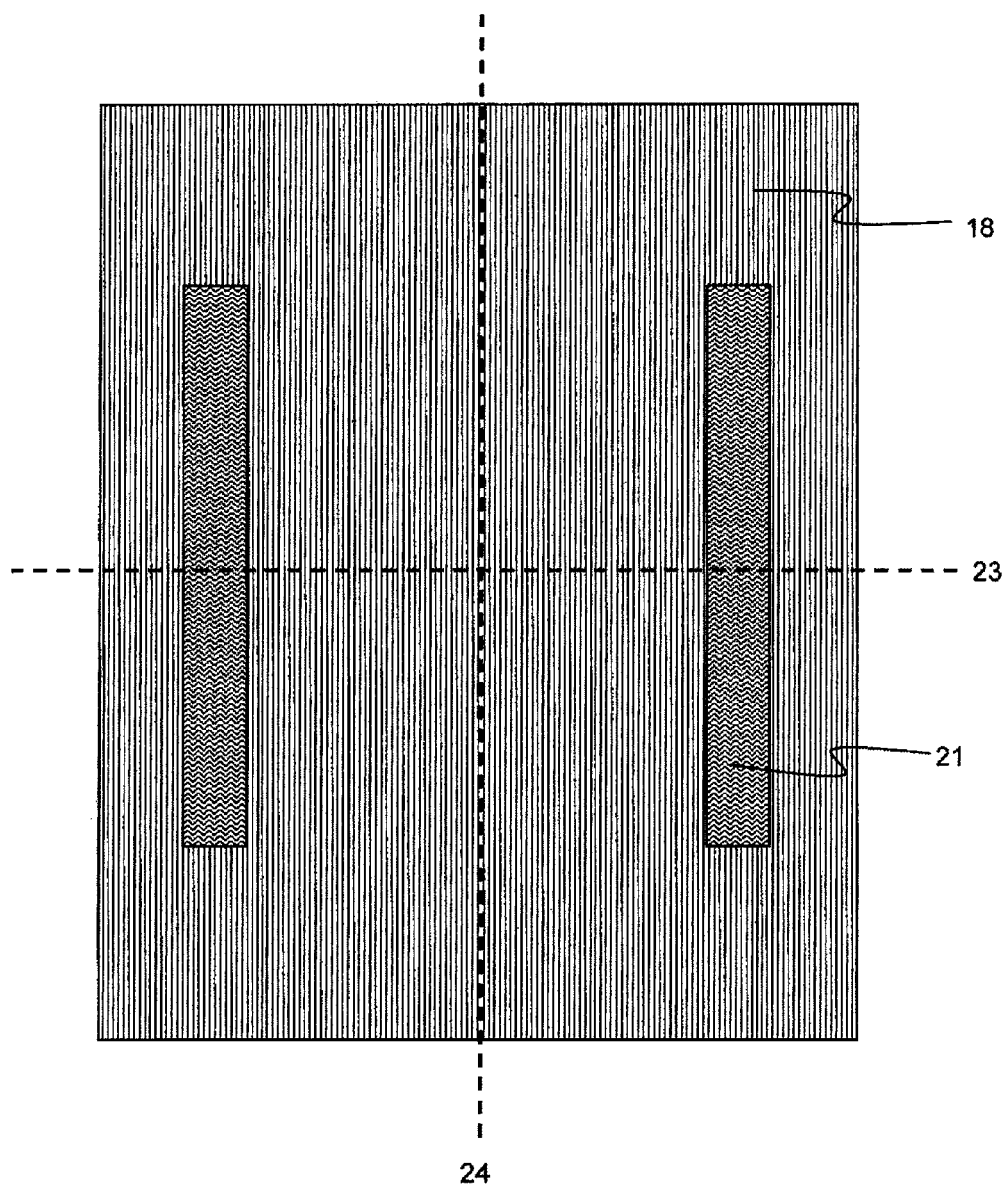
FIG. 2R is a view showing the completed germanium laser diode according to the first embodiment of the present invention seen from above.
Figure 3Q:
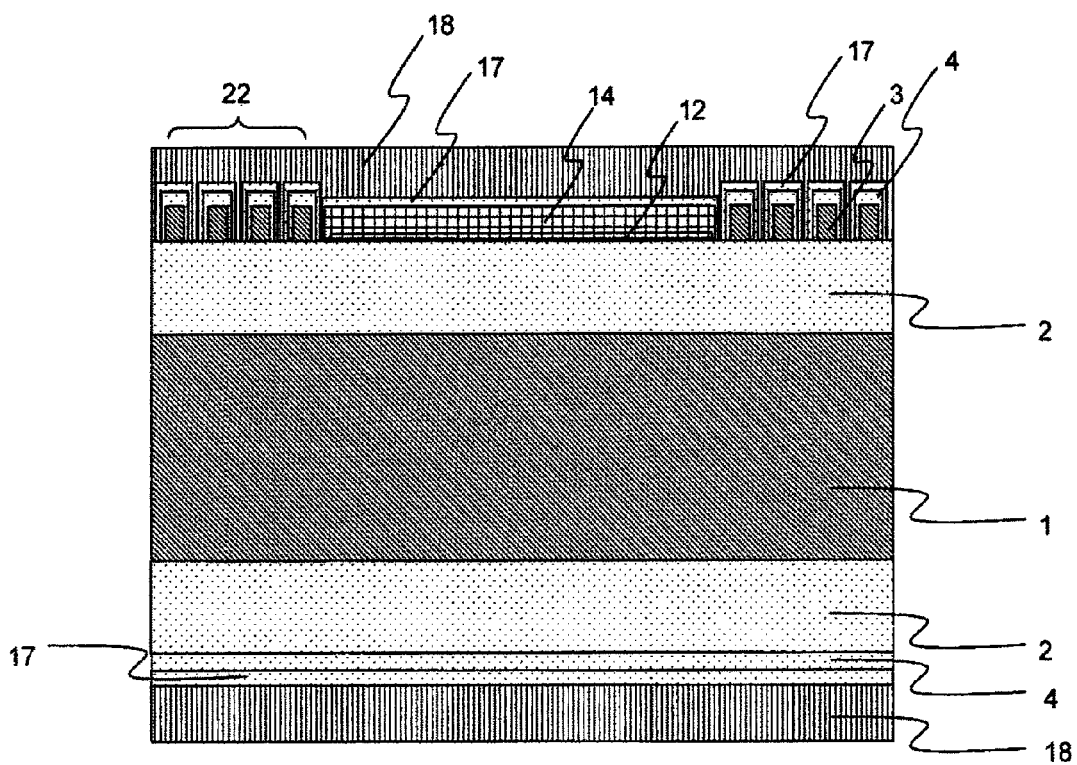
FIG. 3Q is a sectional view showing the manufacturing process of the germanium laser diode according to the first embodiment of the present invention.

Next, after a resist is left only in a desired region by resist patterning using photolithography, the silicon nitride film 18 and the silicon dioxide film 17 are processed by using anisotropic dry etching, thereby obtaining the state of FIG. 1Q, FIG. 2Q and FIG. 3Q in which openings 19 are provided at diffusion layer electrode portions.

Subsequently, after a TiN film and an Al film are deposited on the entire surface, a resist is left only in a desired region by resist patterning using photolithography. Thereafter, the Al film is wet-etched by using an etching solution containing phosphoric acid, acetic acid and nitric acid, and then the TiN film is wet-etched by using an etching solution containing ammonia and hydrogen peroxide. As a result, a TiN electrode 20 and an Al electrode 21 are formed by patterning.

Figure 3R:
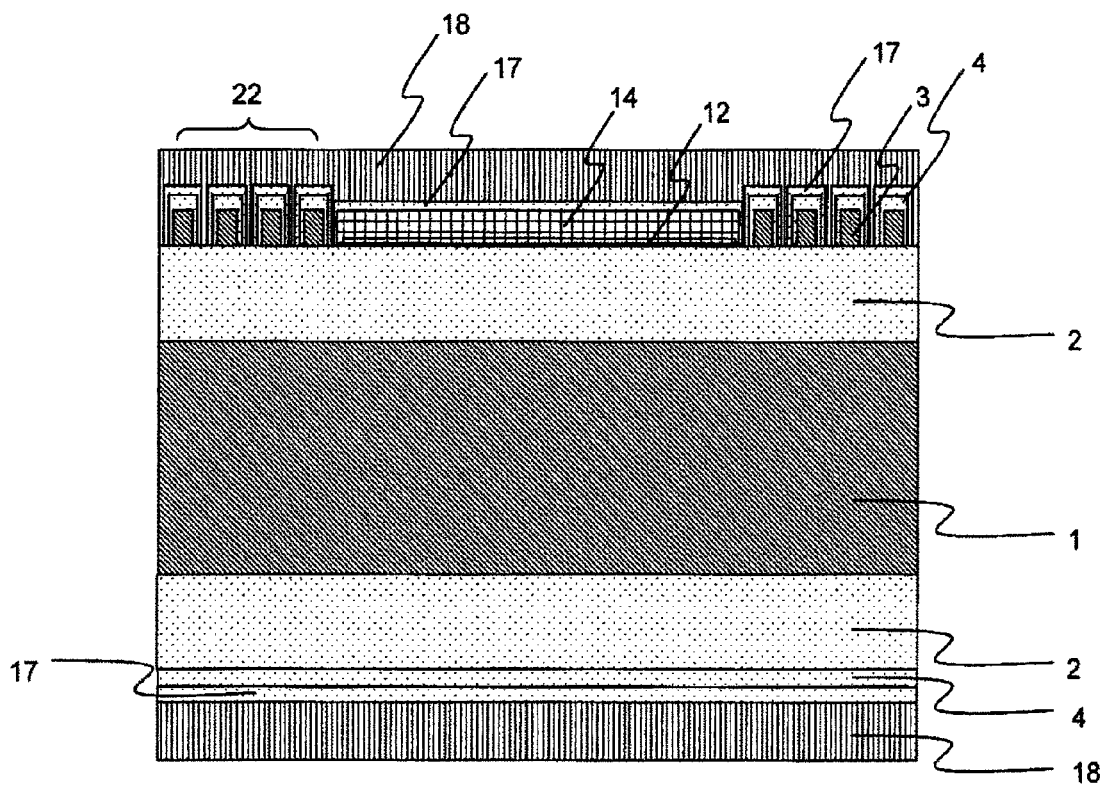
FIG. 3R is a sectional view showing the completed germanium laser diode according to the first embodiment of the present invention.

Subsequently, a hydrogen annealing process is performed at a temperature of 400° C. to perform the treatment for hydrogen-terminating the defects created during the process, thereby obtaining the state of FIG. 1R, FIG. 2R and FIG. 3R, and the device is completed.

The created germanium laser diode oscillates with a designed wavelength of approximately 1500 nm, and is of a single mode according to the spectrum analysis thereof. Since laser light is emitted in a horizontal direction with respect to the silicon substrate 1, it is demonstrated that this diode is optimum for the use of on-chip optical wiring and others.

An optical integrated circuit can be formed by performing a desired wiring process thereafter.

Also, when an electronic circuit is also mounted together, some of the above-described processes can be performed simultaneously with a process of forming a transistor. An electronic device can be easily mounted together if an optical device is fabricated though a normal silicon process in this manner.

Furthermore, by leaving the silicon film 3 as a fine-line structure following the DBR mirror 22, the silicon film 3 can be used as a waveguide. By this means, the silicon film can be used for the optical wiring in a chip. Also, by using a grating or tapered shape, a connection can be made from the fine-line waveguide using the silicon film 3 to an optical fiber, an organic waveguide and the like. By using this, optical wiring between chips becomes possible. In particular, since the tensile-strain-applying germanium laser diode based on the present invention can oscillate near 1500 nm with less transmission loss of the optical fiber, it is found that a laser with a high degree of reliability at low cost can be provided by utilizing the conventional infrastructure for optical transmissions as it is.

Here, the structure of the germanium laser diode in the present embodiment created by the above-described manufacturing method will be described with reference to FIG. 1R, FIG. 2R and FIG. 3R.

In the structure of the germanium laser diode of the present embodiment, the silicon dioxide film 2 as an insulating film is formed on the silicon substrate 1 as a support substrate, and an n-type diffusion layer electrode 32 for injecting electrons, a p-type diffusion layer electrode 31 for injecting holes and a light-emitting part disposed between these n-type diffusion layer electrode 32 and the p-type diffusion layer electrode 31 and electrically connected to the n-type diffusion layer electrode 32 and the p-type diffusion layer electrode 31 are provided on this silicon dioxide film 2. By applying a voltage between the n-type diffusion layer electrode 32 and the p-type diffusion layer electrode 31, electrons and holes are injected to the light-emitting part in a planar direction of the silicon substrate 1.

The light-emitting part is a single-crystal germanium film (14, 12) to which tensile strain is applied by the silicon nitride film 18.

The silicon nitride film 18 has an internal stress for applying tensile strain to the single-crystal germanium film (14, 12), and a lattice constant of the single-crystal germanium film (14, 12) to which the tensile strain is applied by the silicon nitride film 18 is larger than a lattice constant in an equilibrium state (bulk state).

A waveguide is formed spatially apart from the n-type diffusion layer electrode 32 and the p-type diffusion layer electrode 31 in a vertical direction orthogonal to the planar direction of the silicon substrate 1 (in a thickness direction of the silicon substrate 1), and the DBR mirror 22 made of a dielectric is formed at an end of the waveguide.

Second Embodiment

In the present embodiment, a germanium laser diode using a distributed feed-back (abbreviated as DFB) type as a resonance structure and a method of manufacturing the germanium laser diode will be disclosed.

Figure 4A:
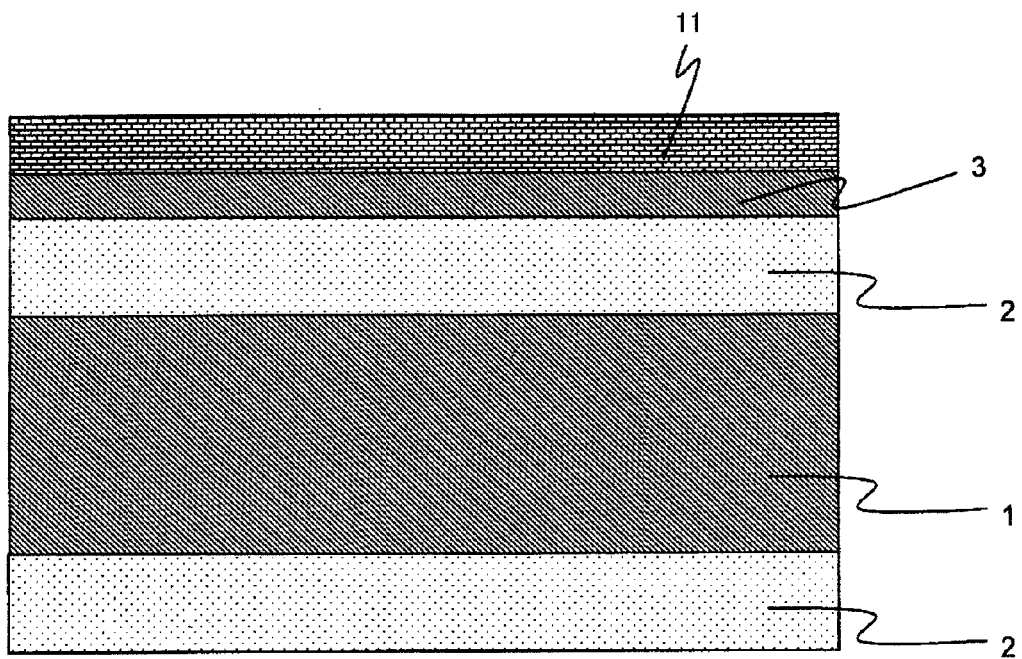
FIG. 4A is a sectional view showing a manufacturing process of a germanium laser diode according to a second embodiment of the present invention.
Figure 4B:
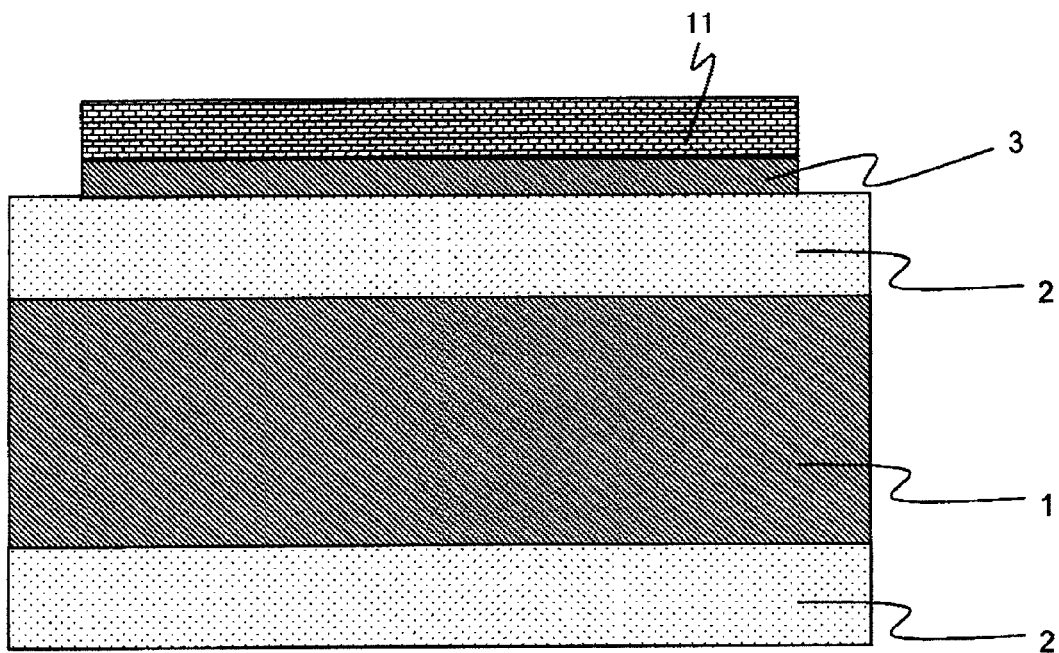
FIG. 4B is a sectional view showing the manufacturing process of the germanium laser diode according to the second embodiment of the present invention.
Figure 4C:
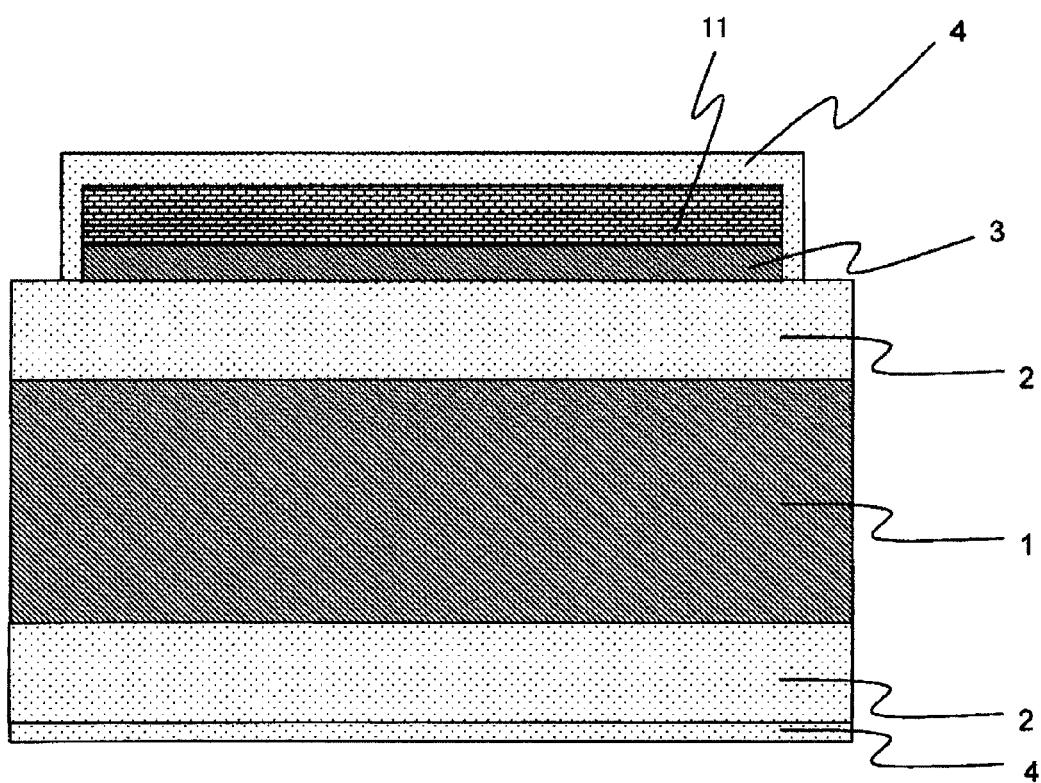
FIG. 4C is a sectional view showing the manufacturing process of the germanium laser diode according to the second embodiment of the present invention.
Figure 4D:
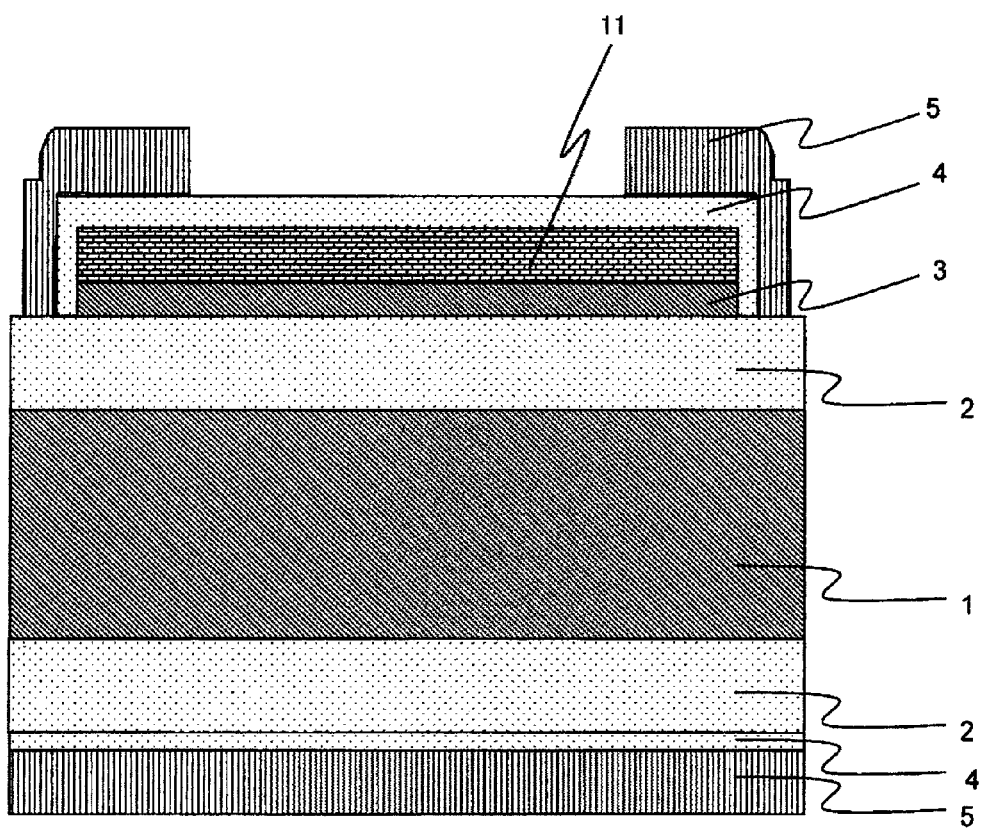
FIG. 4D is a sectional view showing the manufacturing process of the germanium laser diode according to the second embodiment of the present invention.
Figure 4E:
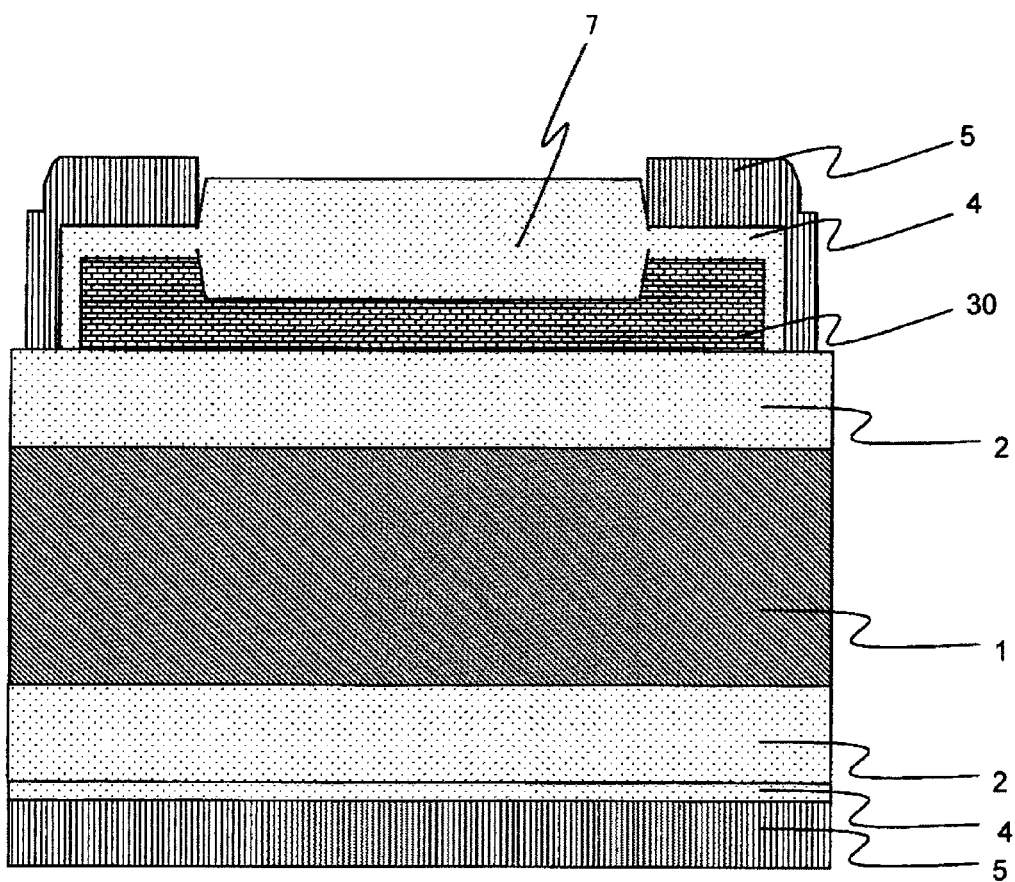
FIG. 4E is a sectional view showing the manufacturing process of the germanium laser diode according to the second embodiment of the present invention.
Figure 4F:
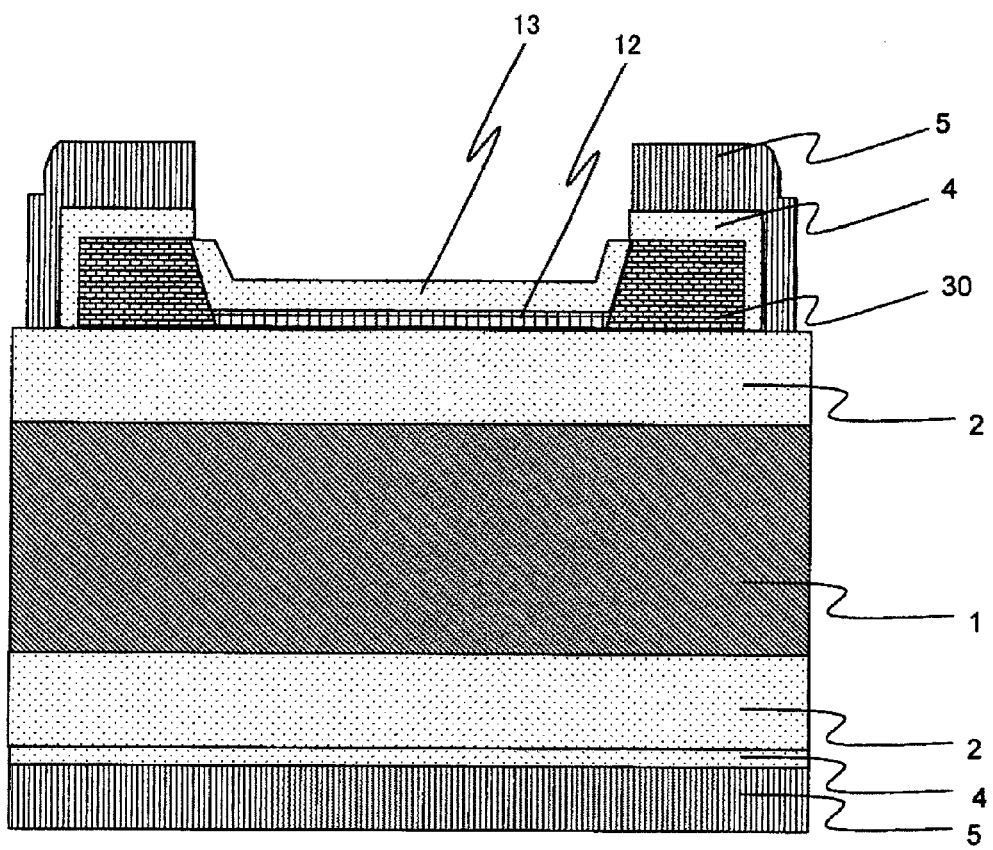
FIG. 4F is a sectional view showing the manufacturing process of the germanium laser diode according to the second embodiment of the present invention.
Figure 4G:
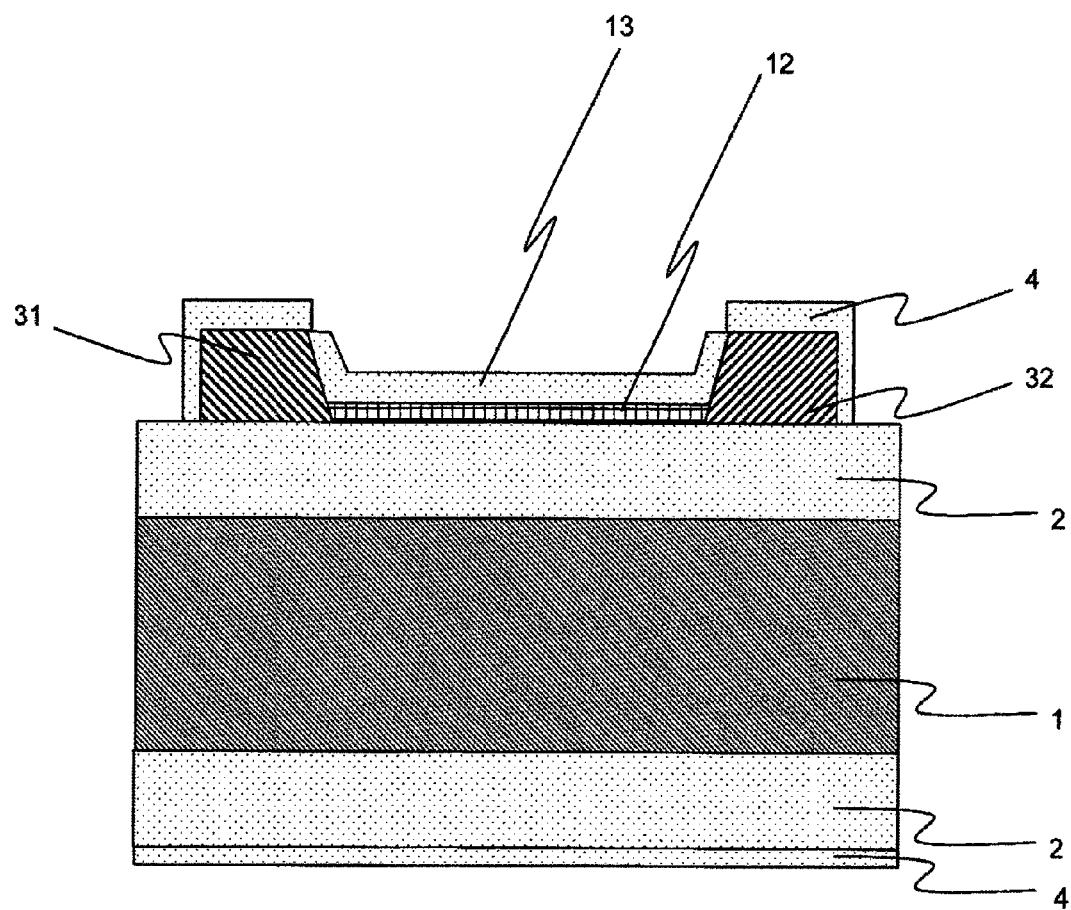
FIG. 4G is a sectional view showing the manufacturing process of the germanium laser diode according to the second embodiment of the present invention.
Figure 4H:
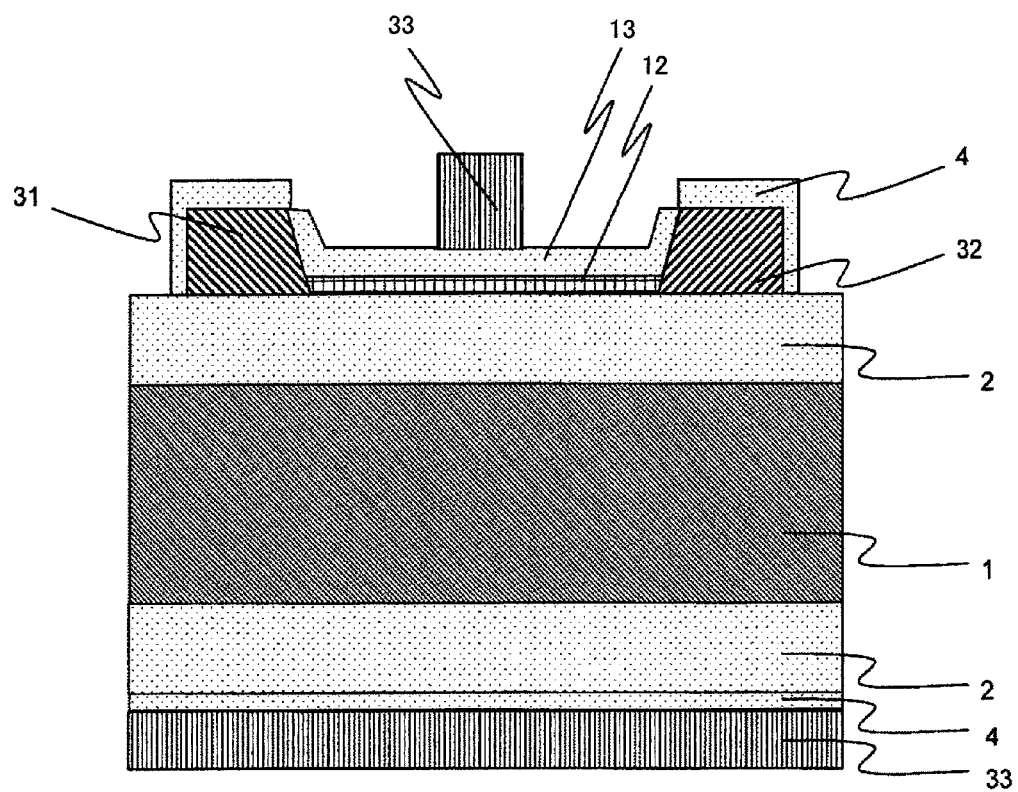
FIG. 4H is a sectional view showing the manufacturing process of the germanium laser diode according to the second embodiment of the present invention.
Figure 4I:
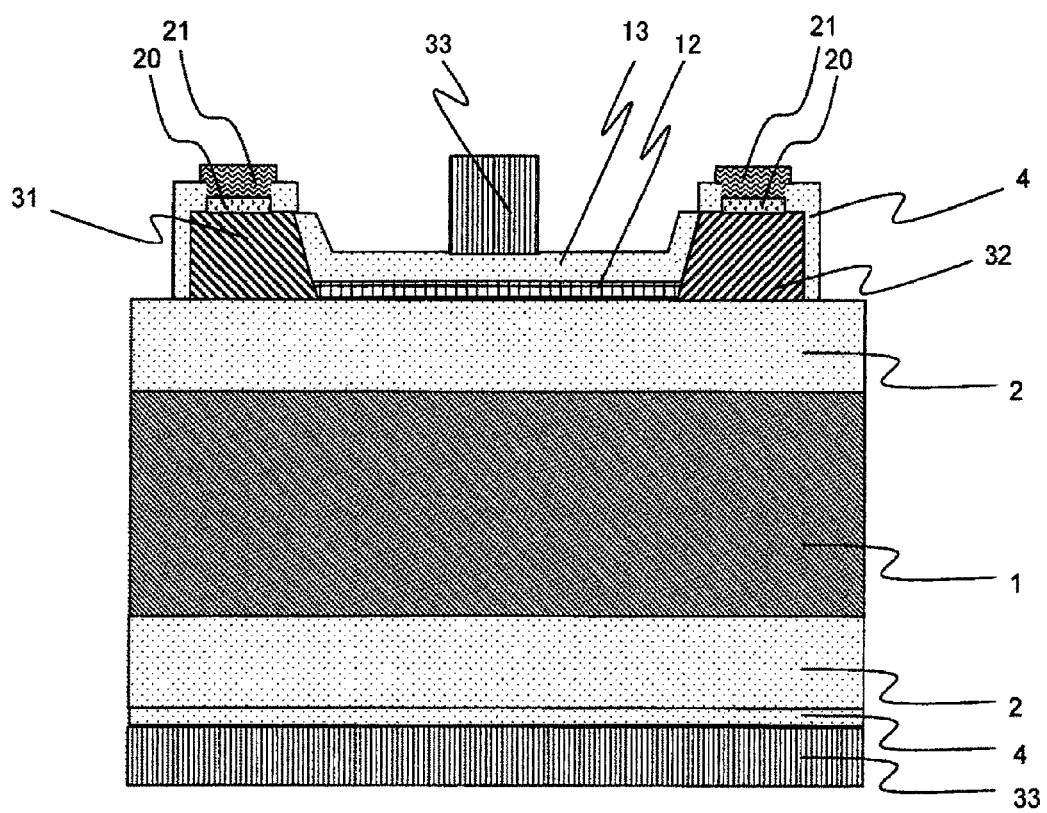
FIG. 4I is a sectional view showing the completed germanium laser diode according to the second embodiment of the present invention.

FIG. 4A to FIG. 4I each depicts a sectional structure in the order of a manufacturing process. Also, FIG. 5A to FIG. 5I depict schematic drawings viewed from above a substrate in the order of a manufacturing process. Here, FIG. 4A to FIG. 4I are sectional views in a lateral direction of FIG. 5A to FIG. 5I, respectively. For example, FIG. 4I depicts a sectional structure taken along a cutting-plane line 23 in FIG. 5I. Furthermore, FIG. 6I depicts a sectional structure taken along a cutting-plane line 24 in FIG. 5I. The cutting-plane lines 23 and 24 are orthogonal to each other in the same plane, the cutting-plane line 23 extends in an X direction in the drawing, and the cutting-plane line 24 extends in a Y direction in the drawing. The drawings of a completed device in the present embodiment are FIG. 4I FIG. 5I and FIG. 6I.

The manufacturing process will be sequentially described below.

Figure 5A:
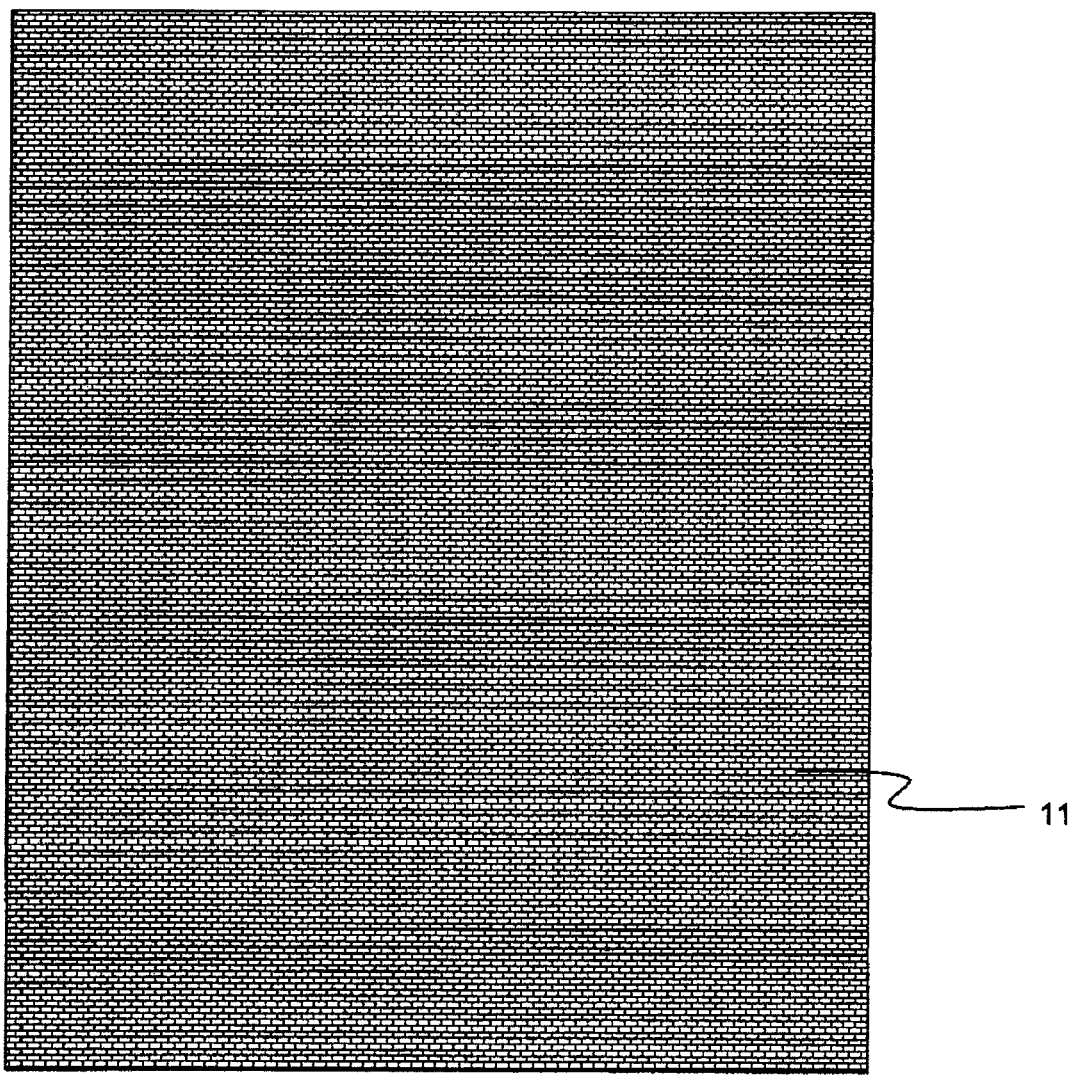
FIG. 5A is a view showing the manufacturing process of the germanium laser diode according to the second embodiment of the present invention seen from above.
Figure 6I:
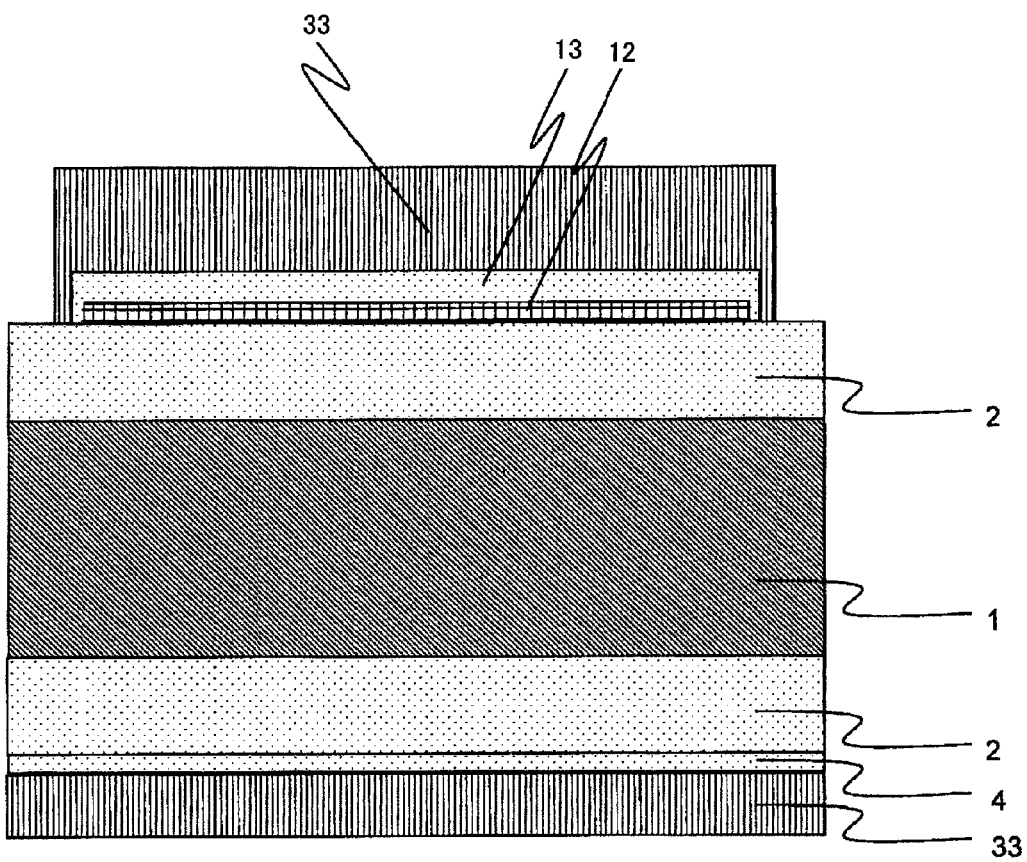
FIG. 6I is a sectional view showing the completed germanium laser diode according to the second embodiment of the present invention.

First, as depicted in FIG. 4A and FIG. 5A, an SOI substrate in which a silicon substrate 1 as a support substrate, a silicon dioxide film 2 as a buried oxide film (BOX layer) and a silicon film 3 as a semiconductor layer are stacked is prepared. The silicon film 3 in the test production of the present embodiment before being processed has an initial film thickness of 200 nm. Also, the silicon dioxide film 2 has a film thickness of 2000 nm. The silicon dioxide film 2 is formed also on a back surface side of the silicon substrate 1. Here, after the SOI substrate is cleaned, a silicon-germanium film 11 made of 80% silicon and 20% germanium is epitaxially grown on the entire surface of the silicon film 3 so as to have a film thickness of 50 nm. Since the film thickness of the grown silicon-germanium film 11 is equal to or smaller than a critical thickness, no crystal defect or dislocation is created.

Figure 5B:
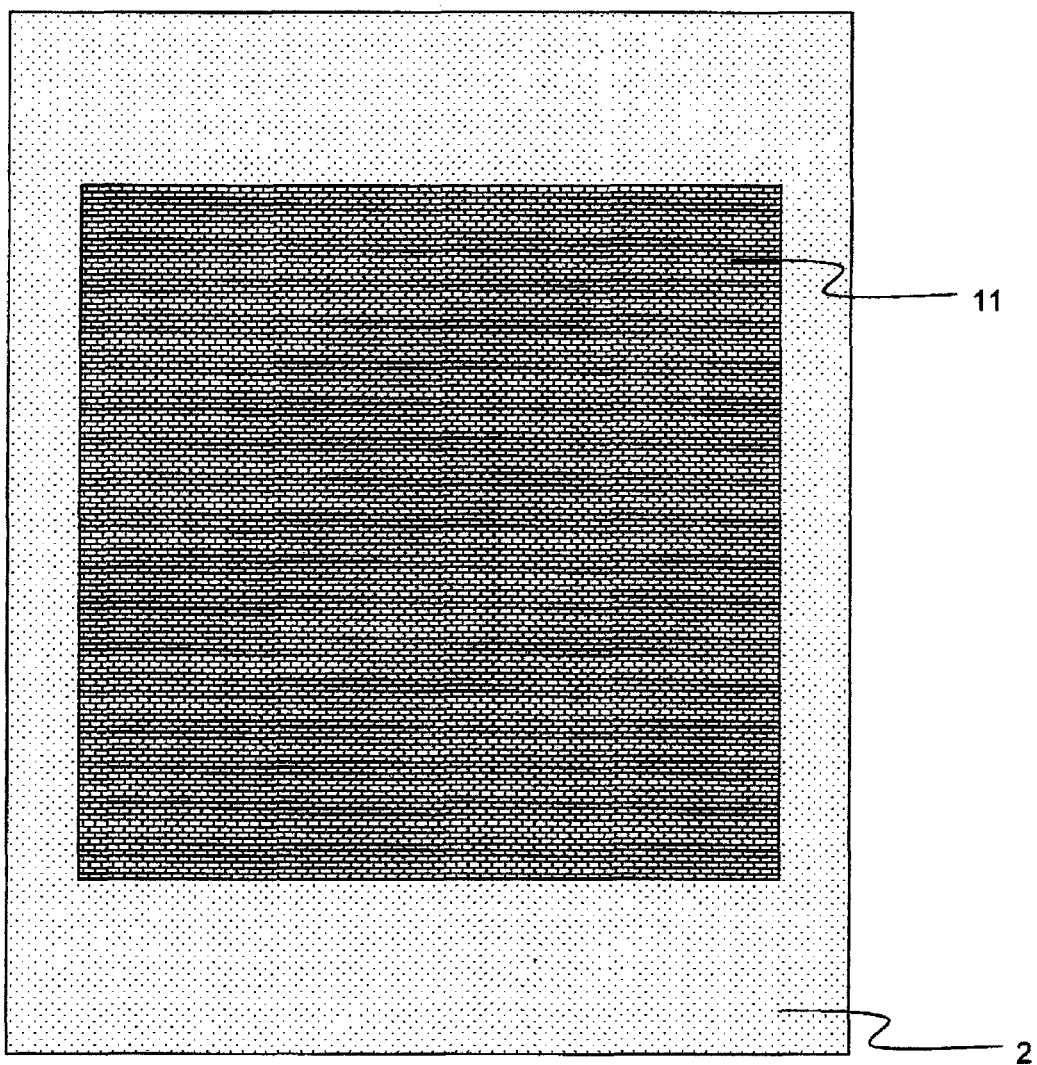
FIG. 5B is a view showing the manufacturing process of the germanium laser diode according to the second embodiment of the present invention seen from above.

Next, after a resist is applied, the resist is left only in a desired region exposed through a mask by photolithography, and then anisotropic dry etching is performed. By this means, as depicted in FIG. 4B and FIG. 5B, the silicon-germanium film 11 and the silicon film 3 are processed in a mesa shape.

Figure 5C:
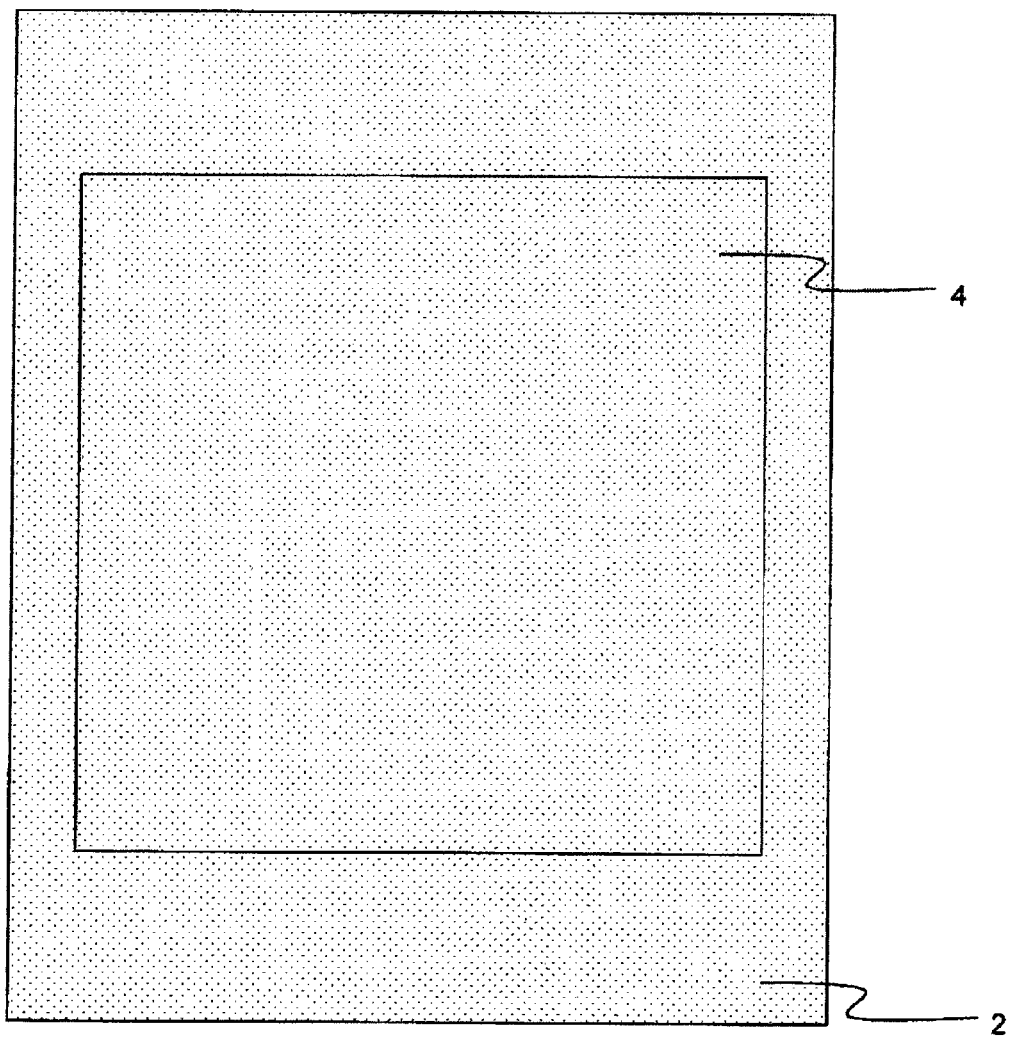
FIG. 5C is a view showing the manufacturing process of the germanium laser diode according to the second embodiment of the present invention seen from above.
Figure 5D:
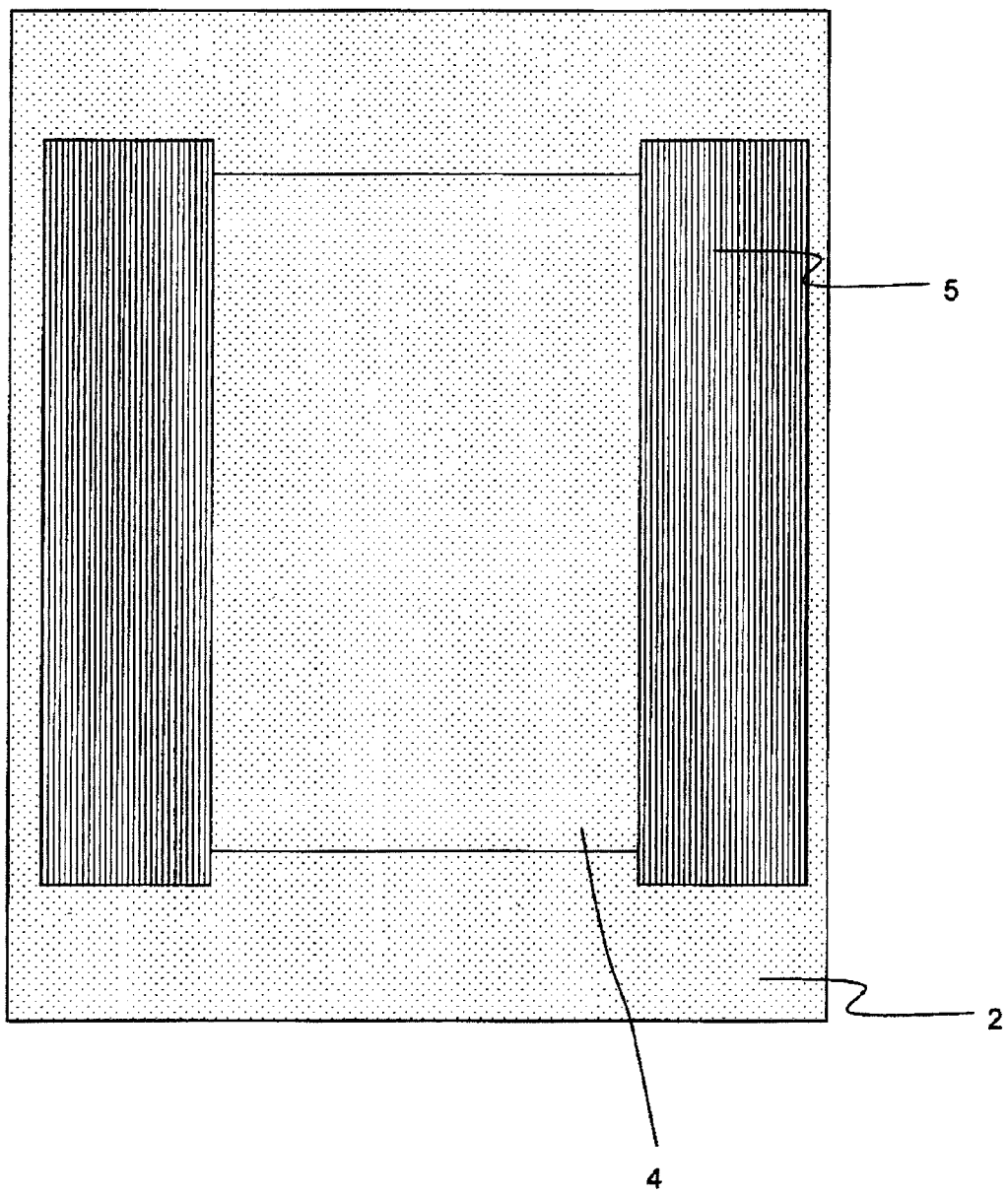
FIG. 5D is a view showing the manufacturing process of the germanium laser diode according to the second embodiment of the present invention seen from above.
Figure 5E:
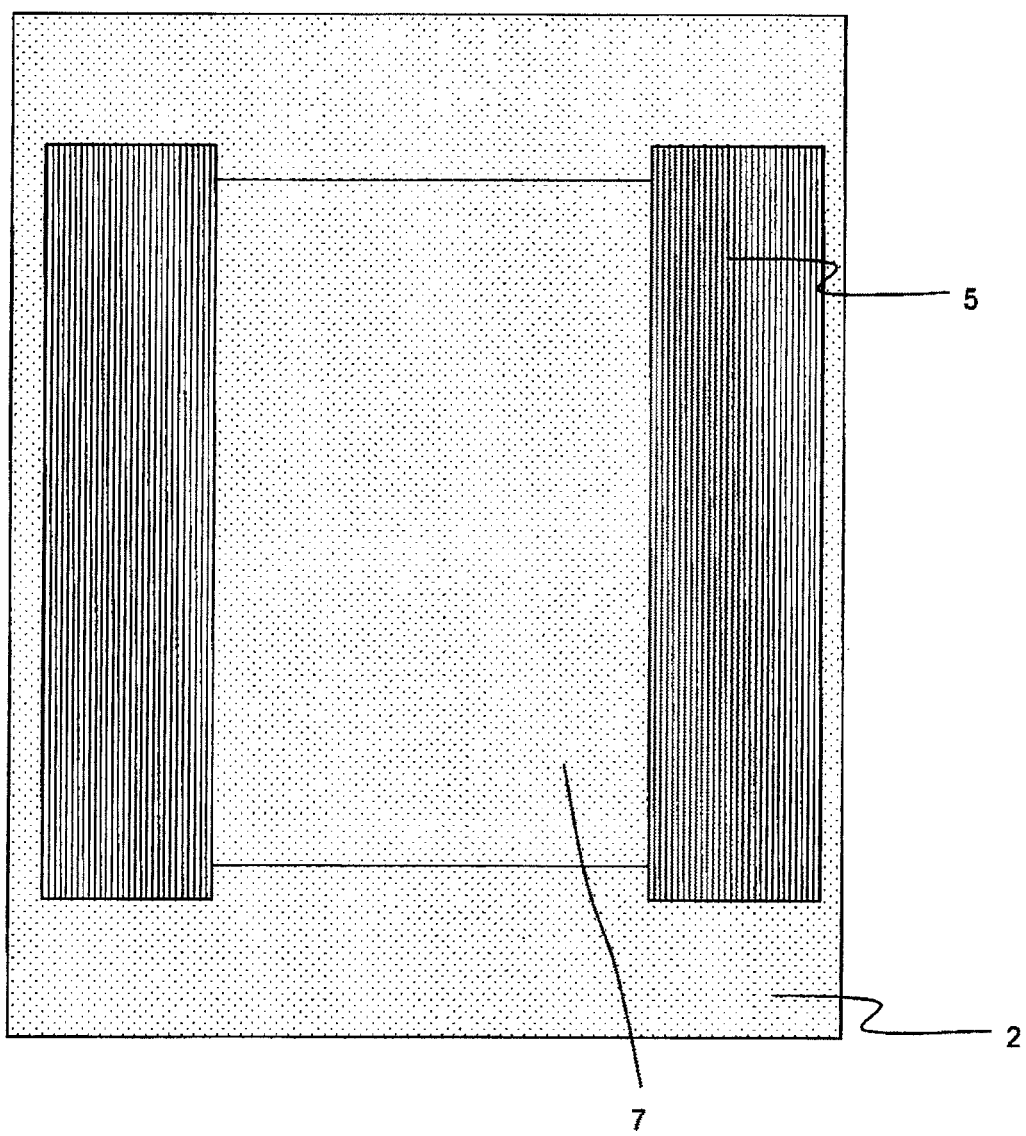
FIG. 5E is a view showing the manufacturing process of the germanium laser diode according to the second embodiment of the present invention seen from above.
Figure 5F:
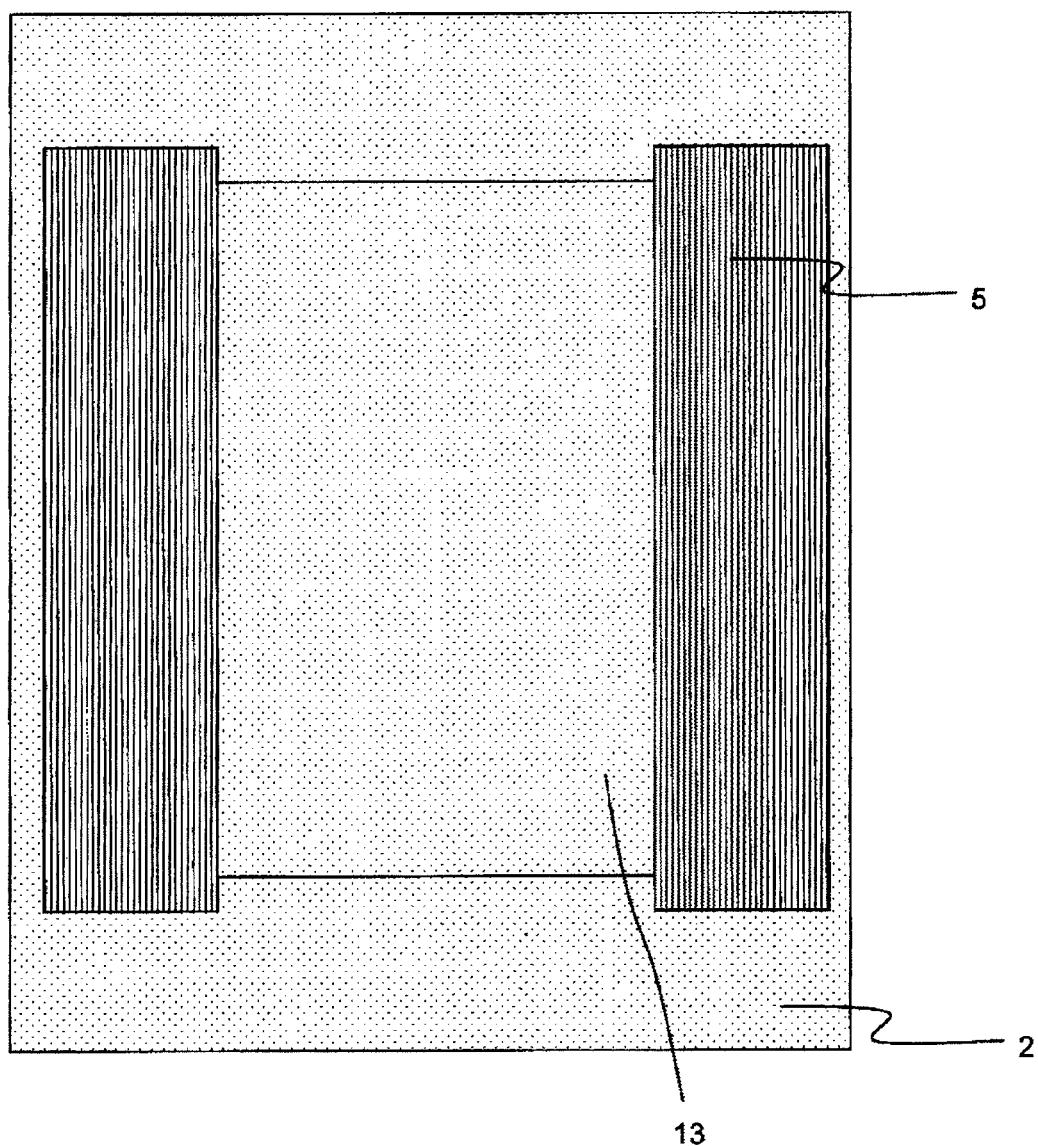
FIG. 5F is a view showing the manufacturing process of the germanium laser diode according to the second embodiment of the present invention seen from above.

Next, after a cleaning process is performed, in order to protect the surfaces of the silicon-germanium film 11 and the silicon film 3, a silicon dioxide film 4 having a thickness of approximately 30 nm is formed on these surfaces by a CVD method, thereby obtaining the state depicted in FIG. 4C and FIG. 5C.

Next, a silicon nitride film 5 is deposited on the entire surface of the silicon dioxide film 2 including the surface of the silicon-germanium film 11 so as to have a thickness of about 100 nm. Then, a resist is left only in a desired region by resist patterning using photolithography. Thereafter, the silicon nitride film 5 is processed by using anisotropic dry etching, thereby obtaining the state of FIG. 4D and FIG. 5D. As depicted in FIG. 4D, the silicon nitride film 5 is formed also on the back surface side of the silicon substrate 1.

Subsequently, by a cleaning process and wet etching using hydrofluoric acid, the silicon dioxide film 4 existing in an opening on the front surface is removed. Then, the silicon-germanium film 11 existing in the opening is locally oxidized by an oxidizing process to form a thermal oxidation film 7. Simultaneously, germanium in the silicon-germanium film 11 is diffused by this thermal treatment to the silicon film 3 to form a silicon-germanium film 30, thereby obtaining the state depicted in FIG. 4E and FIG. 5E. At this time, the oxidized film thickness of the thermal oxidation film 7 is adjusted to be approximately 460 nm. As a result, 20 nm of the film thickness of the silicon-germanium film 30 in the opening is left.

Subsequently, the thermal oxidation film 7 on the surface is removed by wet etching using hydrofluoric acid. Then, by performing an oxidizing process, silicon present in the silicon-germanium film 30 at the opening is selectively oxidized, and an oxidizing process is performed so that the thermal oxidation film 13 made of silicon dioxide has a film thickness of about 20 nm, thereby obtaining the state depicted in FIG. 4F and FIG. 5F in which a condensed ultra-thin single-crystal germanium film 12 having a thickness of about 10 nm is formed.

Next, by a cleaning process and wet etching using hot phosphoric acid, the silicon nitride film 5 is removed.

Subsequently, impurities are put into a desired region in the silicon-germanium film 30 by ion implantation. At this time, the ion implantation is controlled so that almost no impurity is implanted into the ultra-thin single-crystal germanium film 12. This is because, if high-concentration impurities are left in the light-emitting part, impurities become a center of non-radiative recombination to decrease the luminous efficiency, and therefore, a low impurity concentration is preferable in the light-emitting part. In the impurity implantation, after the resist is first left only in a desired region by the resist patterning using photolithography, $BF_2$ (boron difluoride) ions are ion-implanted with a dose amount of $1 \times 10^{15}$ [$1/cm^2$], thereby forming a p-type diffusion layer electrode 31 as an anode electrode in the silicon-germanium film 30.

Subsequently, after the resist is removed, a resist is again left only in a desired region by the resist patterning using photolithography. Then, P (phosphorus) ions are ion-implanted with a dose amount of $1 \times 10^{15}$ [$1/cm^2$], thereby forming an n-type diffusion layer electrode 32 as a cathode electrode in the silicon-germanium film 30. In this ion implanting process, since an ion-implanted portion of the silicon-germanium film 30 is amorphized, the crystallinity deteriorates. Therefore, the fact that only the surface of the silicon-germanium film 30 is amorphized and the silicon-germanium film 30 in a crystal state is left in a region of the silicon-germanium film 30 adjacent to the BOX layer (silicon dioxide film 2) is important though not shown in the drawings. If the acceleration voltage of ion implantation is set too high, the entire silicon-germanium film 30 in the ion-implanted region is amorphized. Therefore, the single crystallinity is not recovered even if an annealing process is performed thereafter, and silicon-germanium disadvantageously becomes a polycrystal. When the ion implanting conditions set in the present embodiment are used, since the silicon-germanium film 30 in a crystal state is left in the region adjacent to the BOX layer (silicon dioxide film 2), the crystallinity can be recovered by an activation heat treatment after ion implantation or the like. For the efficient light emission, excellent single crystallinity is extremely important.

Figure 5G:
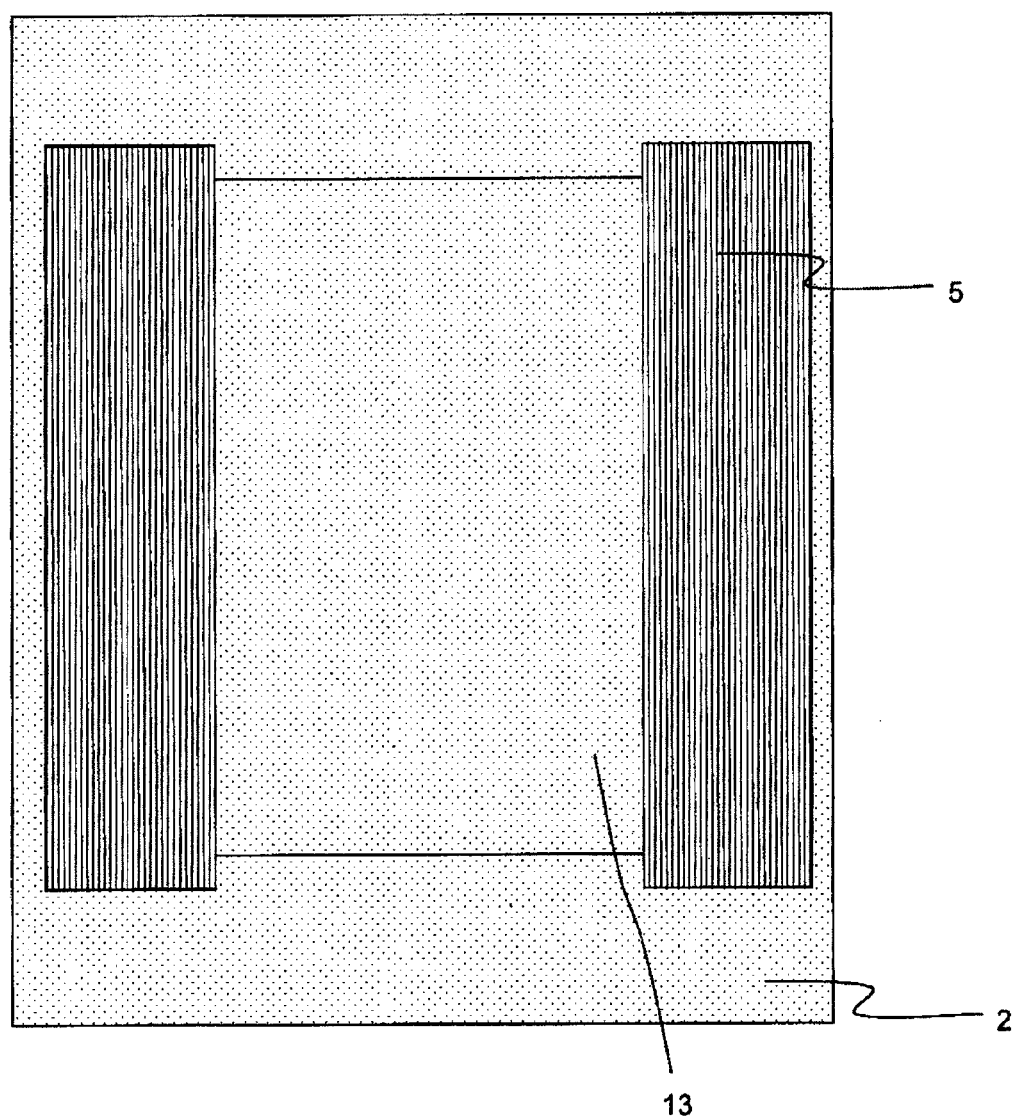
FIG. 5G is a view showing the manufacturing process of the germanium laser diode according to the second embodiment of the present invention seen from above.

Subsequently, by performing an annealing process in a nitrogen atmosphere at 900° C. for twenty minutes, the impurities are activated and simultaneously crystallinity of the silicon-germanium film 30 is recovered, thereby obtaining the state depicted in FIG. 4G and FIG. 5G.

Figure 5H:
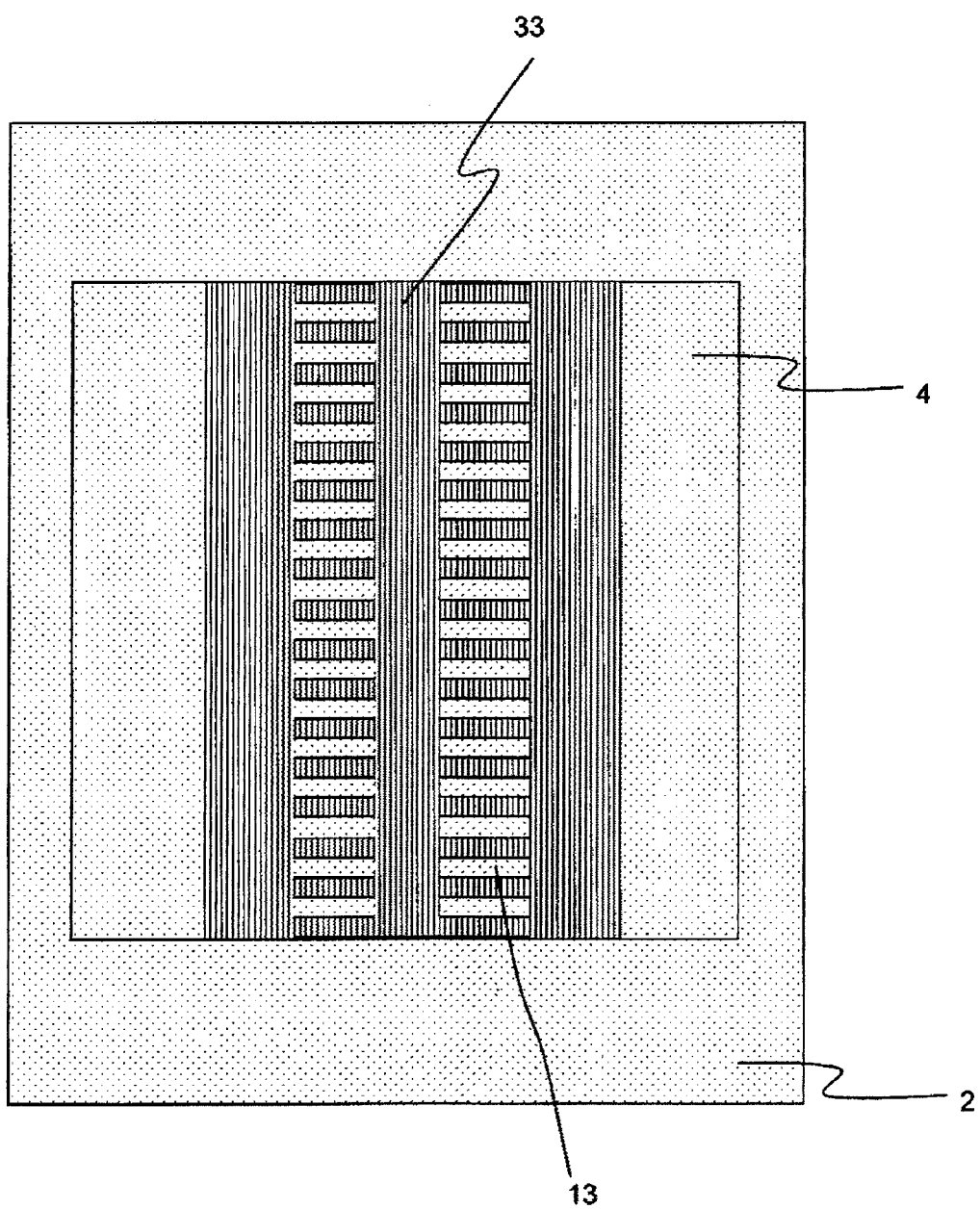
FIG. 5H is a view showing the manufacturing process of the germanium laser diode according to the second embodiment of the present invention seen from above.

Next, after a silicon nitride film is deposited on the entire surface, the resist is left only in a desired region by the resist patterning using photolithography. Then, the silicon nitride film is patterned by using anisotropic dry etching to form a strain-applying silicon nitride resonator 33, thereby obtaining the state depicted in FIG. 4H and FIG. 5H. Here, the strain-applying silicon nitride resonator 33 also plays a role of applying tensile strain to the ultra-thin single-crystal germanium film 12 to be a light-emitting layer. As a result, the ultra-thin single-crystal germanium film 12 changes its characteristics to a direct transition semiconductor. Also, as depicted in FIG. 5H viewed from above, the strain-applying silicon nitride resonator 33 is patterned cyclically into a spine-like shape. A center portion of the strain-applying silicon nitride resonator 33 forms a waveguide, and light emitted from the ultra-thin single-crystal germanium film 12 is mainly confined in this portion. The reason why the thickness of the strain-applying silicon nitride resonator 33 is cyclically changed is that modulation of the refractive index is effectively provided to light travelling through this waveguide. More specifically, in the strain-applying silicon nitride resonator 33, it can be assumed that a thick portion has an effectively large refractive index because a region where light can be confined is wide and a thin portion has an effectively small refractive index because a confining region is narrow. The lengths of these thick portion and thin portion in a waveguide direction are each designed to be approximately one fourth of a luminous wavelength. As a result, the light traveling through the waveguide is repeatedly reflected with sensing these cyclic structures, and is strongly confined in the resonator. By forming a gap inside silicon nitride in this manner, the strain-applying silicon nitride resonator 33 can have both a function of a resonator and a function of strain application. In addition, since light is confined in the center portion of the strain-applying silicon nitride resonator 33, the resonator is designed so that light is prevented from being absorbed in free carriers existing in the p-type diffusion layer electrode 31 and the n-type diffusion layer electrode 32.

Here, the strain-applying silicon nitride resonator 33 is formed of a silicon nitride film having an internal stress capable of applying tensile strain to the ultra-thin single-crystal germanium film 12 to be a light-emitting layer in a planar direction of the silicon substrate 1, and a lattice constant of the ultra-thin single-crystal germanium film 12 to which the tensile strain is applied by this silicon nitride film in a planar direction of the silicon substrate 1 is larger than a lattice constant in an equilibrium state (bulk state).

Subsequently, after a TiN film and an Al film are deposited on the entire surface, a resist is left only in a desired region by resist patterning using photolithography. Thereafter, the Al film is wet-etched by using an etching solution containing phosphoric acid, acetic acid and nitric acid, and then the TiN film is wet-etched by using an etching solution containing ammonia and hydrogen peroxide. As a result, a TiN electrode 20 and an Al electrode 21 are formed by patterning. Subsequently, a hydrogen annealing process is performed at a temperature of 400° C. to perform the treatment for hydrogen-terminating the defects created during the process, thereby obtaining the state of FIG. 4I, FIG. 5I and FIG. 6I, and the device is completed.

As depicted in FIG. 4I, since the thermal oxidation film 13 made of silicon dioxide is formed between the strain-applying silicon nitride resonator 33 and the ultra-thin single-crystal germanium film 12 to be an active layer, they are physically separated from each other. However, since the film thickness of the thermal oxidation film 13 is only 20 nm, the light confined in a waveguide part near the center of the strain-applying silicon nitride resonator 33 can sufficiently leak into the inside of the thermal oxidation film 13 and the ultra-thin single-crystal germanium film 12. With the evanescent coupling described above, the germanium laser diode of the present embodiment can perform laser oscillation. Also, since the film thickness of the ultra-thin single-crystal germanium film 12 is designed to be 10 nm, the carrier density can be increased without causing the quantum confinement effect and increasing parasitic resistance. As a result, the population inversion indispensable for laser oscillation can be formed.

The created germanium laser diode oscillates with a designed wavelength of approximately 1500 nm, and is of a single mode according to the spectrum analysis thereof. Since the germanium laser diode according to the present invention has a distributed feed-back structure and selectively enhances the wavelength defined from the cyclic structure of the mirror, the single-mode oscillation is possible. A more reliable single-mode property can be easily achieved by optimizing the waveguide structure of the strain-applying silicon nitride resonator 33 so that the phase of light is shifted by a ¼ wavelength near the center (not shown).

Figure 5I:
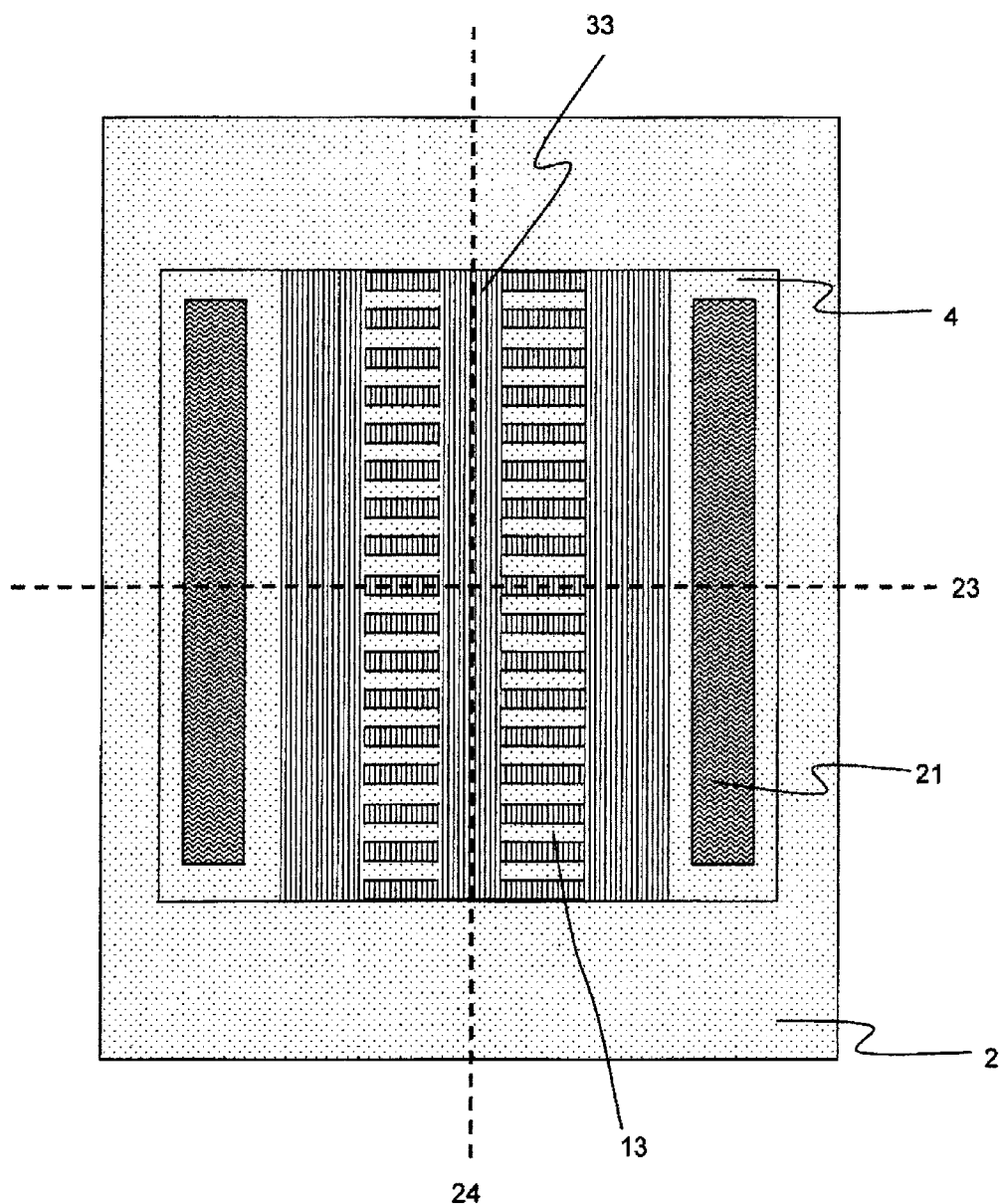
FIG. 5I is a view showing the completed germanium laser diode according to the second embodiment of the present invention seen from above.

Here, the structure of the germanium laser diode in the present embodiment created by the above-described manufacturing method will be described with reference to FIG. 4I, FIG. 5I and FIG. 6I.

In the structure of the germanium laser diode of the present embodiment, the silicon dioxide film 2 as an insulating film is formed on the silicon substrate 1 as a support substrate, and an n-type diffusion layer electrode 32 for injecting electrons, a p-type diffusion layer electrode 31 for injecting holes and a light-emitting part disposed between these n-type diffusion layer electrode 32 and the p-type diffusion layer electrode 31 and electrically connected to the n-type diffusion layer electrode 32 and the p-type diffusion layer electrode 31 are provided on this silicon dioxide film 2. By applying a voltage between the n-type diffusion layer electrode 32 and the p-type diffusion layer electrode 31, electrons and holes are injected to the light-emitting part in a planar direction of the silicon substrate 1.

The light-emitting part is formed of the ultra-thin single-crystal germanium film 12, and the strain-applying silicon nitride resonator 33 is formed on the ultra-thin single-crystal germanium film 12 of the light-emitting part via the thermal oxidation film 13. The strain-applying silicon nitride resonator 33 is formed of a silicon nitride film having an internal stress for applying tensile strain to the ultra-thin single-crystal germanium film 12 of the light-emitting part, and a lattice constant of the ultra-thin single-crystal germanium film 12 to which tensile strain is applied by the strain-applying silicon nitride resonator 33 is larger than a lattice constant in an equilibrium state (bulk state).

Third Embodiment

In the present embodiment, a DBR germanium laser diode using STI (Shallow Trench Isolation) as a strain-applying method and a method of manufacturing the germanium laser diode will be disclosed.

Figure 7A:
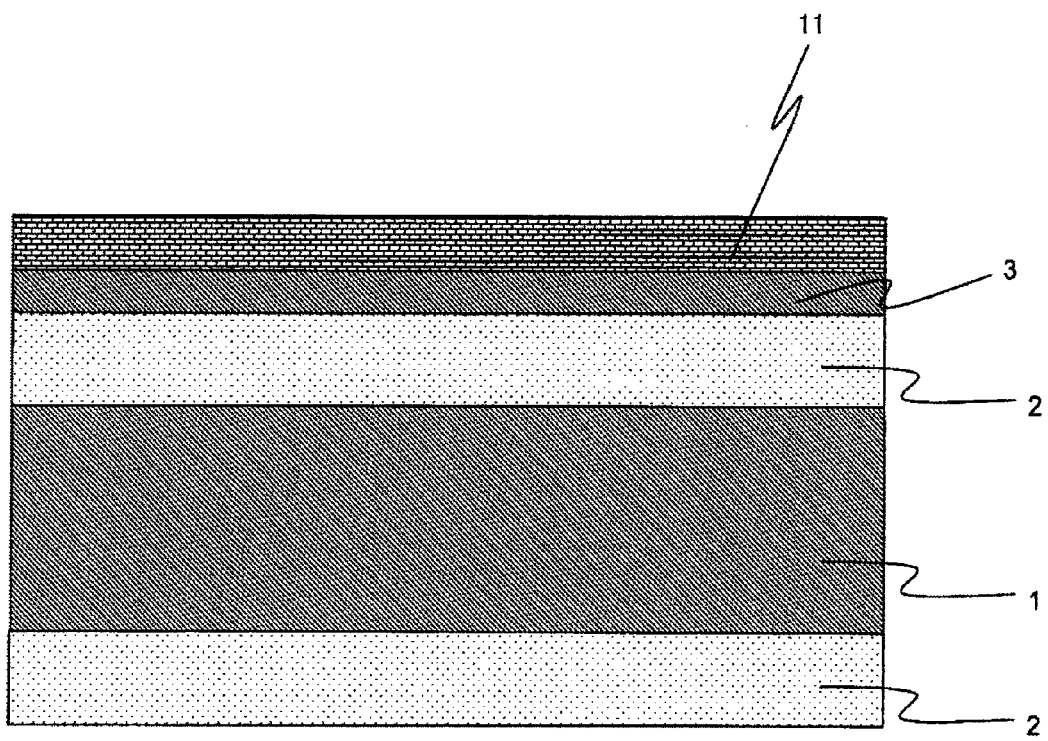
FIG. 7A is a sectional view showing a manufacturing process of a germanium laser diode according to a third embodiment of the present invention.
Figure 8K:
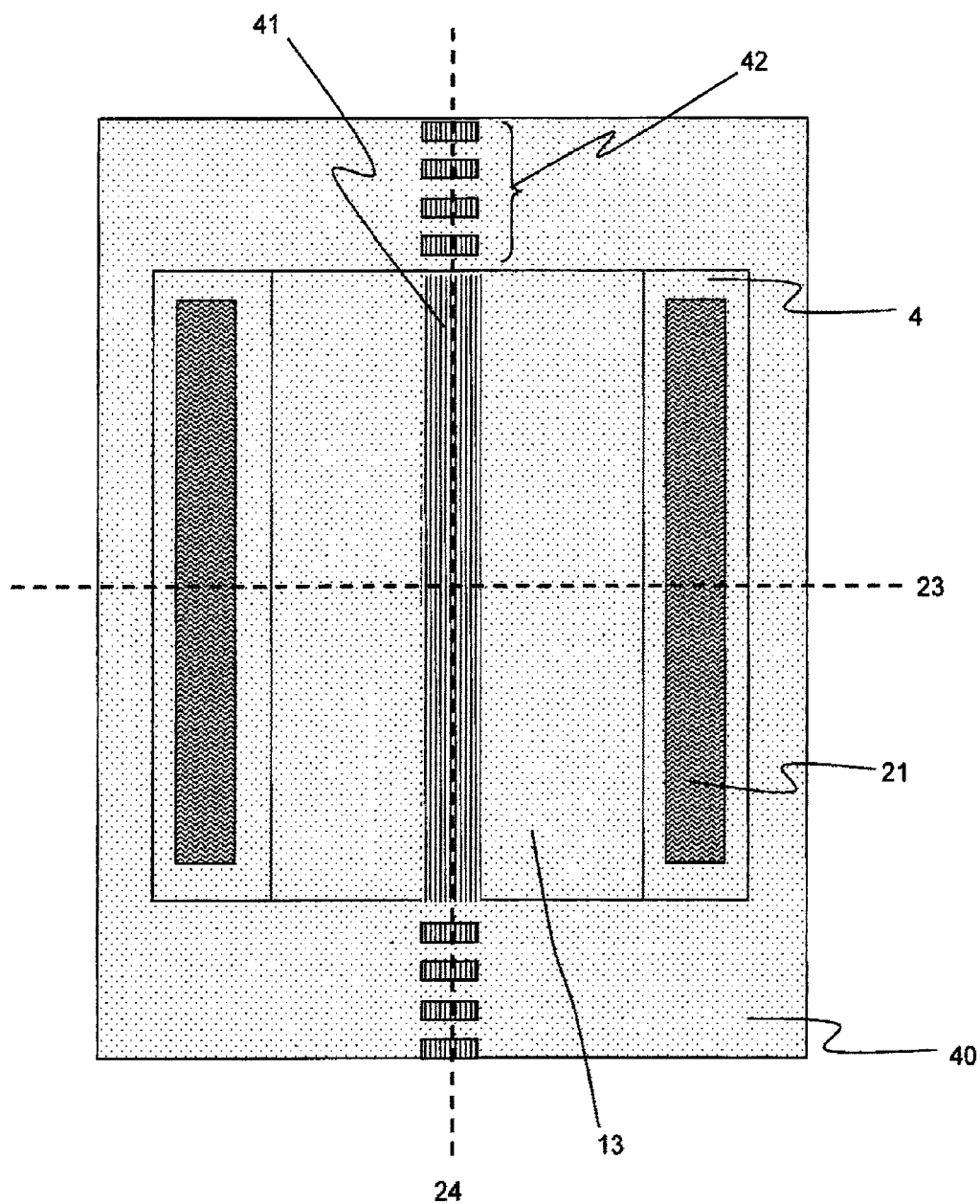
FIG. 8K is a view showing the completed germanium laser diode according to the third embodiment of the present invention seen from above.
Figure 9K:
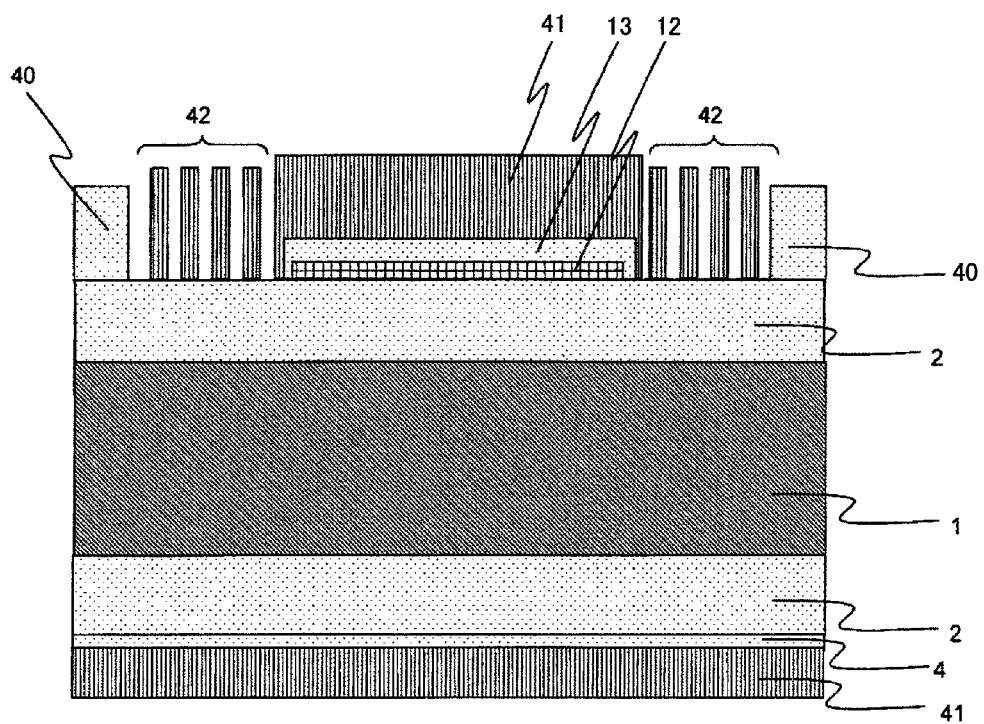
FIG. 9K is a sectional view showing the completed germanium laser diode according to the third embodiment of the present invention.

FIG. 7A to FIG. 7K each depicts a sectional structure in the order of a manufacturing process. Also, FIG. 8K depicts a drawing of a completed device viewed from above the substrate. Here, FIG. 7A to FIG. 7K each depicts a structure taken along a cutting-plane line 23 in FIG. 8K. Furthermore, FIG. 9K depicts a sectional structure taken along a cutting-plane line 24 in FIG. 8K. The cutting-plane lines 23 and 24 are orthogonal to each other in the same plane, the cutting-plane line 23 extends in an X direction in the drawing, and the cutting-plane line 24 extends in a Y direction in the drawing. The drawings of a completed device in the present embodiment are FIG. 7K, FIG. 8K and FIG. 9K.

The manufacturing process will be sequentially described below. First, as depicted in FIG. 7A, an SOI substrate in which a silicon substrate 1 as a support substrate, a silicon dioxide film 2 as a buried oxide film (BOX layer) and a silicon film 3 as a semiconductor layer are stacked is prepared. The silicon film 3 in the test production of the present embodiment before being processed has an initial film thickness of 200 nm. Also, the silicon dioxide film 2 has a film thickness of 2000 nm. The silicon dioxide film 2 is formed also on a back surface side of the silicon substrate 1. Here, after the SOI substrate is cleaned, a silicon-germanium film 11 made of 80% silicon and 20% germanium is epitaxially grown on the entire surface of the silicon film 3 so as to have a film thickness of 50 nm. Since the film thickness of the grown silicon-germanium film 11 is equal to or smaller than a critical thickness, no crystal defect or dislocation is created.

Figure 7B:
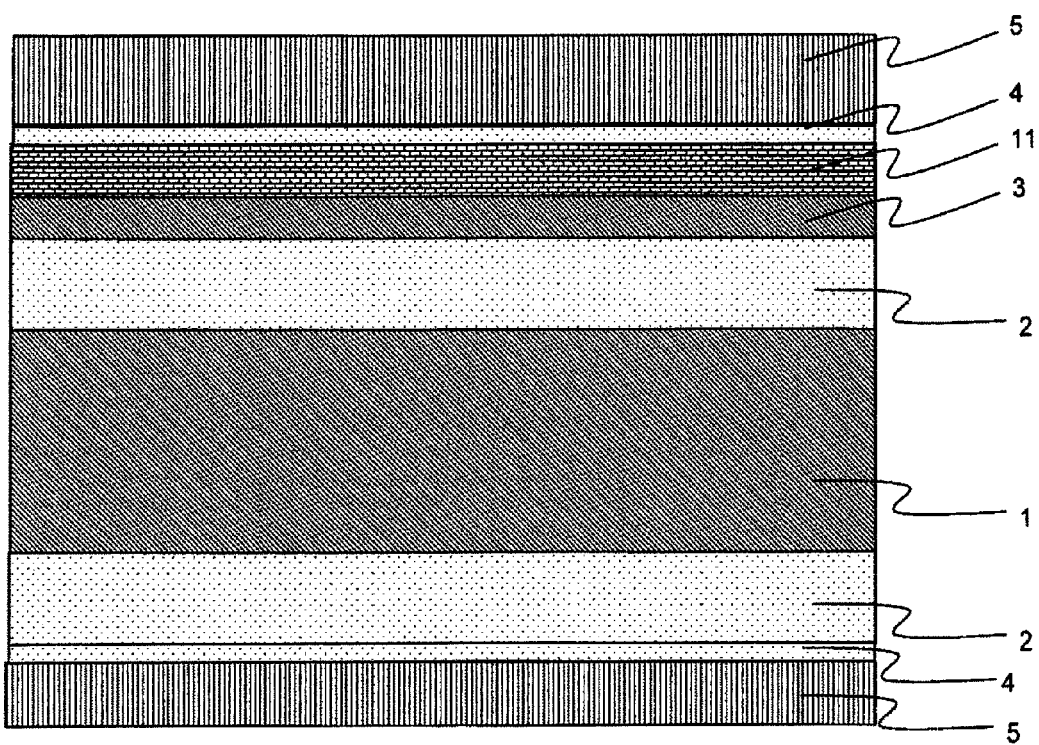
FIG. 7B is a sectional view showing the manufacturing process of the germanium laser diode according to the third embodiment of the present invention.

Next, after a cleaning process is performed, in order to protect the surface, a silicon dioxide film 4 having a thickness of approximately 30 nm is formed on the surface by a CVD method, and then a silicon nitride film 5 is deposited on the entire surface so as to have a thickness of 100 nm, thereby obtaining the state depicted in FIG. 7B.

Figure 7C:
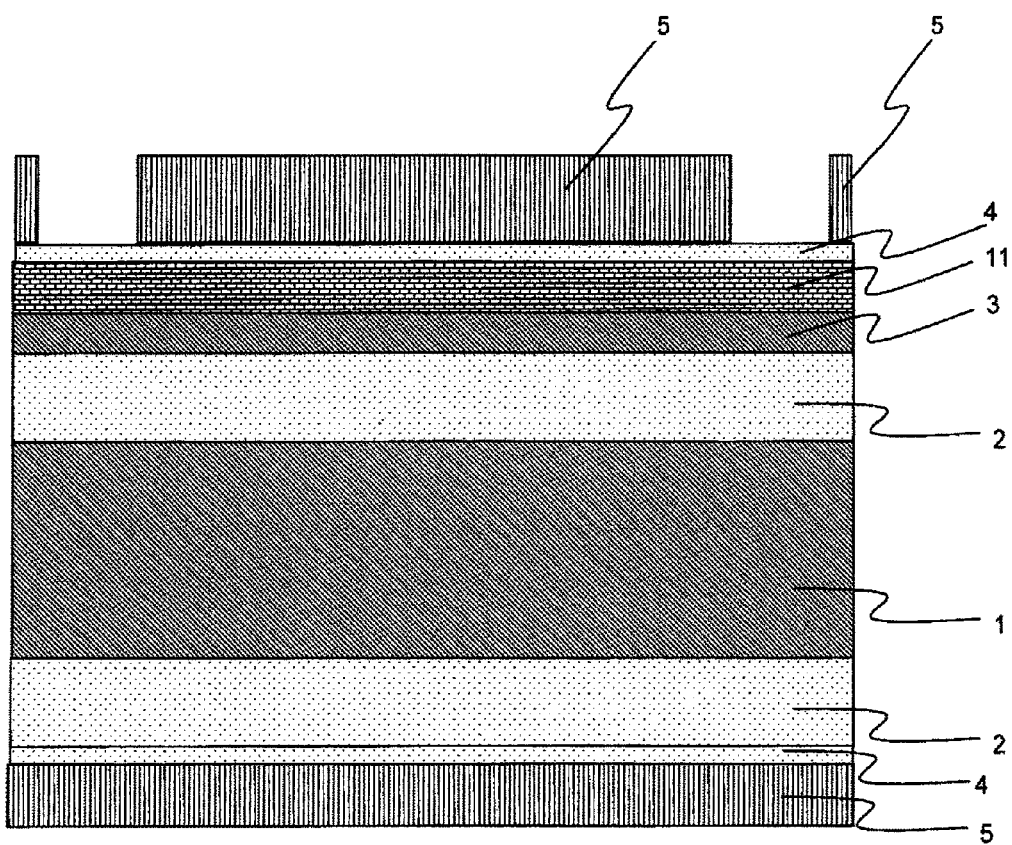
FIG. 7C is a sectional view showing the manufacturing process of the germanium laser diode according to the third embodiment of the present invention.
Figure 7D:
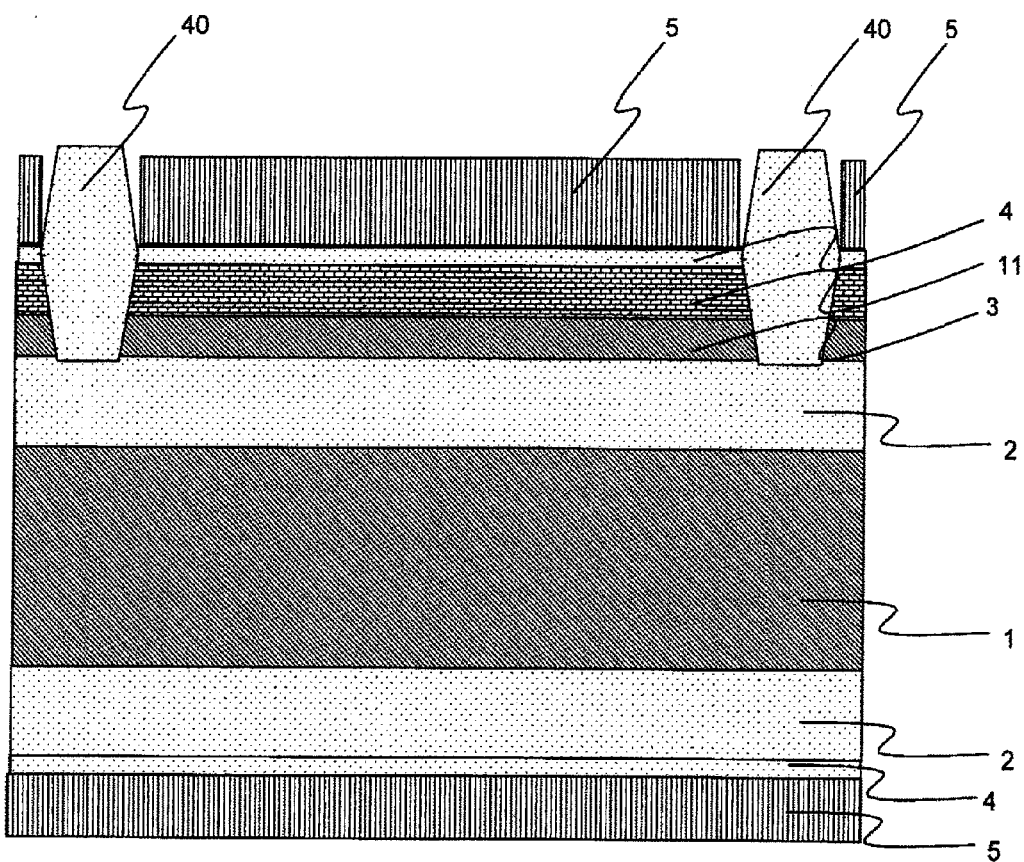
FIG. 7D is a sectional view showing the manufacturing process of the germanium laser diode according to the third embodiment of the present invention.

Next, after the resist is left only in a desired region by resist patterning using photolithography, the silicon nitride film 5 is processed by using anisotropic dry etching, thereby obtaining the state depicted in FIG. 7C.

Next, by a cleaning process and wet etching using hydrofluoric acid, the silicon dioxide film 4 existing in an opening on the front surface is removed. Then, the silicon-germanium film 11 existing in the opening is locally oxidized by an oxidizing process to form a strain-applying insulator 40, thereby obtaining the state depicted in FIG. 7D. By this thermal oxidizing treatment, the silicon-germanium film 11 is expanded to have an approximately doubled volume to become the strain-applying insulator 40. Therefore, the silicon film 3 and the silicon-germanium film 11 receive a large compressive stress in a horizontal direction along a planar direction of the silicon substrate. Since this is equivalent to applying tensile strain in a direction vertical to an interface (vertical direction orthogonal to a planar direction of the silicon substrate 1, in other words, thickness direction of the silicon substrate 1), the lattice constant is increased in a direction vertical to the interface. This stress functions as converting germanium to direct transition. In place of forming the strain-applying insulator 40 by an oxidizing process like in the present embodiment, a nitride film may be buried in an STI portion. In this case, tensile strain and compressive strain can both be added by adjusting the hydrogen concentration in the nitride film. The tensile strain can be applied to germanium also in a horizontal direction by applying the tensile strain, and the tensile strain can be applied in the direction vertical to the interface by applying the compressive strain. Therefore, the stress direction of the nitride film to be buried in STI can be either a compressive direction or a tensile direction.

Figure 7E:
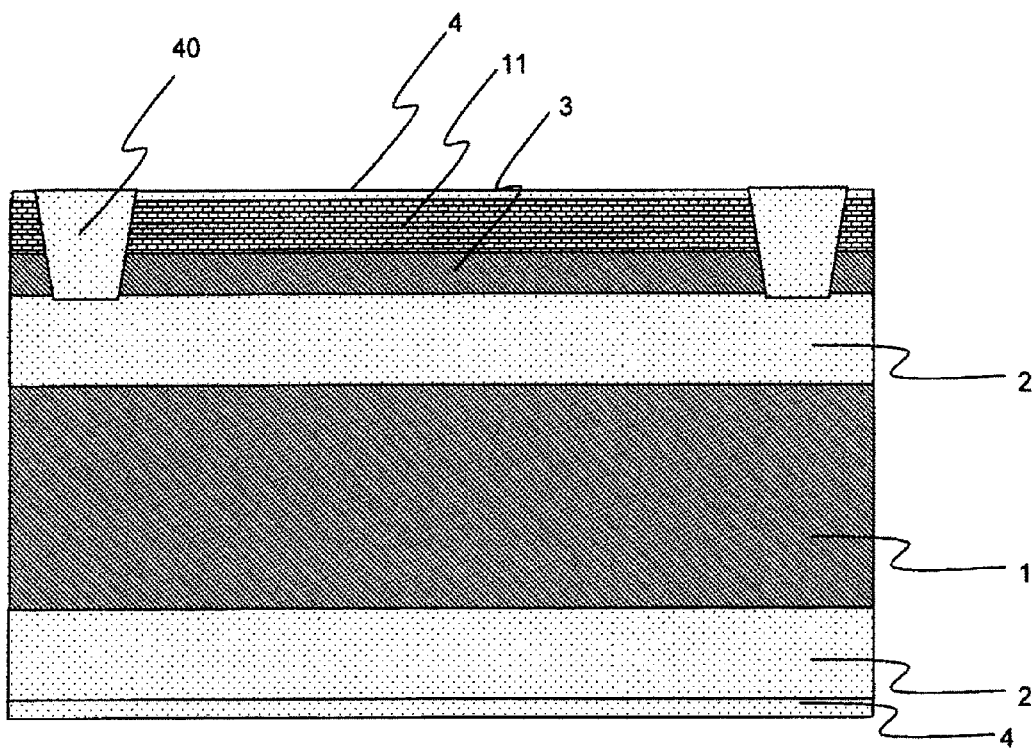
FIG. 7E is a sectional view showing the manufacturing process of the germanium laser diode according to the third embodiment of the present invention.

Next, after the surface is planarized by chemical mechanical polishing (abbreviated as CMP), a cleaning process is performed, thereby obtaining the state depicted in FIG. 7E.

Figure 7F:
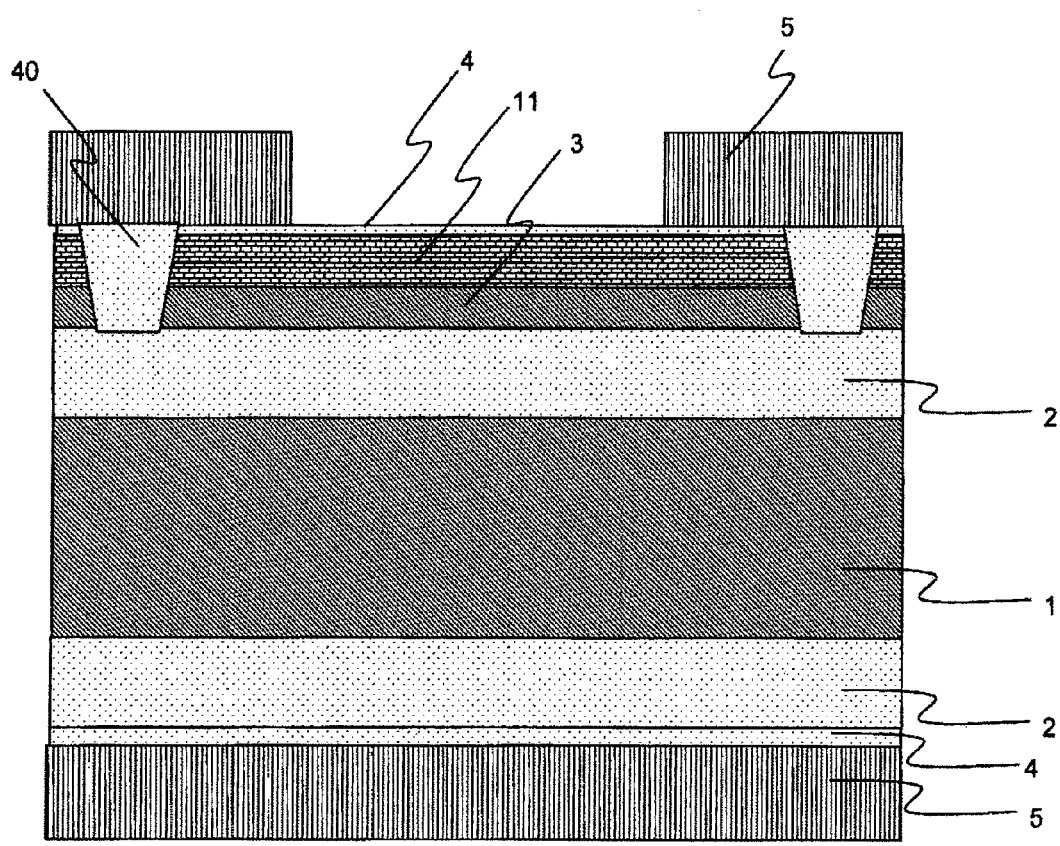
FIG. 7F is a sectional view showing the manufacturing process of the germanium laser diode according to the third embodiment of the present invention.
Figure 7G:
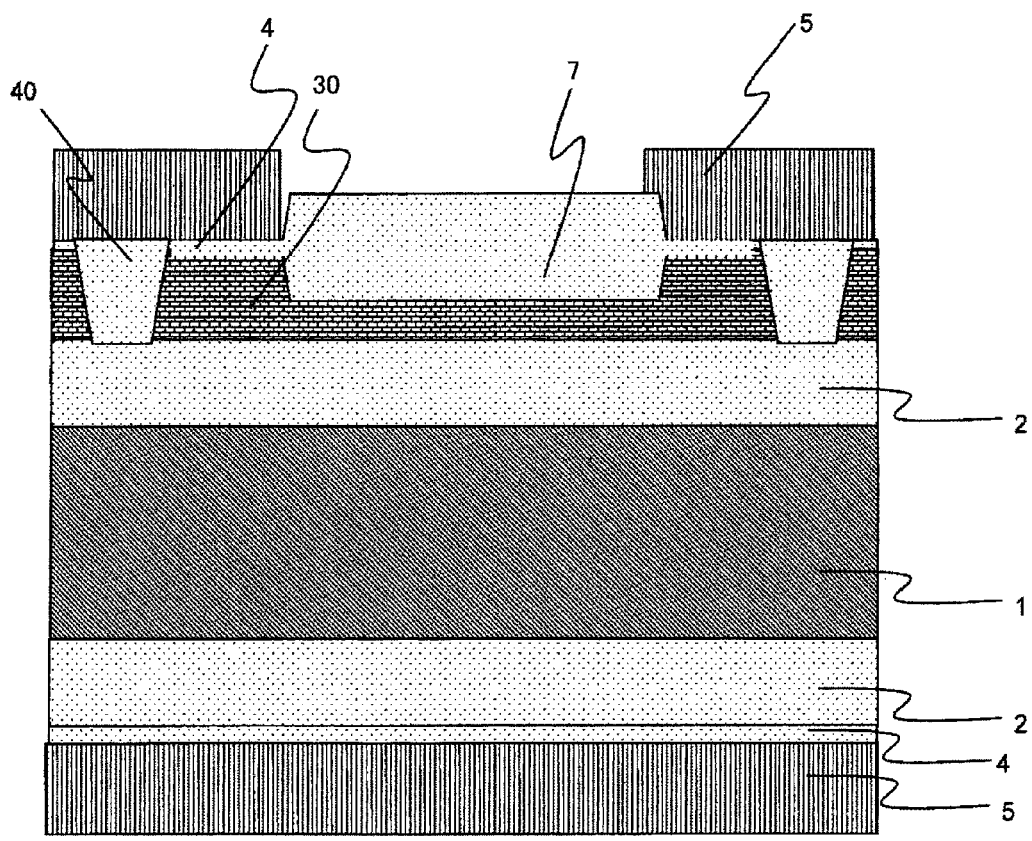
FIG. 7G is a sectional view showing the manufacturing process of the germanium laser diode according to the third embodiment of the present invention.
Figure 7H:
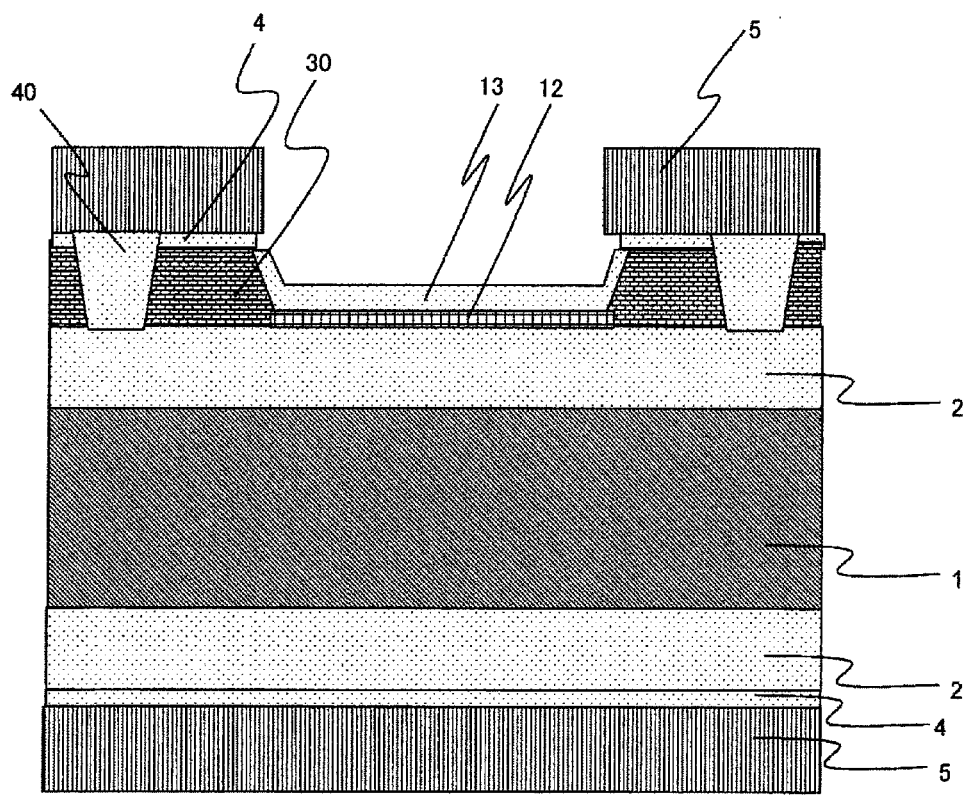
FIG. 7H is a sectional view showing the manufacturing process of the germanium laser diode according to the third embodiment of the present invention.

Next, after the silicon nitride film 5 is again deposited on the entire surface so as to have a thickness of 100 nm, a resist is left only in a desired region by resist patterning using photolithography, and the silicon nitride film 5 is then processed by using anisotropic dry etching, thereby obtaining the state depicted in FIG. 7F.

Next, by a cleaning process and wet etching using hydrofluoric acid, the silicon dioxide film 4 existing in an opening on the front surface is removed. Then, the silicon-germanium film 11 existing in the opening is locally oxidized by an oxidizing process to form a thermal oxidation film 7. Simultaneously, germanium in the silicon-germanium film 11 is diffused by this thermal treatment to the silicon film 3 to form a silicon-germanium film 30, thereby obtaining the state depicted in FIG. 7G. At this time, the oxidized film thickness of the thermal oxidation film 7 is adjusted to be approximately 460 nm. As a result, 20 nm of the film thickness of the silicon-germanium film 30 in the opening is left.

Subsequently, the thermal oxidation film 7 on the surface is removed by wet etching using hydrofluoric acid. Then, by performing an oxidizing process, silicon present in the silicon-germanium film 30 at the opening is selectively oxidized, and an oxidizing process is performed so that the thermal oxidation film 13 made of silicon dioxide has a film thickness of about 20 nm, thereby obtaining the state depicted in FIG. 7H in which a condensed ultra-thin single-crystal germanium film 12 having a thickness of 10 nm is formed.

Next, by a cleaning process and wet etching using hot phosphoric acid, the silicon nitride film 5 is removed. Subsequently, impurities are put into a desired region in the silicon-germanium film 30 by ion implantation. At this time, the ion implantation is controlled so that almost no impurity is implanted into the ultra-thin single-crystal germanium film 12. In the impurity implantation, after the resist is first left only in a desired region by the resist patterning using photolithography, $BF_2$ ions are ion-implanted with a dose amount of $1 \times 10^{15}$ [$1/cm^2$], thereby forming a p-type diffusion layer electrode 31 as an anode electrode in the silicon-germanium film 30.

Subsequently, after the resist is removed, a resist is again left only in a desired region by the resist patterning using photolithography. Then, P ions are ion-implanted with a dose amount of $1 \times 10^{15}$ [$1/cm^2$], thereby forming an n-type diffusion layer electrode 32 as a cathode electrode in the silicon-germanium film 30.

Figure 7I:
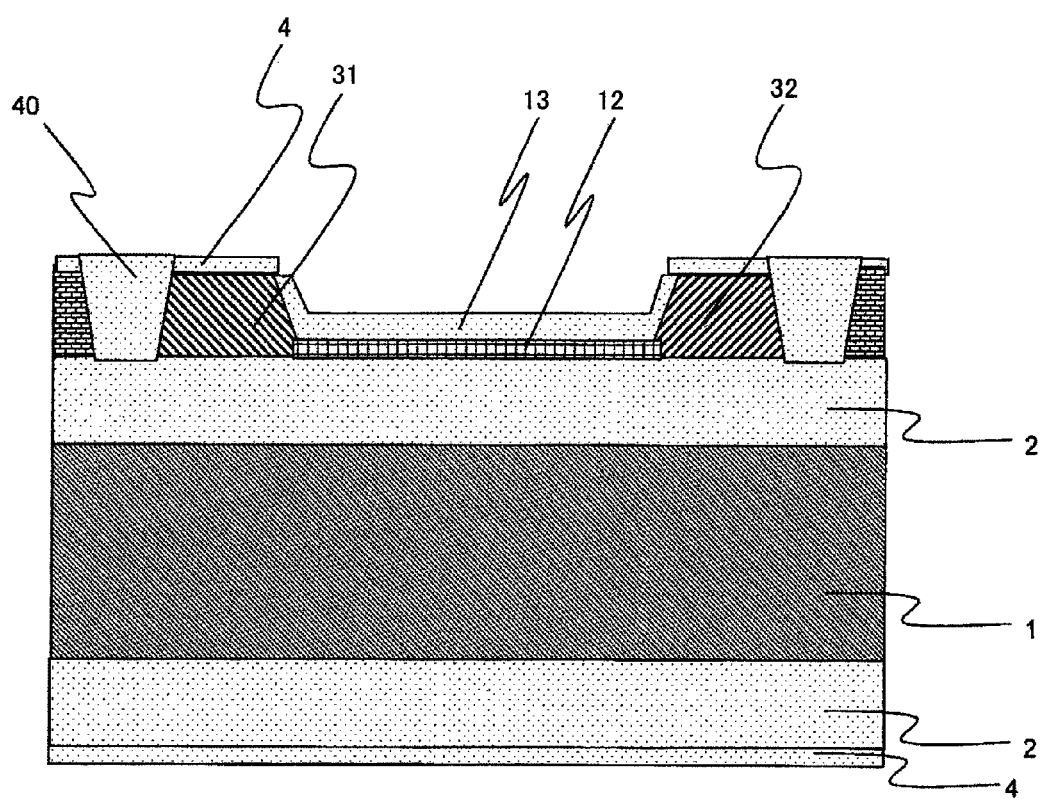
FIG. 7I is a sectional view showing the manufacturing process of the germanium laser diode according to the third embodiment of the present invention.
Figure 7J:
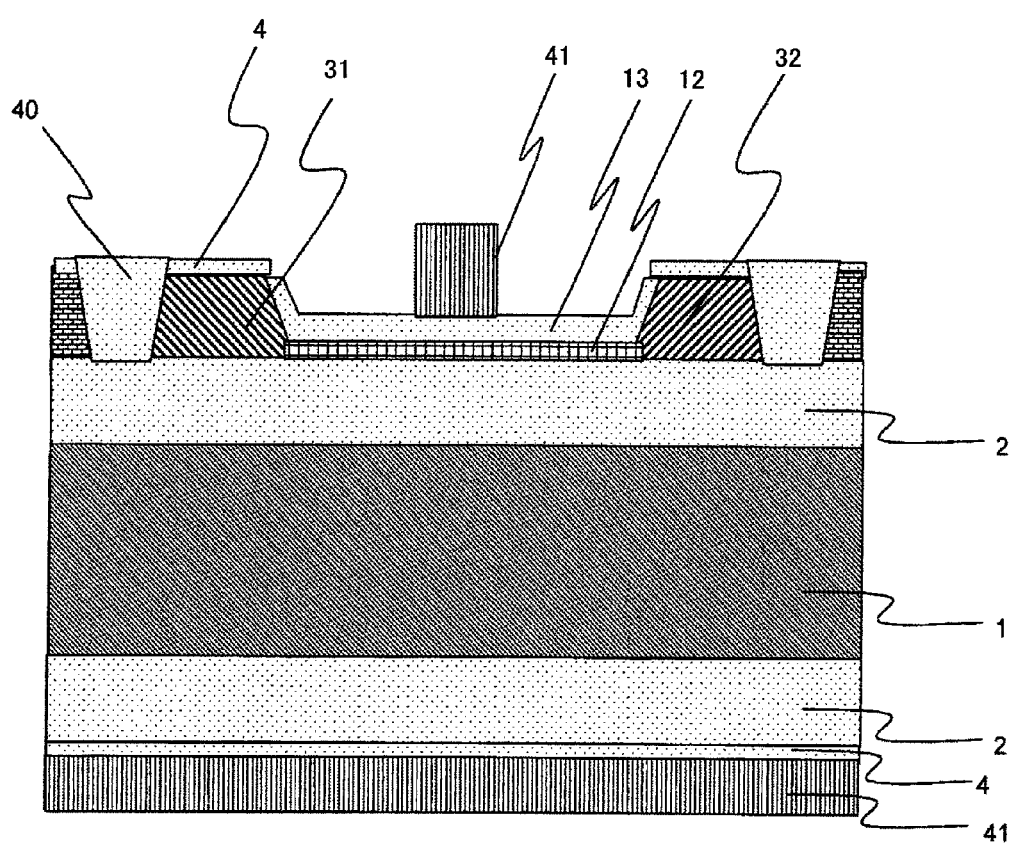
FIG. 7J is a sectional view showing the manufacturing process of the germanium laser diode according to the third embodiment of the present invention.

Subsequently, by performing an annealing process in a nitrogen atmosphere at 900° C. for twenty minutes, the impurities are activated and simultaneously crystallinity of the silicon-germanium film 30 is recovered, thereby obtaining the state depicted in FIG. 7I.

Next, after a silicon nitride film is deposited on the entire surface, the resist is left only in a desired region by resist patterning using photolithography. Then, the silicon nitride film is patterned by using anisotropic dry etching to form a silicon nitride waveguide 41, thereby obtaining the state depicted in FIG. 7J. Simultaneously, silicon-nitride DBR mirrors 42 depicted in FIG. 8K are formed. The DBR mirrors 42 are dielectric mirrors each configured from a difference in refractive index among silicon nitride, air and its surrounding insulating film, and can achieve a reflectance as high as 99.9% or higher. In designing the DBR mirror 42, the width of each of the small pieces of the silicon film 3 and an interval therebetween are important parameters, and these are designed to be approximately one fourth of a luminous wavelength in a medium. Also, only four small pieces of the silicon film 3 are drawn in each of the DBR mirrors 42 in FIG. 8K. However, the actual number of small pieces of the silicon film in the test production is 100. Here, since light is confined in the silicon nitride waveguide 41, the design is made so that light is prevented from being absorbed in free carriers existing in the p-type diffusion layer electrode 31 and the n-type diffusion layer electrode 32. Also, since a thermal oxidation film 13 made of silicon dioxide is formed between the silicon nitride waveguide 41 and the ultra-thin single-crystal germanium film 12, they are physically separated from each other. However, since the film thickness of the thermal oxidation film 13 is only 20 nm, light confined in the silicon nitride waveguide 41 can sufficiently leak into the inside of the thermal oxidation film 13 and the ultra-thin single-crystal germanium film 12. With the evanescent coupling described above, the germanium laser diode of the present embodiment can perform laser oscillation. Also, since the film thickness of the ultra-thin single-crystal germanium film 12 is designed to be 10 nm, the carrier density can be increased without causing the quantum confinement effect and increasing parasitic resistance. As a result, the population inversion indispensable for laser oscillation can be formed. In the present embodiment, silicon nitride is used as a waveguide, but dielectric materials having a refractive index larger than that of silicon dioxide such as polycrystalline silicon, amorphous silicon, SiON, $Al_2O_3$, $Ta_2O_5$, $HfO_2$ and $TiO_2$ can be used other than silicon nitride. Note that, when polycrystalline silicon is used, non-doped one is preferable in order to prevent absorption of free carriers.

Subsequently, after a TiN film and an Al film are deposited on the entire surface, a resist is left only in a desired region by resist patterning using photolithography. Thereafter, the Al film is wet-etched by using an etching solution containing phosphoric acid, acetic acid and nitric acid, and then the TiN film is wet-etched by using an etching solution containing ammonia and hydrogen peroxide. As a result, a TiN electrode 20 and an Al electrode 21 are formed by patterning.

Figure 7K:
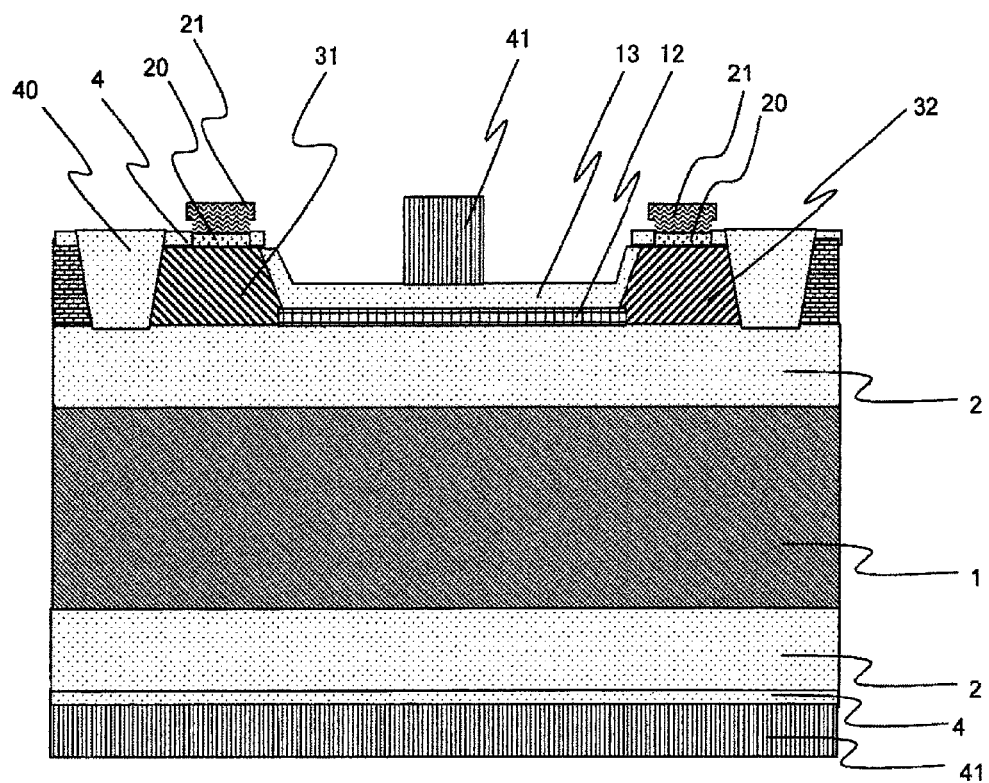
FIG. 7K is a sectional view showing the completed germanium laser diode according to the third embodiment of the present invention.

Subsequently, a hydrogen annealing process is performed at a temperature of 400° C. to perform the treatment for hydrogen-terminating the defects created during the process, thereby obtaining the state of FIG. 7K, FIG. 8K and FIG. 9K, and the device is completed.

The created germanium laser diode oscillates with a designed wavelength of approximately 1500 nm, and is of a single mode according to the spectrum analysis thereof.

Fourth Embodiment

In the present embodiment, a lateral germanium photodiode formed on an SOI substrate by silicon process, using germanium with an extremely high degree of crystallinity and a film thickness large enough to detect light, capable of high-speed operation and having a small dark current and a method of manufacturing the lateral germanium photodiode will be disclosed. The lateral germanium photodiode has an advantage of being readily used for optical wiring in a chip.

FIG. 10A to FIG. 10H each depicts a sectional structure in the order of a manufacturing process. Also, FIG. 11H depicts a drawing of a completed device viewed from above the substrate. Here, FIG. 10A to FIG. 10H each depicts a structure taken along a cutting-plane line 23 in FIG. 11H. Furthermore, FIG. 11F to FIG. 11H each depicts a drawing viewed from above the substrate corresponding to FIG. 10F to FIG. 10H, respectively. In addition, FIG. 12F to FIG. 12H each depicts a sectional structure taken along a cutting-plane line 24 in FIG. 11H. The cutting-plane lines 23 and 24 are orthogonal to each other in the same plane, the cutting-plane line 23 extends in an X direction in the drawing, and the cutting-plane line 24 extends in a Y direction in the drawing. The drawings of a completed device in the present embodiment are FIG. 10H, FIG. 11H and FIG. 12H.

The manufacturing process will be sequentially described below.

Figure 10A:
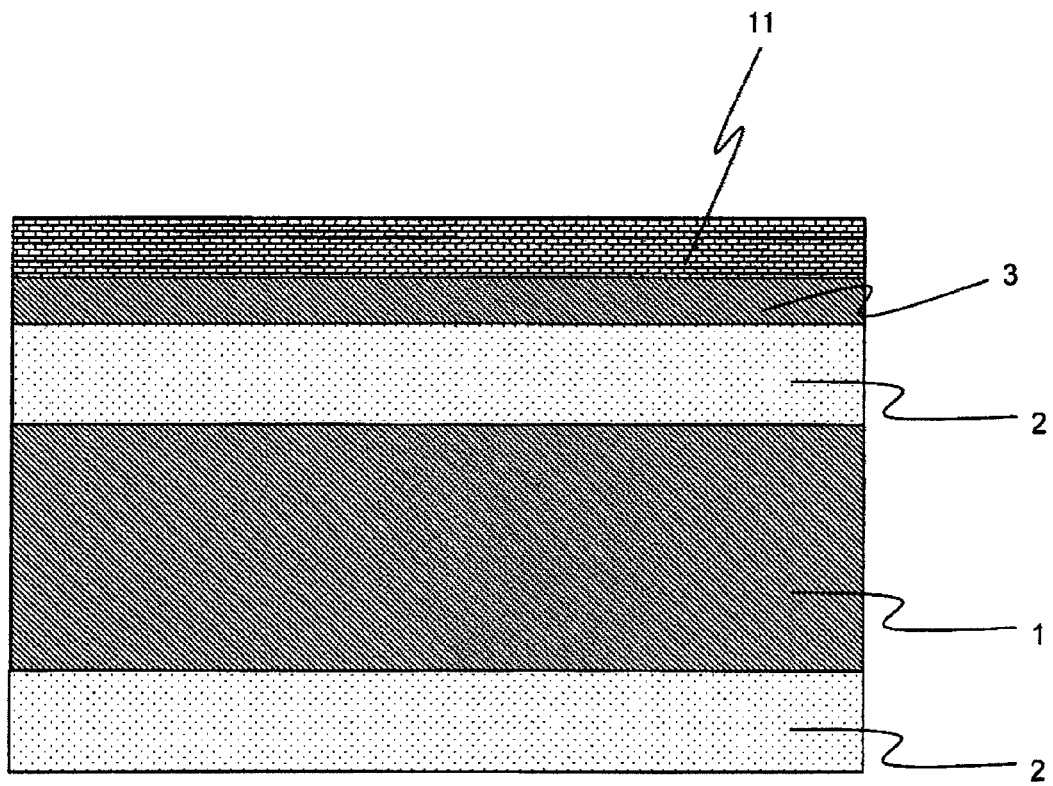

First, as depicted in FIG. 10A, an SOI substrate in which a silicon substrate 1 as a support substrate, a silicon dioxide film 2 as a buried oxide film (BOX layer) and a silicon film 3 as a semiconductor layer are stacked is prepared. The silicon film 3 in the test production of the present embodiment before being processed has an initial film thickness of 200 nm. Also, the silicon dioxide film 2 has a film thickness of 2000 nm. The silicon dioxide film 2 is formed also on a back surface side of the silicon substrate 1.

Here, after the SOI substrate is cleaned, a silicon-germanium film 11 made of 80% silicon and 20% germanium is epitaxially grown on the entire surface of the silicon film 3 so as to have a film thickness of 50 nm. Since the film thickness of the grown silicon-germanium film 11 is equal to or smaller than a critical thickness, no crystal defect or dislocation is created.

Figure 10B:
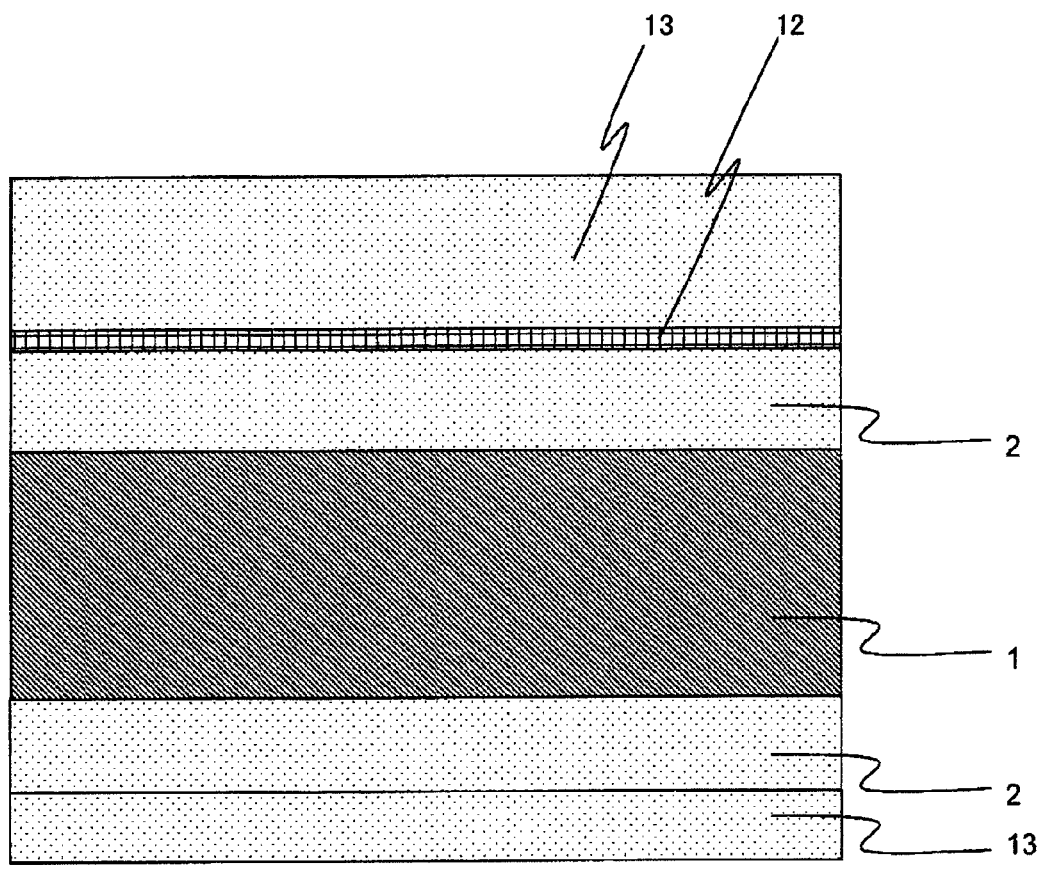

Next, by performing an oxidizing process on the entire surface, silicon present in the silicon-germanium film 11 is selectively oxidized, and an oxidizing process is performed so that a thermal oxidation film 13 made of silicon dioxide has a film thickness of 480 nm, thereby obtaining the state depicted in FIG. 10B in which a condensed ultra-thin single-crystal germanium film 12 having a thickness of 10 nm is formed. Here, the degree of purity of germanium of the ultra-thin single-crystal germanium film 12 is important. For growing a thick germanium film 14 without causing a crystal defect in the next process, the concentration of silicon contained in the ultra-thin single-crystal germanium film 12 has to be extremely decreased. For this purpose, the concentration of silicon is required to be decreased to a degree that germanium to be grown becomes equal to or smaller than a critical thickness. More specifically, it is desired that the concentration of silicon contained in the ultra-thin single-crystal germanium film 12 is approximately 10% or lower. By selectively oxidizing the silicon contained in the silicon-germanium film 11 as described in the present embodiment, the concentration of residual silicon can be easily decreased to a level of 10% or lower, and a thick single-crystal germanium film with an extremely high degree of crystallinity can be formed. Conversely, in the case of the conventional germanium light-receiving device in which germanium is crystal-grown on silicon and the concentration of residual silicon is high, the high-quality germanium crystal cannot be grown.

Figure 10C:
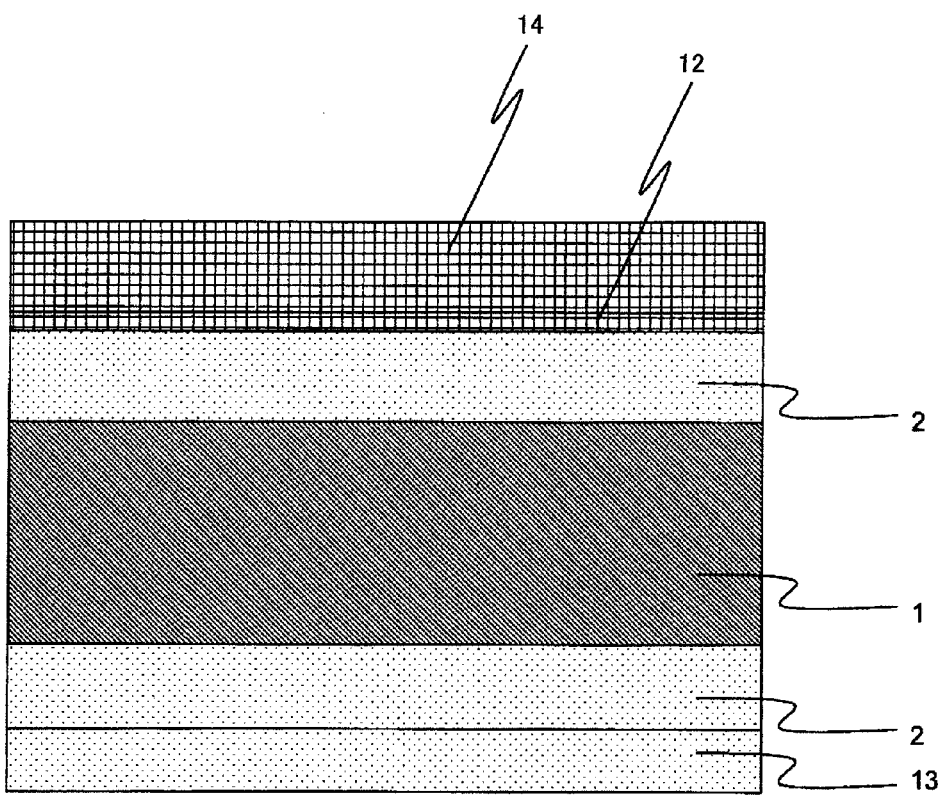

Subsequently, after the thermal oxidation film 13 is removed by wet etching, the surface is cleaned by a cleaning process, and then a pure germanium film 14 is epitaxially grown so as to have a film thickness of 500 nm, thereby obtaining the state of FIG. 10C. In this crystal growth, the interface characteristics between the ultra-thin single-crystal germanium film 12 and the germanium film 14 are excellent, and no crystal defect or dislocation is created.

Figure 10D:
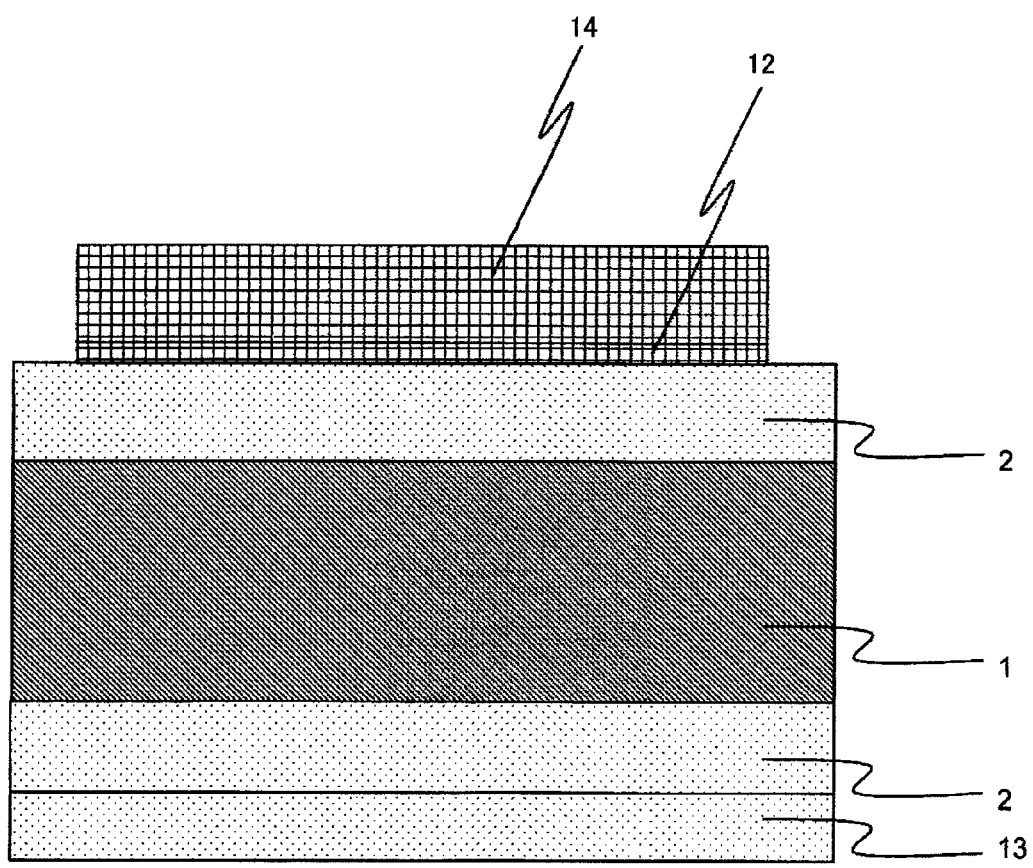

Next, after a resist is applied, the resist is left only in a desired region exposed through a mask by photolithography, and then anisotropic dry etching is performed. By this means, as depicted in FIG. 10D, the ultra-thin single-crystal germanium film 12 and the germanium film 14 are processed in a mesa shape. Although only one device is shown in each drawing for simplification, it goes without saying that many devices are simultaneously formed on the substrate. Since a silicon process is used, many devices can be integrated with high yields. With this process, electric separation among the devices can be established.

Figure 10E:
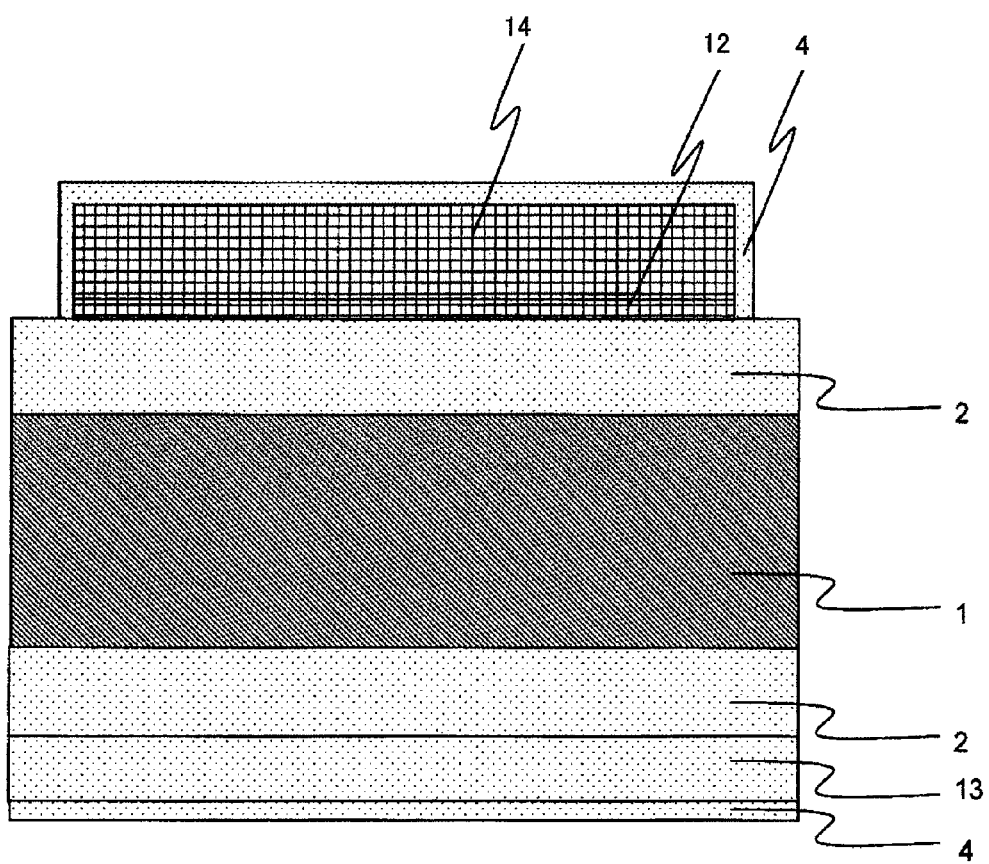

Next, after a cleaning process is performed, in order to protect the surface, a silicon dioxide film 4 having a thickness of approximately 30 nm is formed on the surface by a CVD method, thereby obtaining the state depicted in FIG. 10E.

Next, impurities are put into a desired region in the germanium film 14 by ion implantation. In the impurity implantation, after the resist is first left only in a desired region by the resist patterning using photolithography, $BF_2$ ions are ion-implanted with a dose amount of $1 \times 10^{15}$ [$1/cm^2$], thereby forming a p-type diffusion layer electrode 51 as an anode electrode in the germanium film 14.

Subsequently, after the resist is removed, a resist is again left only in a desired region by the resist patterning using photolithography. Then, P ions are ion-implanted with a dose amount of $1\times10^{15}$ [1/cm$^2$], thereby forming an n-type diffusion layer electrode 52 as a cathode electrode in the germanium film 14.

Figure 10F:
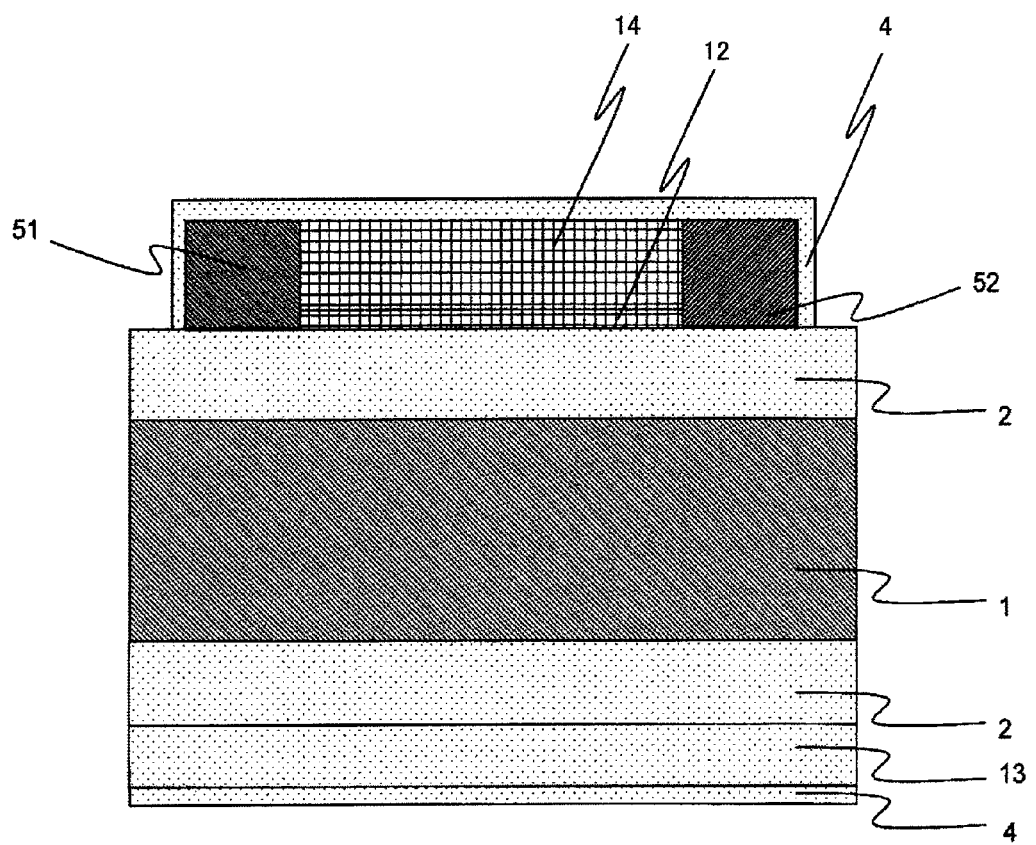
Figure 10G:
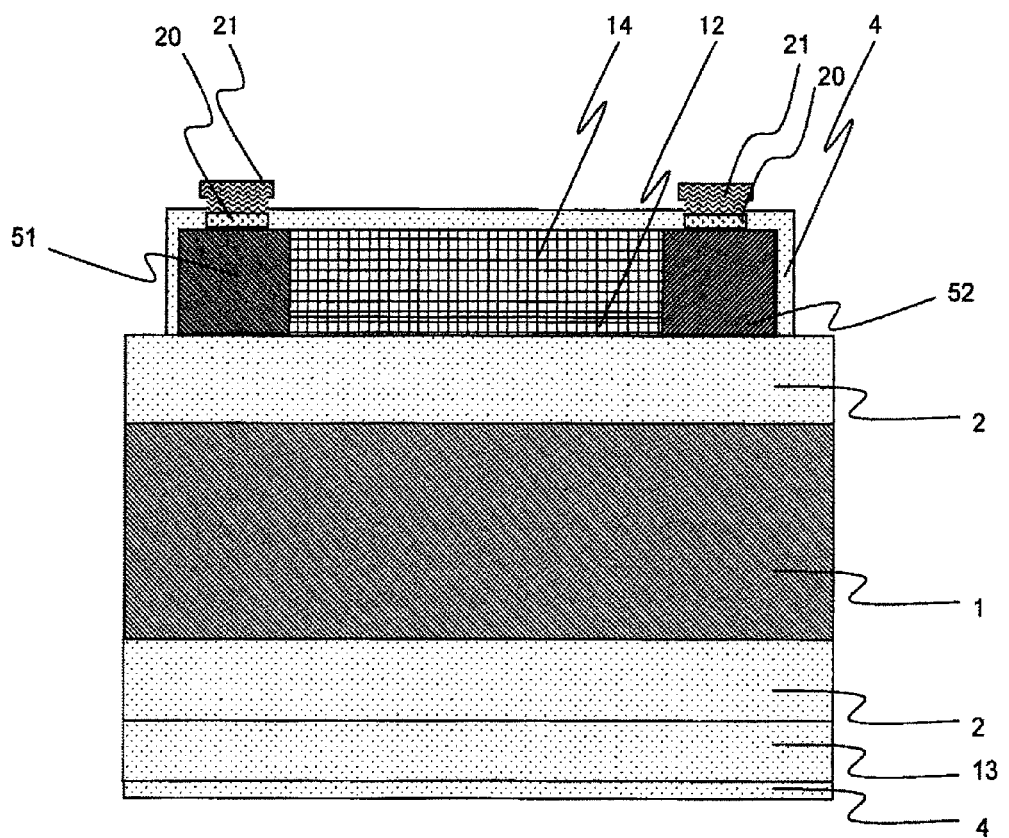
Figure 11F:
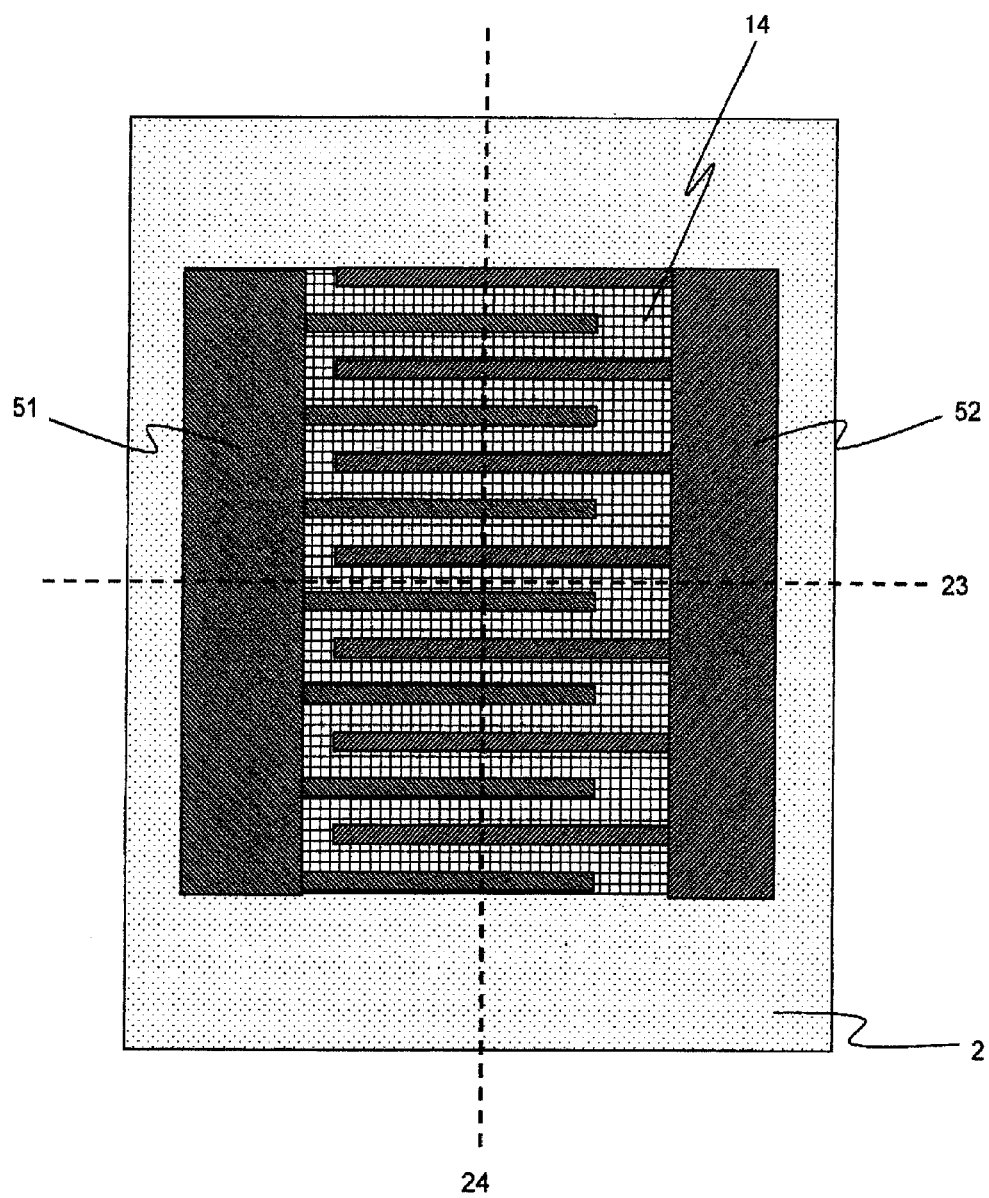
FIG. 11F is a view showing the manufacturing process of the germanium photodiode according to the fourth embodiment of the present invention seen from above.
Figure 11G:
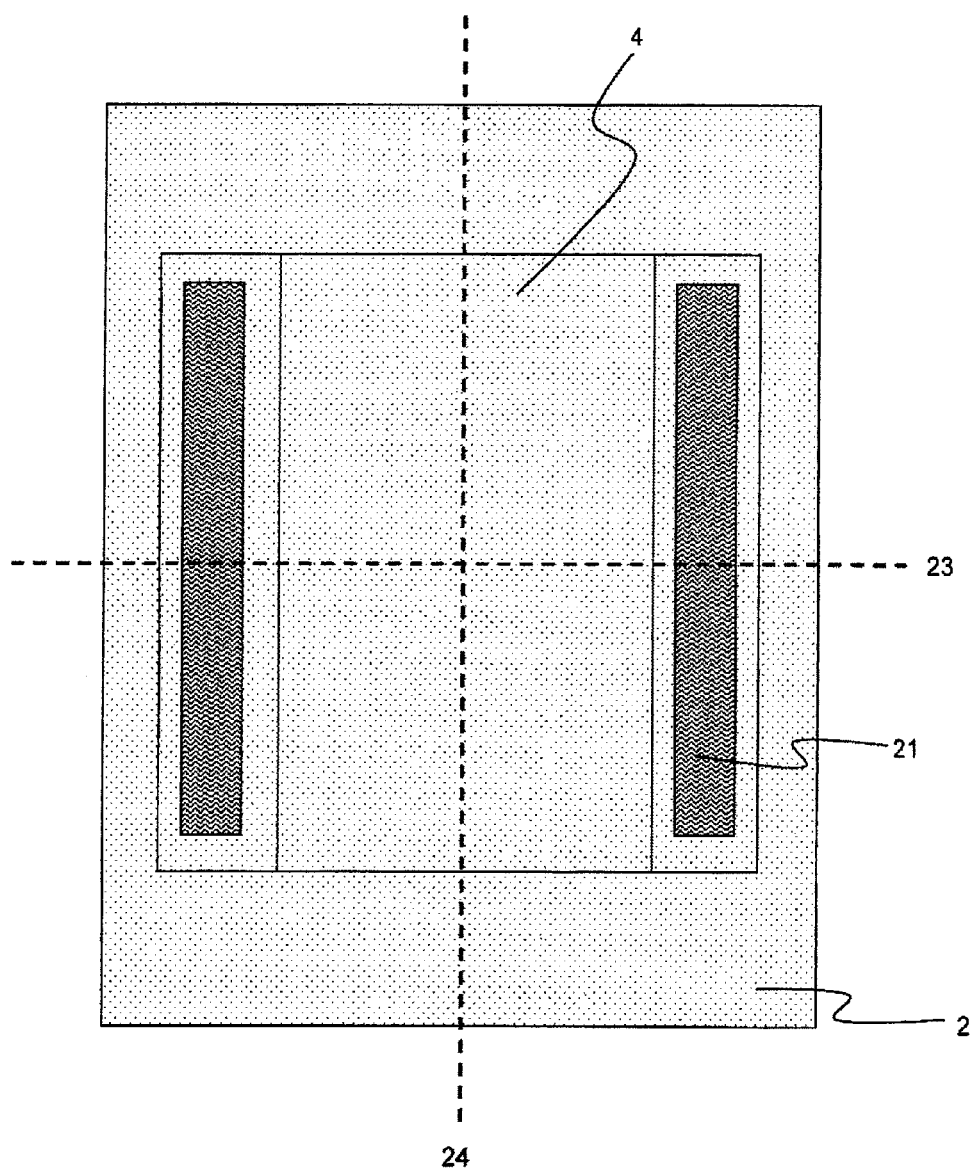
FIG. 11G is a view showing the manufacturing process of the germanium photodiode according to the fourth embodiment of the present invention seen from above.
Figure 11H:
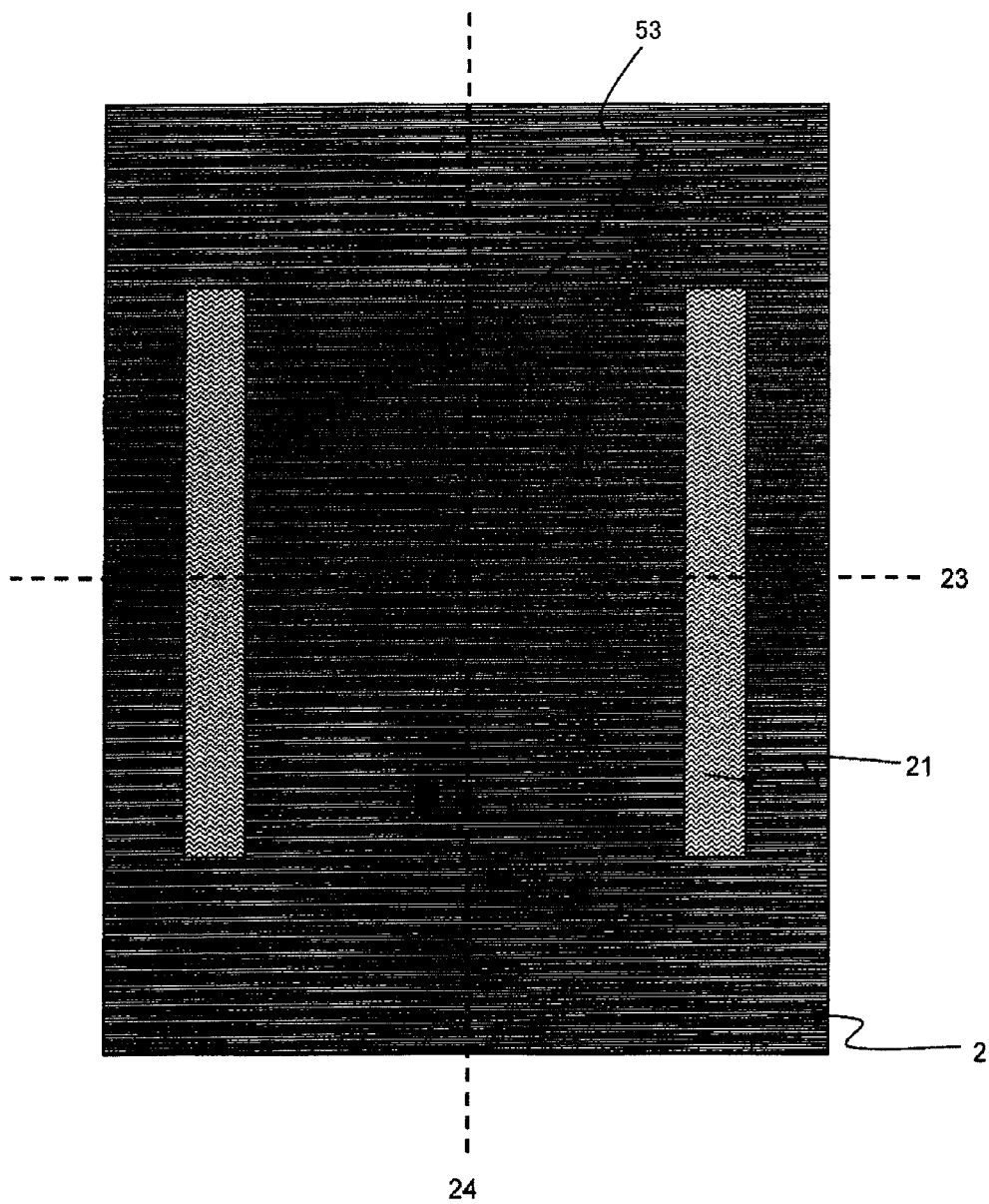
FIG. 11H is a view showing the completed germanium photodiode according to the fourth embodiment of the present invention seen from above.
Figure 12F:
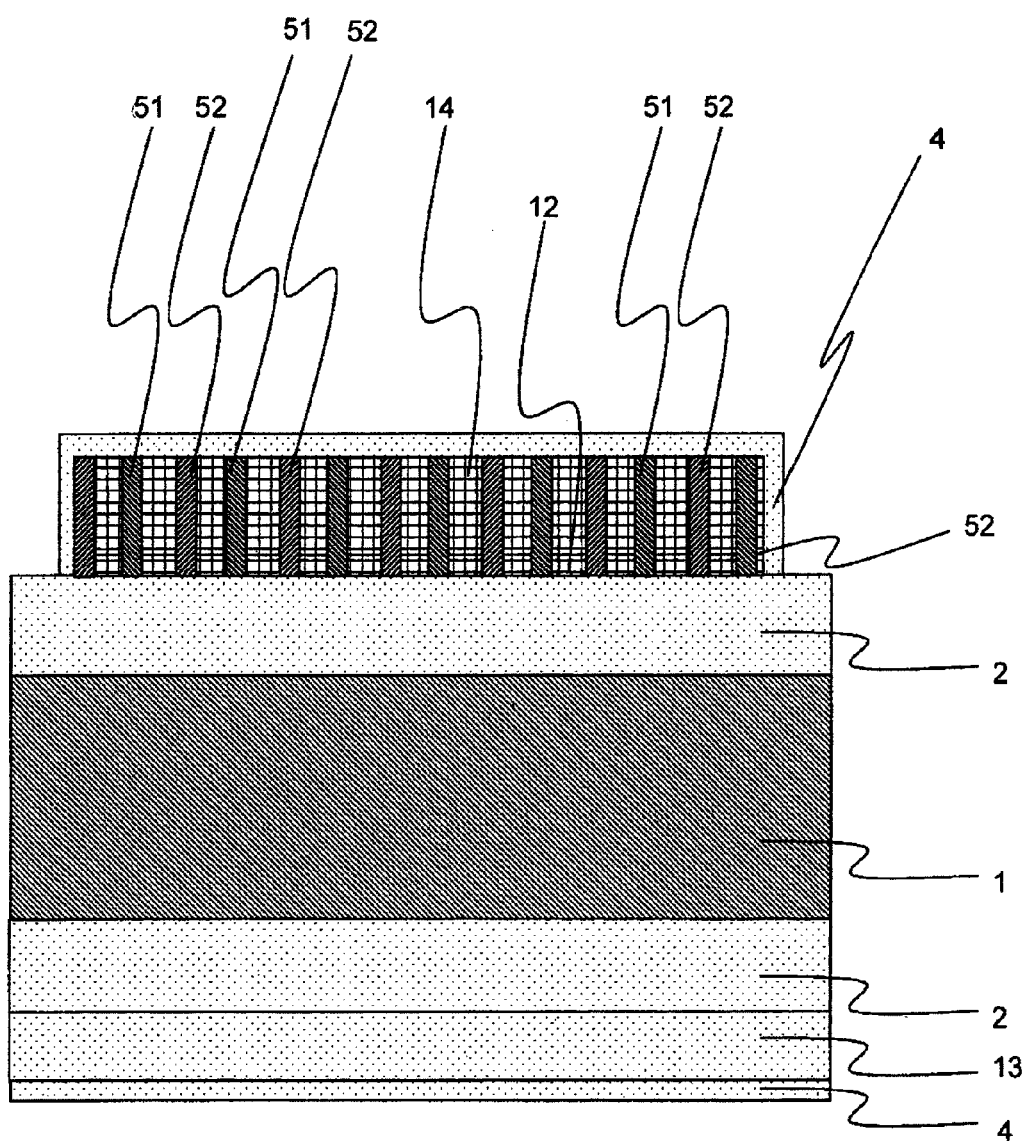
FIG. 12F is a sectional view showing the manufacturing process of the germanium photodiode according to the fourth embodiment of the present invention.
Figure 12G:
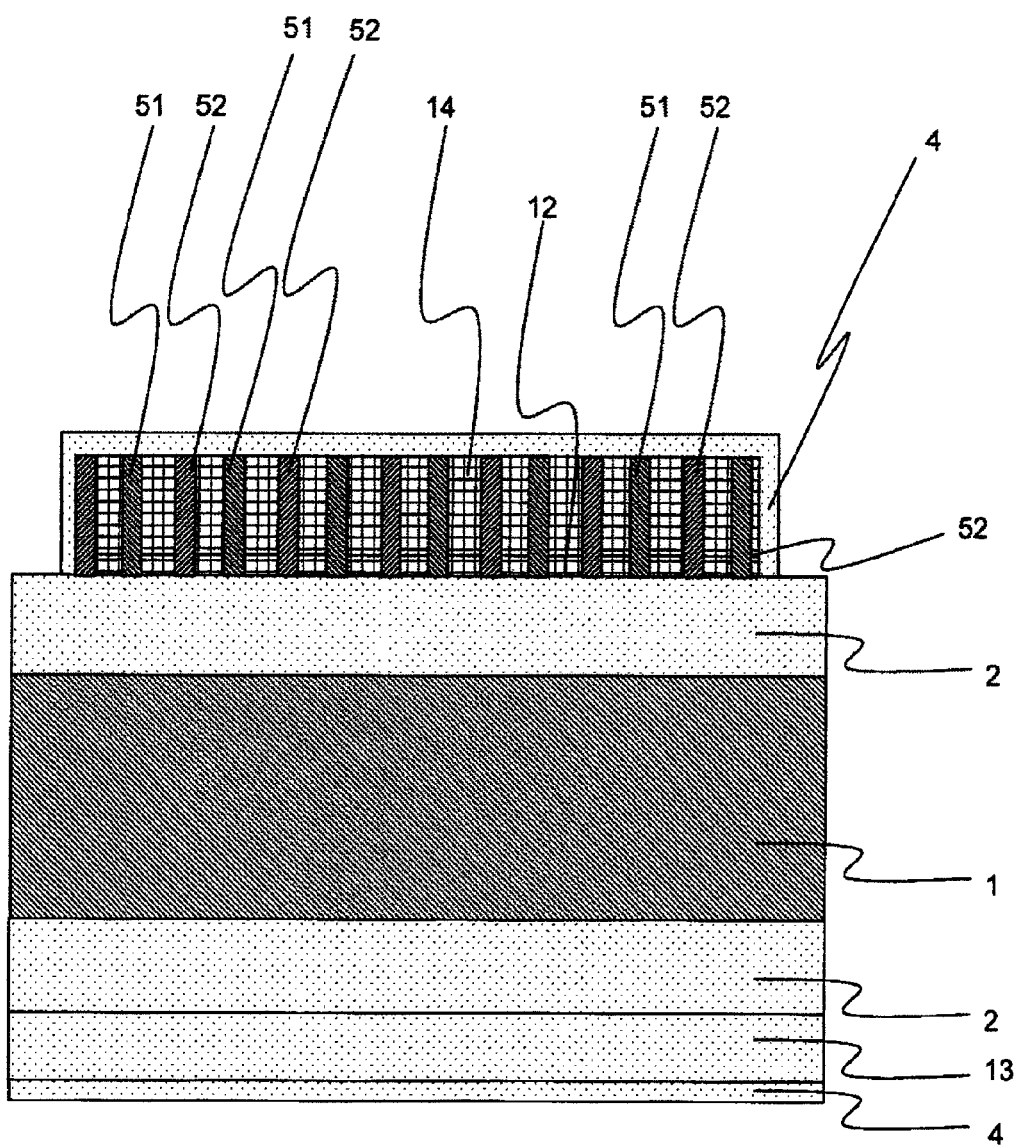
FIG. 12G is a sectional view showing the manufacturing process of the germanium photodiode according to the fourth embodiment of the present invention.

Subsequently, by performing an annealing process in a nitrogen atmosphere at 900° C. for twenty minutes, the impurities are activated and simultaneously crystallinity of the germanium film 14 is recovered, thereby obtaining the state depicted in FIG. 10F. At this time, a layout drawing viewed from above is shown in FIG. 11F, and a sectional view form another position is shown in FIG. 12F. The p-type diffusion layer electrode 51 and the n-type diffusion layer electrode 52 are disposed in a comb shape, and a minimum distance between the diffusion layers is set to 100 nm. Therefore, since the diode operates at an extremely quick response speed, the diode is extremely effective as a light-receiving device for high-speed optical communications.

Subsequently, after TiN and Al are deposited on the entire surface, a resist is left only in a desired region by resist patterning using photolithography. Thereafter, the Al is wet-etched by using an etching solution containing phosphoric acid, acetic acid and nitric acid, and then the TiN is wet-etched by using an etching solution containing ammonia and hydrogen peroxide. As a result, a TiN electrode 20 and an Al electrode 21 are formed by patterning. Subsequently, a hydrogen annealing process is performed at a temperature of 400° C. to perform the treatment for hydrogen-terminating the defects created during the process, thereby obtaining the state of FIG. 10G, FIG. 11G and FIG. 12G. It is confirmed that this structure sufficiently operates when light of a short wavelength such as a 1.3 μm band or a 840 nm band is received.

However, when light from the strain-applying germanium laser diode according to the present invention is received or when light of a 1.5 μm band used in normal optical fiber communications is received, a strain has to be applied to germanium. As a method for this purpose, subsequently to the state of FIG. 10F, a silicon nitride film 18 is deposited so as to have a thickness of 200 nm on the entire surface so that tensile strain is applied to the germanium film 14 to be a light-emitting layer in a planar direction of the silicon substrate 1 (horizontal direction).

Figure 10H:
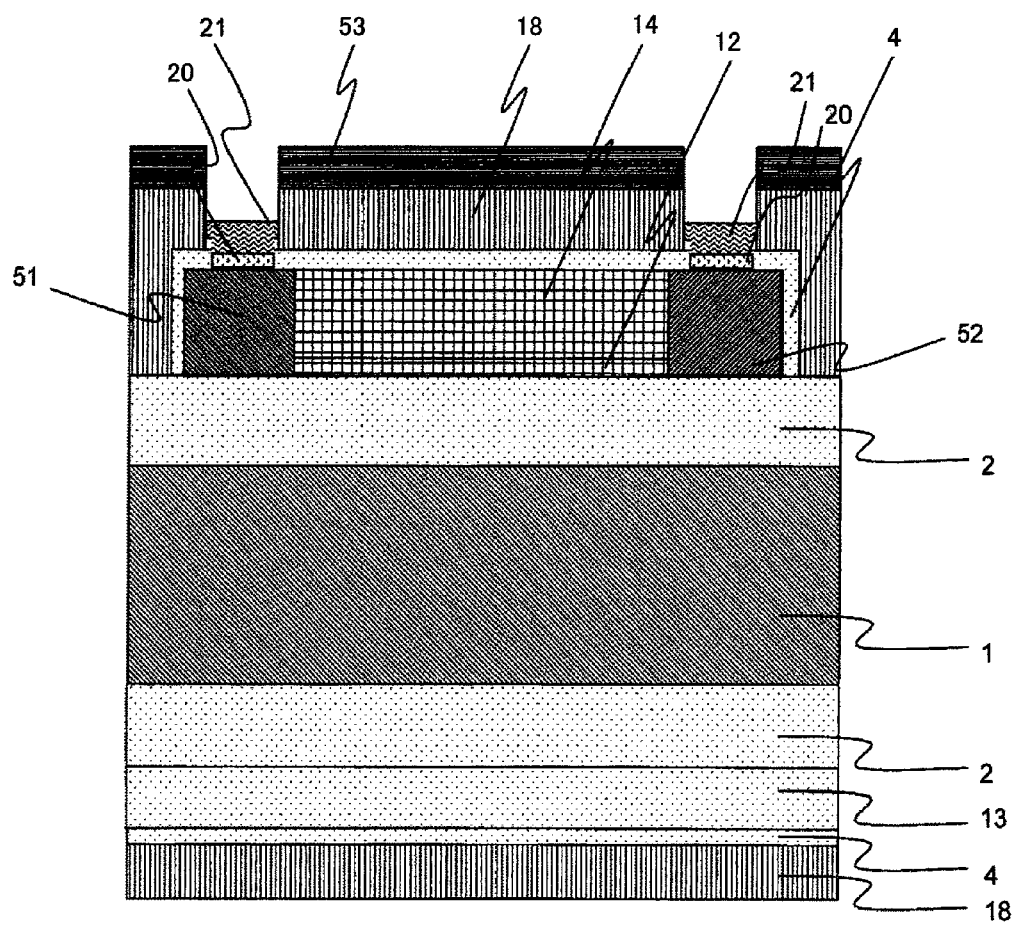
Figure 12H:
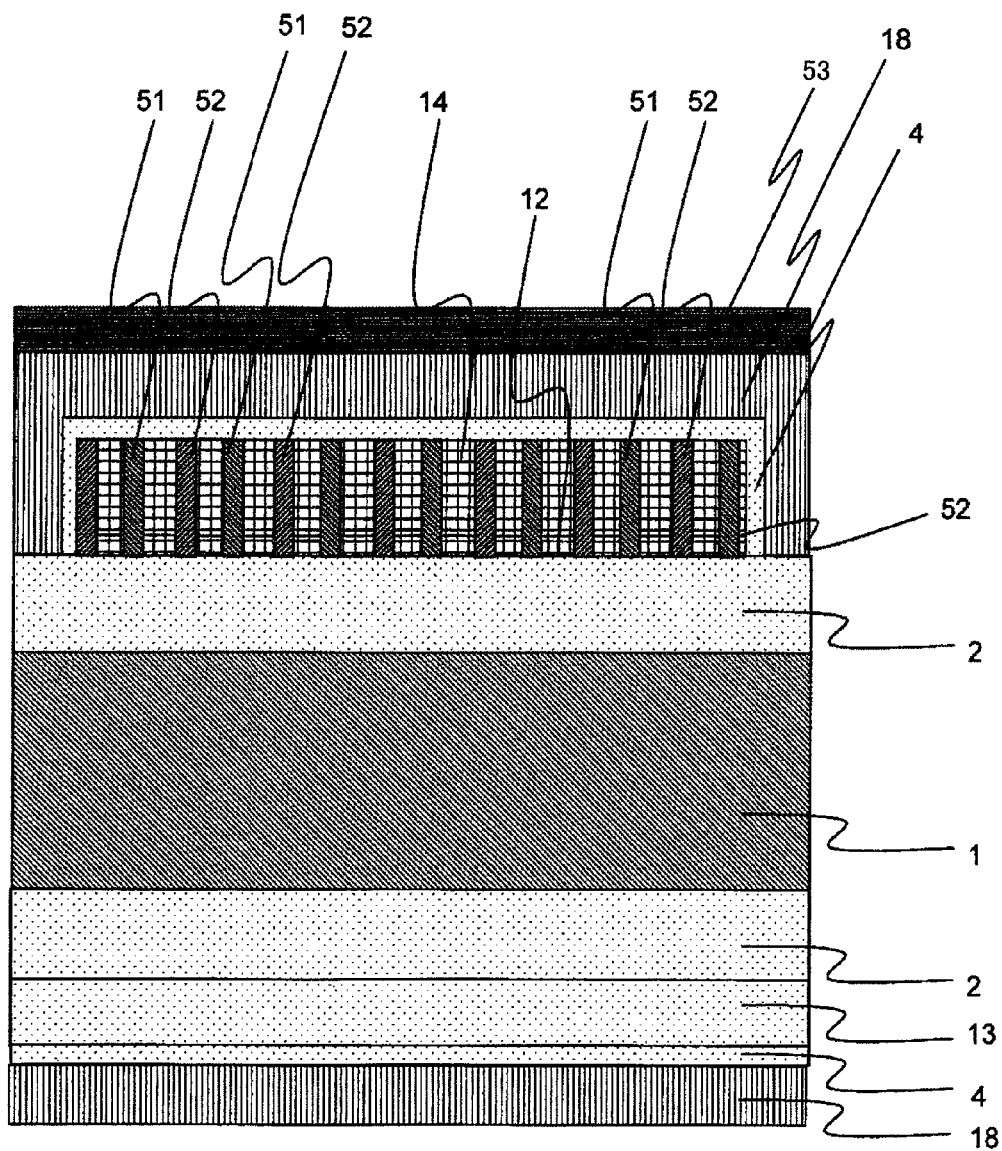
FIG. 12H is a sectional view showing the completed germanium photodiode according to the fourth embodiment of the present invention.

Next, an antireflective film 53 is formed so that light incident to the light-receiving device is prevented from escaping due to reflection. Then, after an opening is formed at a desired position, a wiring process for processing the TiN electrode 20 and the Al electrode 21 is performed. The resulting completed germanium photodiode is depicted in FIG. 10H, FIG. 11H and FIG. 12H.

It is confirmed that the completed germanium photodiode has a sufficient sensitivity of 0.8 A/W in a 1.5 μm band and operates at 40 GHz.

Fifth Embodiment

In the present embodiment, a longitudinal germanium photodiode formed on an SOI substrate by silicon process, using germanium with an extremely high degree of crystallinity and a film thickness large enough to detect light, capable of high-speed operation and having a small dark current and a method of manufacturing the longitudinal germanium photodiode will be disclosed. Since the longitudinal germanium photodiode can be easily coupled to an optical fiber, it has an advantage of being readily used for optical communications between chips.

FIG. 13A to FIG. 13J each depicts a sectional structure in the order of a manufacturing process. Also, FIG. 14J depicts a drawing of a completed device viewed from above the substrate. Here, FIG. 13A to FIG. 13J each depicts a structure taken along a cutting-plane line 23 in FIG. 14J. Furthermore, FIG. 14H to FIG. 14J each depicts a drawing viewed from above the substrate corresponding to FIG. 13H to FIG. 13J, respectively. The cutting-plane lines 23 and 24 are orthogonal to each other in the same plane, and the cutting-plane line 23 extends in an X direction in the drawing. The drawings of a completed device in the present embodiment are FIG. 13J and FIG. 14J.

The manufacturing process will be sequentially described below.

Figure 13A:
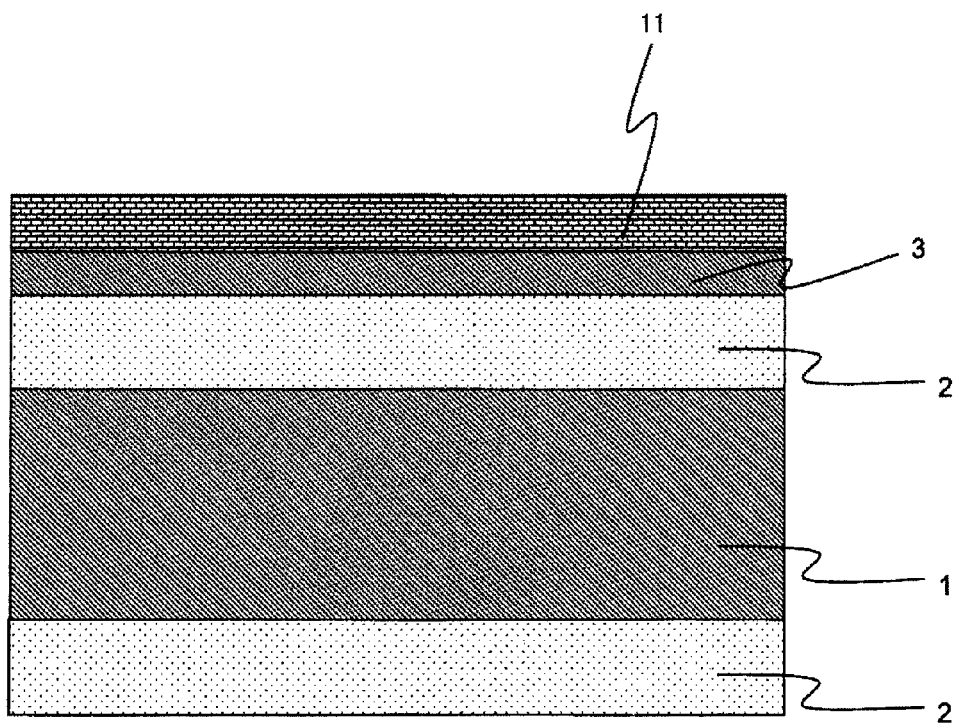
FIG. 13A is a sectional view showing a manufacturing process of a germanium photodiode according to a fifth embodiment of the present invention.

First, as depicted in FIG. 13A, an SOI substrate in which a silicon substrate 1 as a support substrate, a silicon dioxide film 2 as a buried oxide film (BOX layer) and a silicon film 3 as a semiconductor layer are stacked is prepared. The silicon film 3 in the test production of the present embodiment before being processed has an initial film thickness of 200 nm. Also, the silicon dioxide film 2 has a film thickness of 2000 nm. The silicon dioxide film 2 is formed also on a back surface side of the silicon substrate 1.

Here, after the SOI substrate is cleaned, a silicon-germanium film 11 made of 80% silicon and 20% germanium is epitaxially grown on the entire surface so as to have a film thickness of 50 nm. Since the film thickness of the grown silicon-germanium film 11 is equal to or smaller than a critical thickness, no crystal defect or dislocation is created.

Figure 13B:
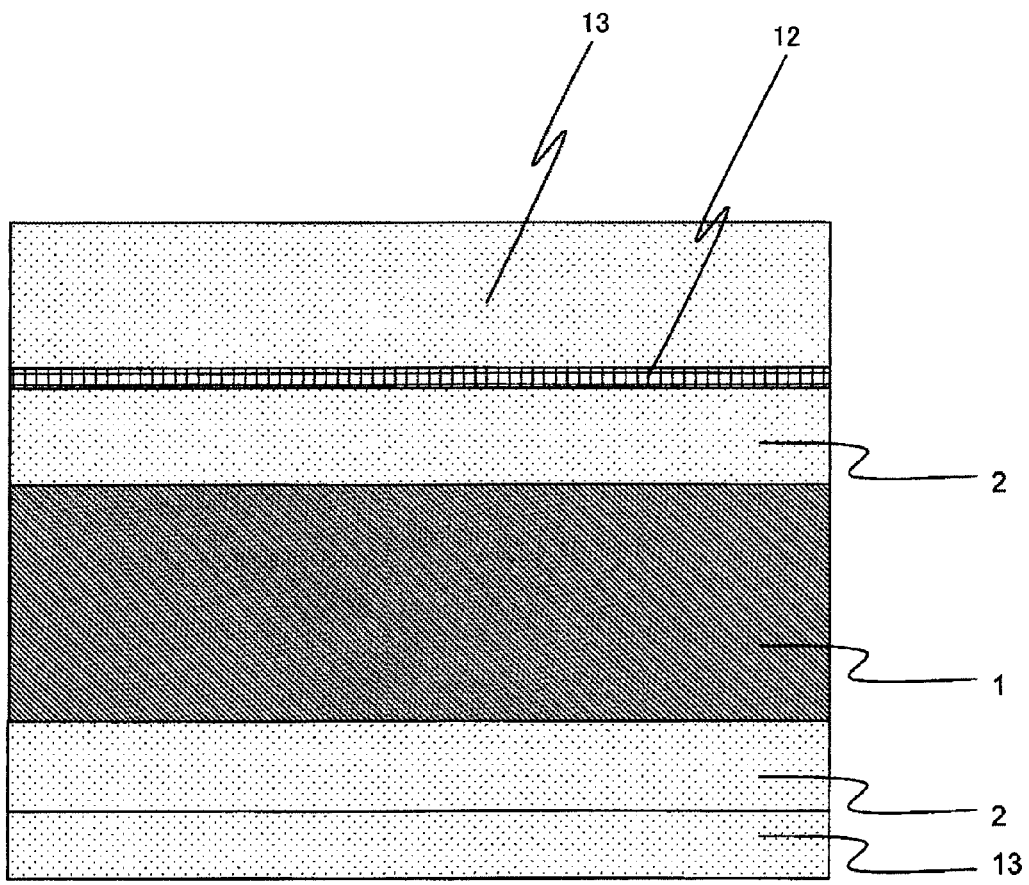
FIG. 13B is a sectional view showing the manufacturing process of the germanium photodiode according to the fifth embodiment of the present invention.

Next, by performing an oxidizing process on the entire surface, silicon present in the silicon-germanium film 11 is selectively oxidized, and an oxidizing process is performed so that a thermal oxidation film 13 made of silicon dioxide has a film thickness of 480 nm, thereby obtaining the state depicted in FIG. 13B in which a condensed ultra-thin single-crystal germanium film 12 having a thickness of 10 nm is formed.

Figure 13C:
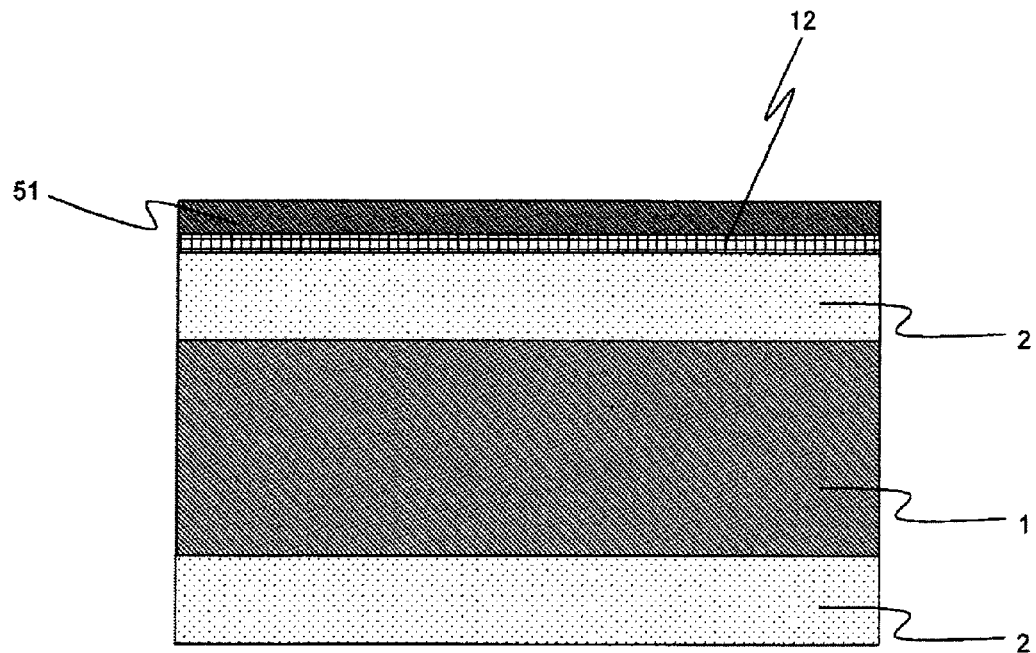
FIG. 13C is a sectional view showing the manufacturing process of the germanium photodiode according to the fifth embodiment of the present invention.

Subsequently, after the thermal oxidation film 13 is removed by wet etching, the surface is cleaned by a cleaning process, and then a p-type diffusion layer electrode 51 doped to be a p type is epitaxially grown so as to have a film thickness of 100 nm, thereby obtaining the state of FIG. 13C. In this crystal growth, the interface characteristics between the ultra-thin single-crystal germanium film 12 and the p-type diffusion layer electrode 51 are excellent, and no crystal defect or dislocation is created. Note that, while the p-type diffusion layer electrode 51 is crystal-grown on the ultra-thin single-crystal germanium film 12 in the present embodiment, other materials with a small difference in lattice constant from germanium and effective for a light-emitting or light-receiving device may be epitaxially grown. In particular, since GaAs is a direct transition semiconductor with a small difference in lattice constant from germanium, a compound semiconductor with an extremely high degree of crystallinity such as GaAs can be epitaxially grown on the surface where the ultra-thin single-crystal germanium film 12 with a high degree of crystallinity is formed like in the present embodiment. By using this manufacturing process, a compound semiconductor with a high degree of crystallinity can be directly grown on a silicon substrate without having a so-called buffer layer. In addition, when a buffer layer is formed on ultra-thin germanium, even a compound semiconductor slightly different in lattice constant from GaAs can be crystal-grown.

Figure 13D:
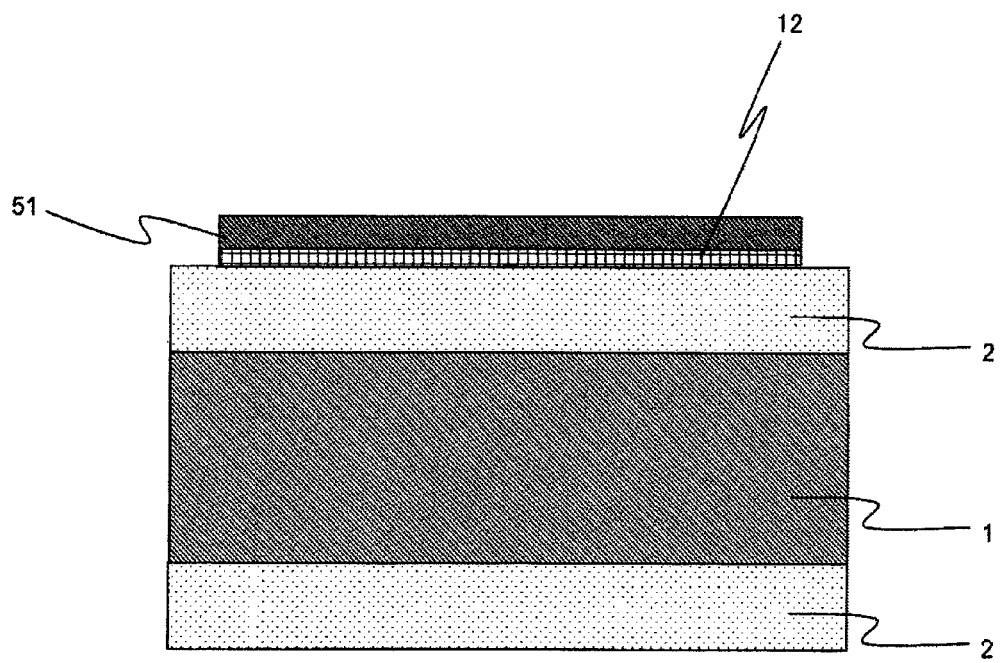
FIG. 13D is a sectional view showing the manufacturing process of the germanium photodiode according to the fifth embodiment of the present invention.

Next, after a resist is applied, the resist is left only in a desired region exposed through a mask by photolithography, and then anisotropic dry etching is performed. By this means, as depicted in FIG. 13D, the ultra-thin single-crystal germanium film 12 and the p-type diffusion layer electrode 51 are processed in a mesa shape. Although only one device is shown in each drawing for simplification, it goes without saying that many devices are simultaneously formed on the substrate. Since a silicon process is used, many devices can be integrated with high yields. With this process, electric separation among the devices can be established.

Figure 13E:
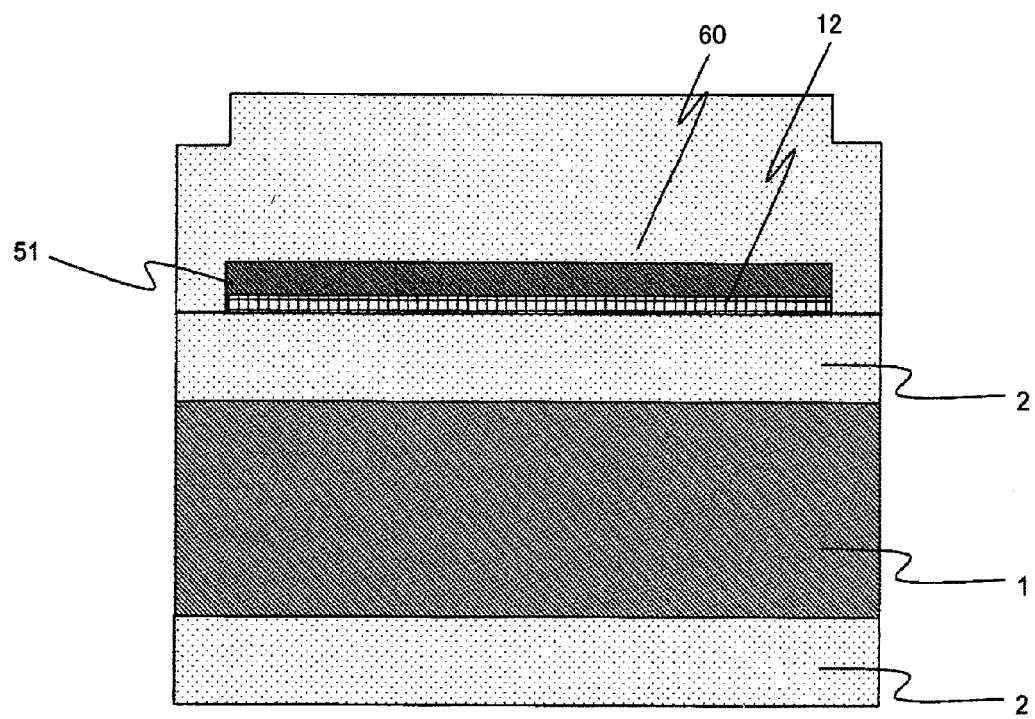
FIG. 13E is a sectional view showing the manufacturing process of the germanium photodiode according to the fifth embodiment of the present invention.

Next, after a cleaning process is performed, in order to protect the surface, a silicon dioxide film 60 having a thickness of approximately 1000 nm is formed on the surface by a CVD method, thereby obtaining the state depicted in FIG. 13E.

Figure 13F:
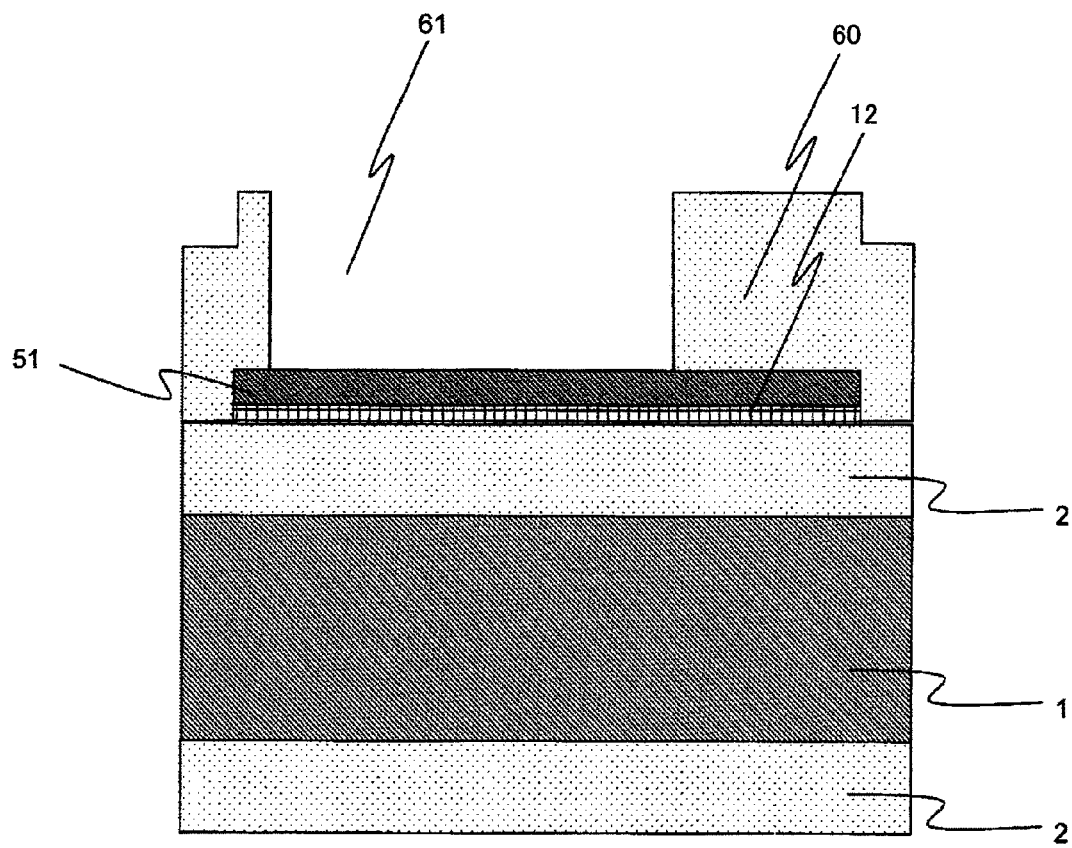
FIG. 13F is a sectional view showing the manufacturing process of the germanium photodiode according to the fifth embodiment of the present invention.
Figure 13G:
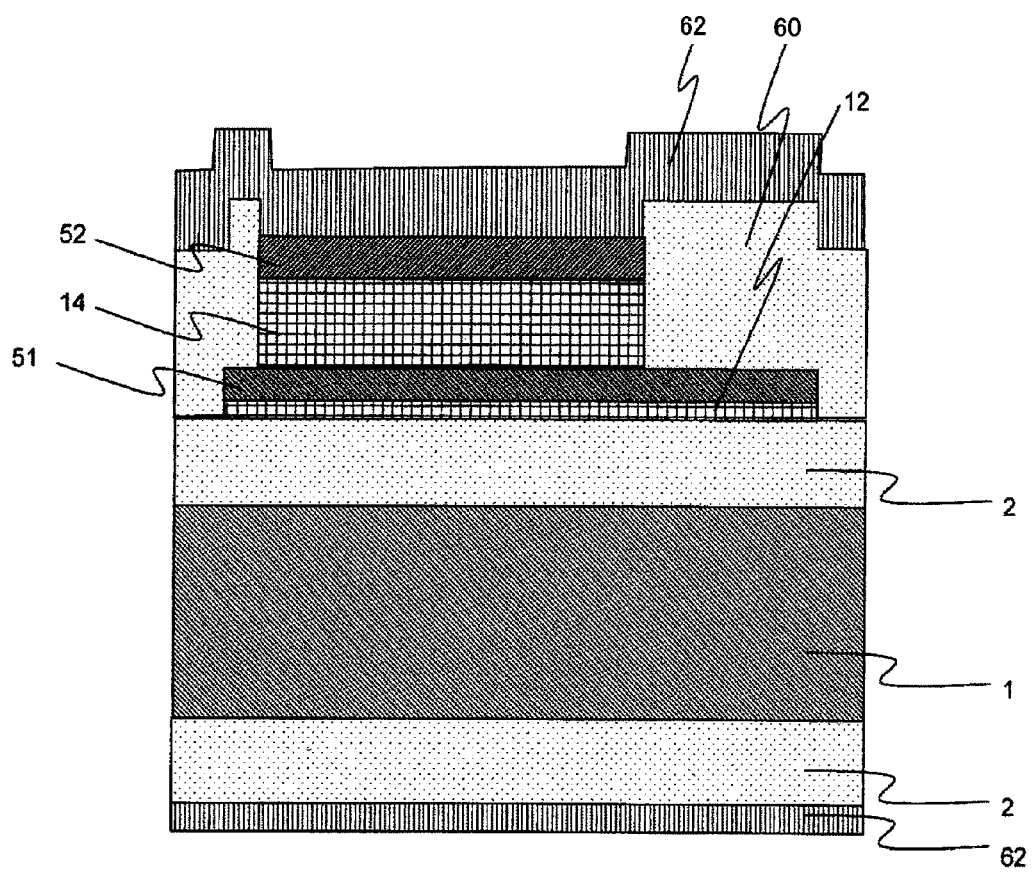
FIG. 13G is a sectional view showing the manufacturing process of the germanium photodiode according to the fifth embodiment of the present invention.

Next, after a resist is applied, the resist is left only in a desired region exposed through a mask by photolithography, and then anisotropic dry etching is performed, thereby obtaining the state depicted in FIG. 13F in which an opening 61 is formed.

Next, after the surface is cleaned by a cleaning process, a non-doped single-crystal germanium film 14 is selectively epitaxially grown so as to have a film thickness of 800 nm. Subsequently, an n-type diffusion layer electrode 52 doped to be an n type is epitaxially grown so as to have a film thickness of 100 nm. Also in this selective crystal growth, the interface characteristics are excellent, and no crystal defect or dislocation is created.

Subsequently, the entire surface is covered with a passivation film 62 that applies tensile strain to a germanium light-receiving layer by a CVD method, thereby obtaining the state depicted in FIG. 13H. When light of a short wavelength such as a 1.3 µm band or a 850 nm band is received, an insulating film without containing an internal stress may be used as the passivation film 62. In the present embodiment, two cases where silicon nitride is used for applying tensile strain and where a silicon dioxide film with a small internal stress is used as the passivation film 62 are tested. As a result, it has become clear that the former is effective in a 1.5 µm band and the latter is effective in a longer waveband.

Figure 13H:
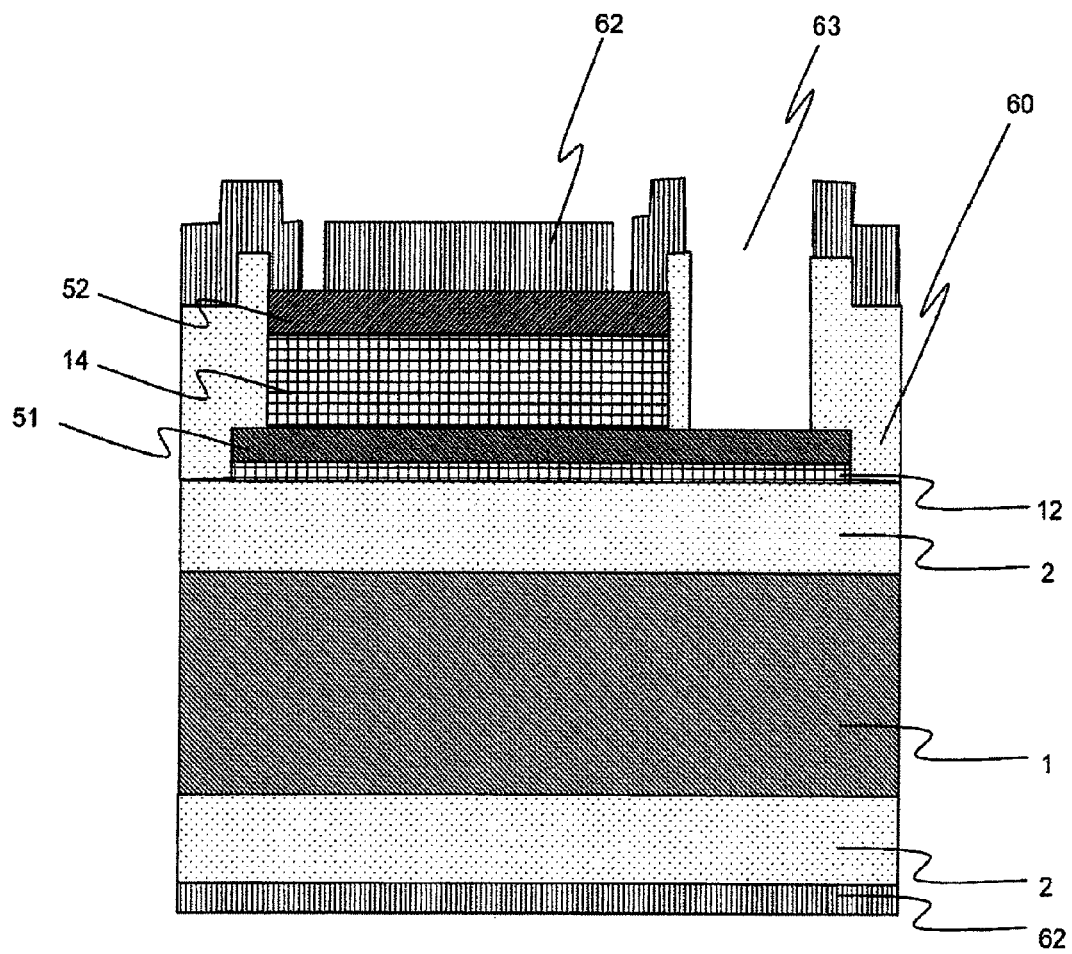
FIG. 13H is a sectional view showing the manufacturing process of the germanium photodiode according to the fifth embodiment of the present invention.
Figure 14H:
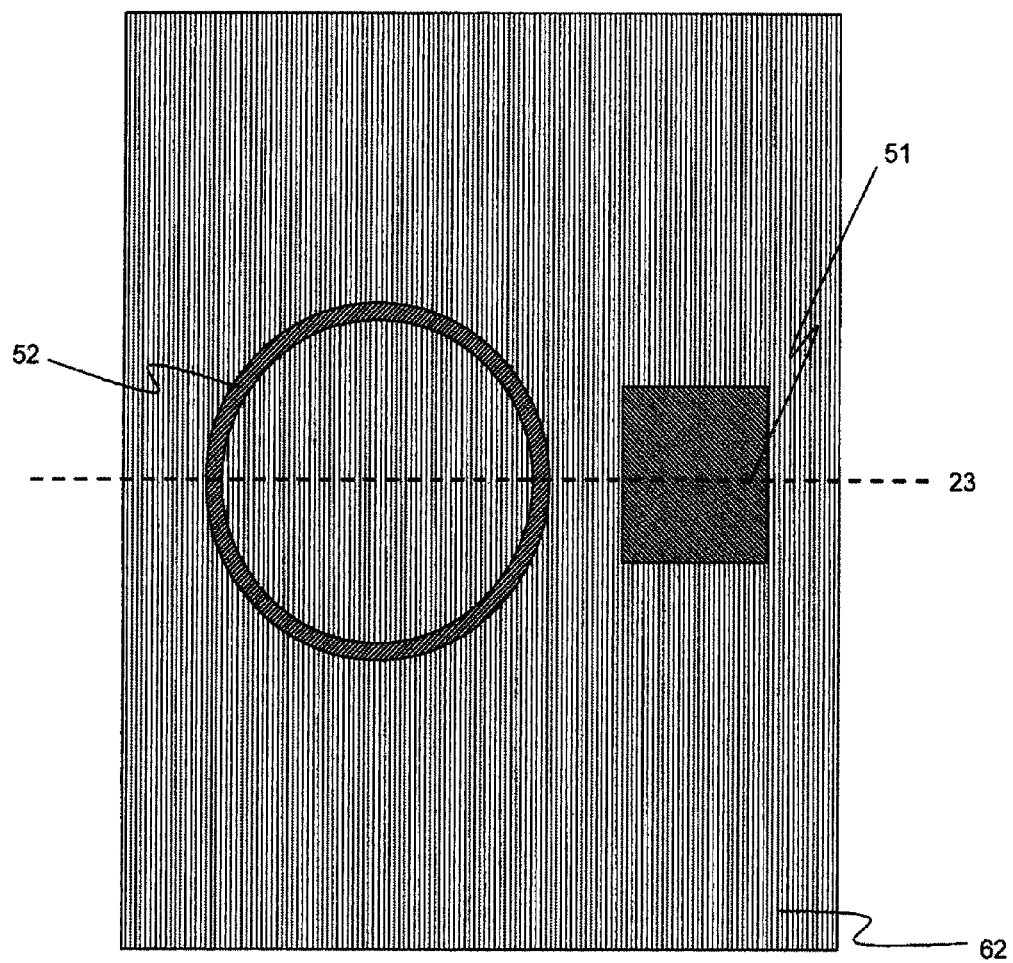
FIG. 14H is a view showing the manufacturing process of the germanium photodiode according to the fifth embodiment of the present invention seen from above.

Next, after a resist is applied, the resist is left only in a desired region exposed through a mask by photolithography, and then anisotropic dry etching is performed, thereby obtaining the state depicted in FIG. 13H and FIG. 14H in which an opening 63 is formed.

Subsequently, after a TiN film and an Al film are deposited on the entire surface, a resist is left only in a desired region by resist patterning using photolithography. Thereafter, the Al film is wet-etched by using an etching solution containing phosphoric acid, acetic acid and nitric acid, and then the TiN film is wet-etched by using an etching solution containing ammonia and hydrogen peroxide. As a result, a TiN electrode 20 and an Al electrode 21 are formed by patterning.

Figure 13I:
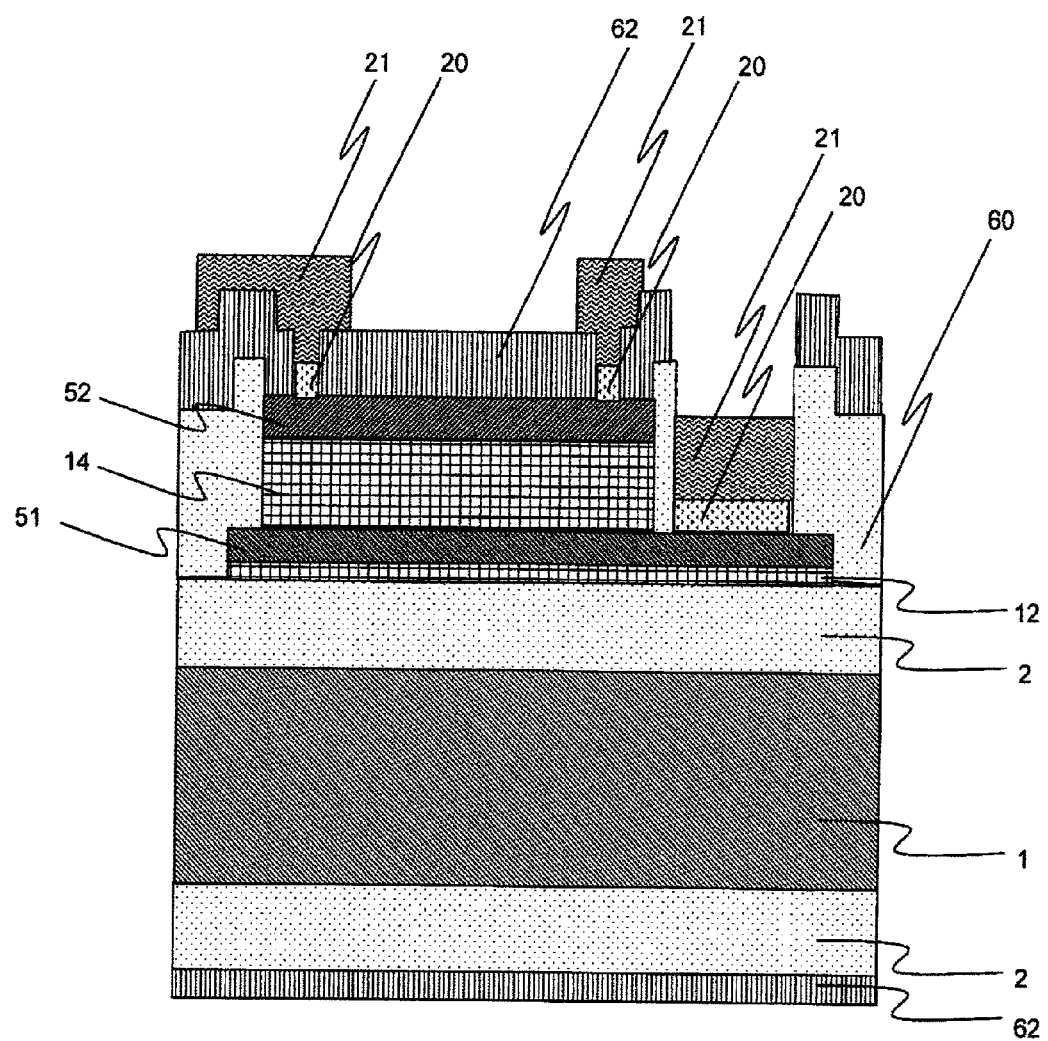
FIG. 13I is a sectional view showing the manufacturing process of the germanium photodiode according to the fifth embodiment of the present invention.
Figure 14I:
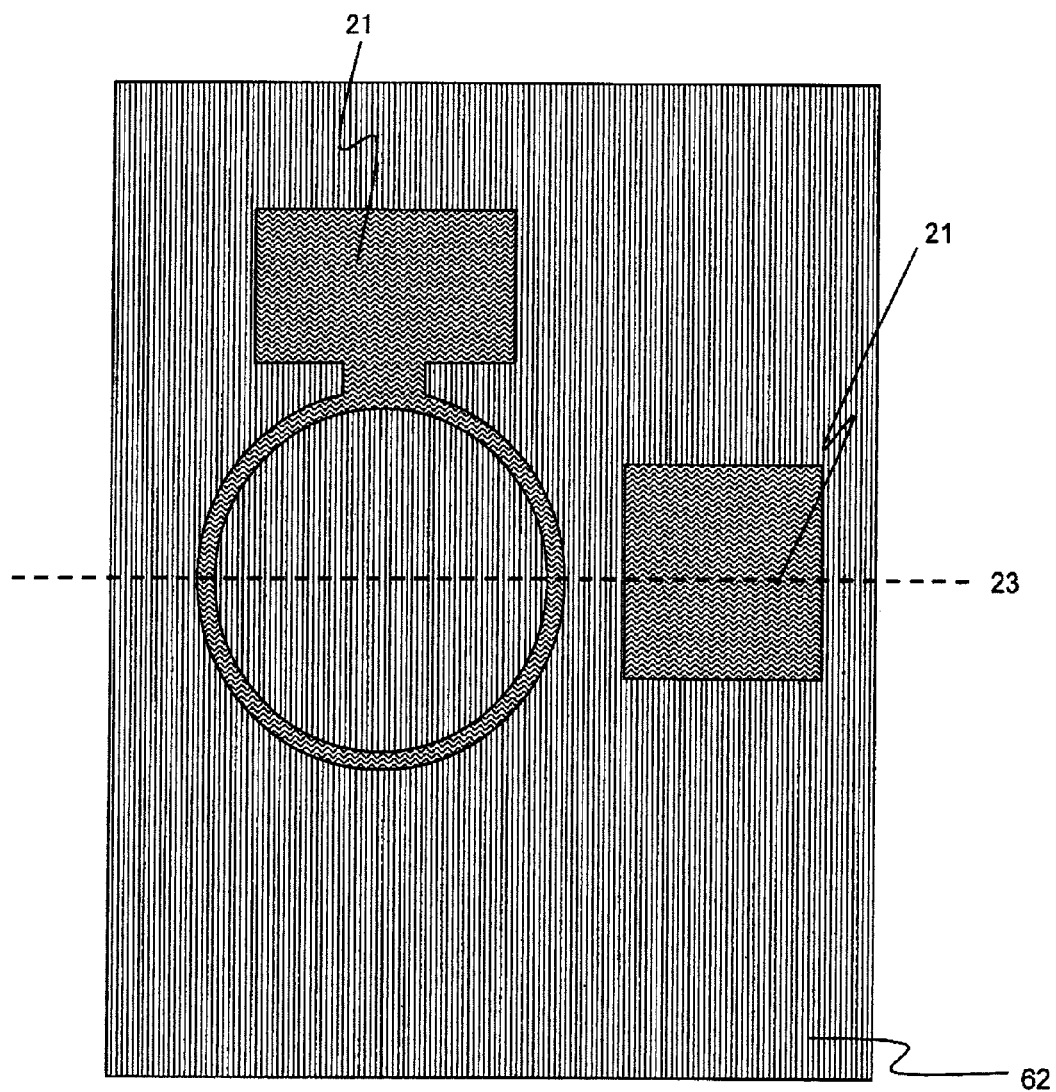
FIG. 14I is a view showing the manufacturing process of the germanium photodiode according to the fifth embodiment of the present invention seen from above.
Figure 14J:
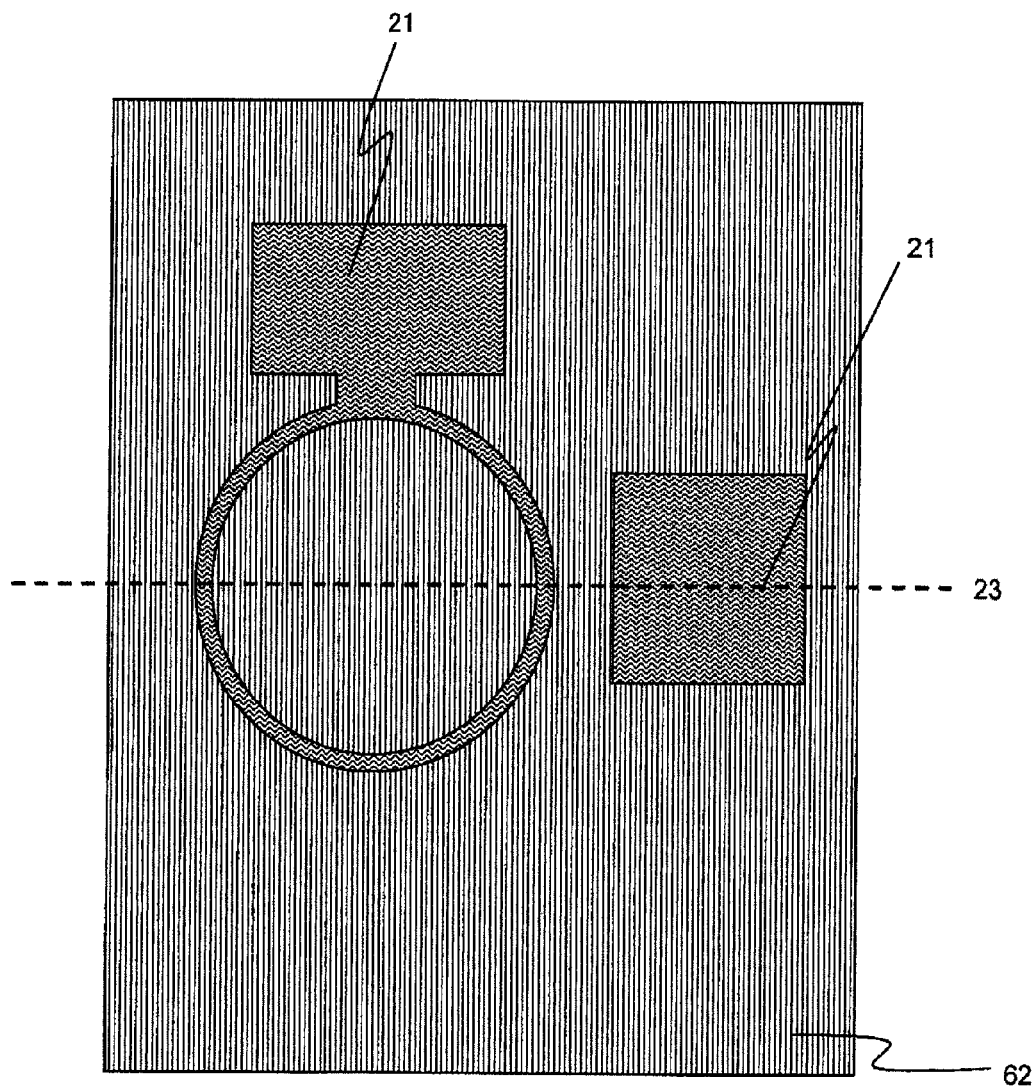
FIG. 14J is a view showing the completed germanium photodiode according to the fifth embodiment of the present invention seen from above.

Subsequently, a hydrogen annealing process is performed at a temperature of 400° C. to perform the treatment for hydrogen-terminating the defects created during the process, thereby obtaining the state of FIG. 13I and FIG. 14I.

Figure 13J:
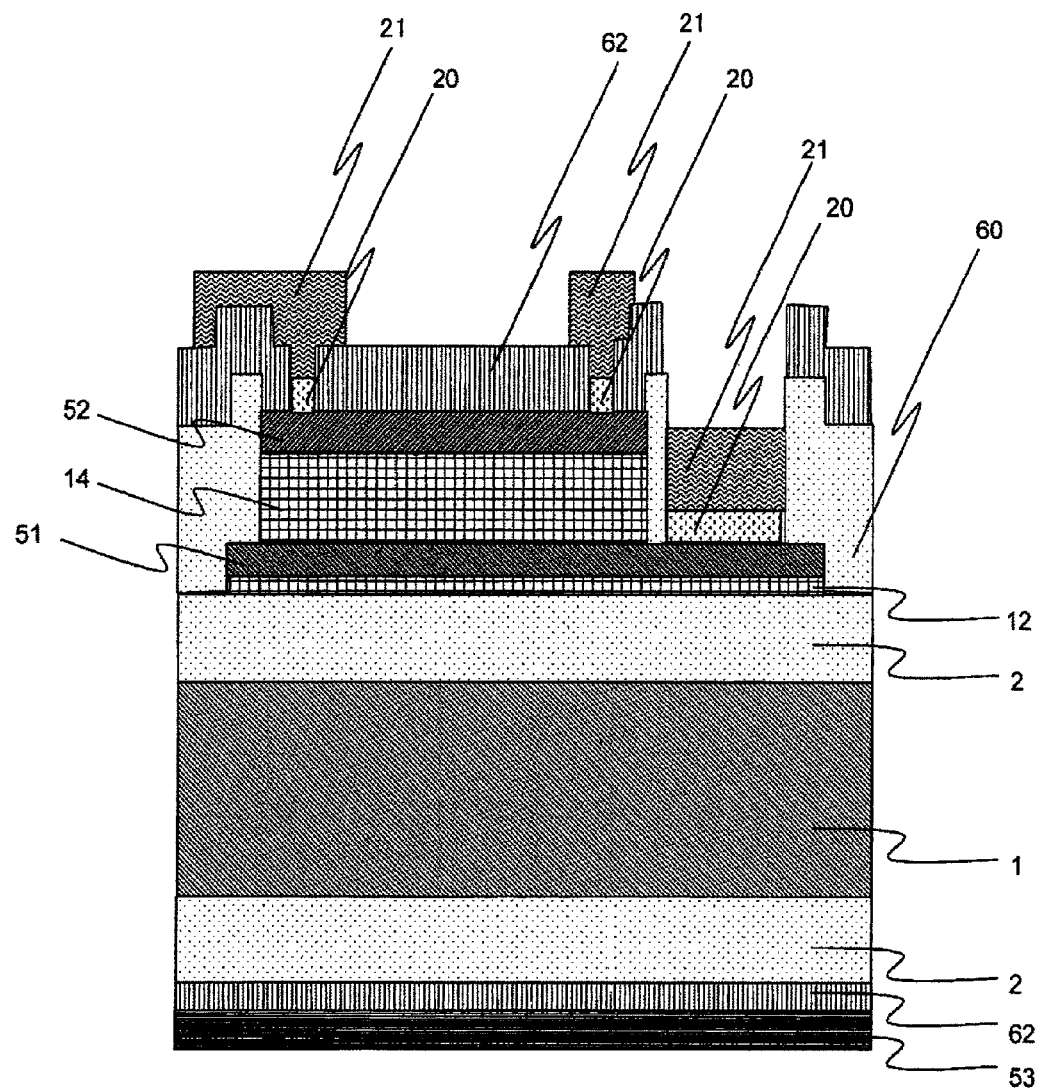
FIG. 13J is a sectional view showing the completed germanium photodiode according to the fifth embodiment of the present invention.

Finally, an antireflective film 53 is formed only on the back surface side of the silicon substrate 1, thereby obtaining the state of FIG. 13J and FIG. 14J in which the device is completed. In the present embodiment, the antireflective film 53 is formed on the back surface side of the silicon substrate 1, and light enters from the back surface side of the silicon substrate 1. Alternatively, the antireflective film 53 may be formed on the front surface side (device formation surface side) of the silicon substrate 1 to make the light enter from the upper surface.

It is confirmed that the completed germanium photodiode has a sufficient sensitivity of 0.8 A/W and operates at high speed at 40 GHz.

Sixth Embodiment

In the present embodiment, an example of an optical integrated circuit using the germanium laser diode and the germanium photodiode based on the present invention will be described.

Figure 15:
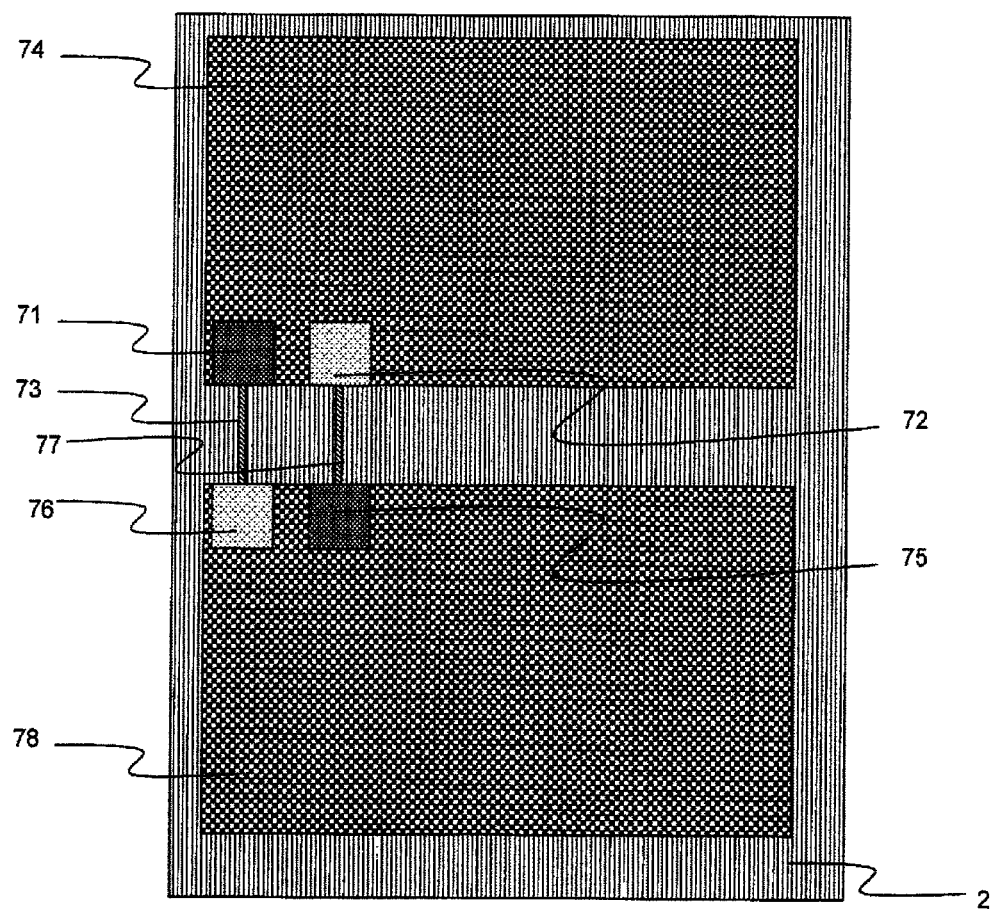
FIG. 15 is a view showing a completed photoelectronic integrated circuit according to a sixth embodiment of the present invention seen from above.

FIG. 15 depicts an example of a photoelectronic integrated circuit. In this photoelectronic integrated circuit, electronic circuits and optical devices are integrated together. A signal from an electronic circuit 74 is converted to light by a germanium laser diode 71, and is transmitted through an optical waveguide 73. This light is converted by a germanium photodiode 76 from light to electricity, and is then processed again as an electrical signal in an electronic circuit 78. Then, the electrical signal from the electronic circuit 78 is converted to light by a germanium laser diode 75, and is transmitted through an optical waveguide 77. This light is converted by a germanium photodiode 72 from light to electricity, and is then processed again as an electrical signal in the electronic circuit 74.

As described above, by performing the signal transmission between electric circuits with light, information processing can be performed at high speed and with low power consumption. In particular, since the light emitted from the germanium laser diode based on the present invention has a long wavelength, the light cannot be absorbed in a device in a silicon LSI. Thus, it has been confirmed that crosstalk and an erroneous operation of an electric circuit due to light, which are problematic in the conventional silicon light-emitting device, do not occur.

As an optical waveguide, not only the silicon nitride film or a silicon fine-line waveguide as described above but also an organic substance such as a polymer or an optical fiber can be used. As a result, it has become clear that it can be used not only inside a chip but also in optical communications between chips.

In the foregoing, the invention made by the inventors of the present invention has been concretely described based on the embodiments. However, it is needless to say that the present invention is not limited to the foregoing embodiments and various modifications and alterations can be made within the scope of the present invention.

EXPLANATION OF REFERENCE NUMERALS 1. silicon substrate, 2. silicon dioxide film, 3. silicon film, 4. silicon dioxide film, 5. silicon nitride film, 6. thin-film silicon film, 7. thermal oxidation film, 8. thermal oxidation film, 9. silicon nitride film, 10. opening, 11. silicon-germanium film, 12. ultra-thin single-crystal germanium film, 13. thermal oxidation film, 14. germanium film, 15. p-type diffusion layer electrode, 16. n-type diffusion layer electrode, 17. silicon dioxide film, 18. silicon nitride film, 19. opening, 20. TiN electrode, 21. Al electrode, 22. DBR mirror, 30. silicon-germanium film, 31. p-type diffusion layer electrode. 32. n-type diffusion layer electrode, 33. strain-applying silicon nitride resonator, 40. strain-applying insulator, 41. silicon nitride waveguide, 42. DBR mirror, 51. p-type diffusion layer electrode, 52. n-type diffusion layer electrode, 53. antireflective film, 60. silicon dioxide film, 61. opening, 62. passivation film, 63. opening, 71. germanium laser diode, 72. germanium photodiode, 73. optical waveguide, 74. electronic circuit, 75. germanium laser diode, 76. germanium photodiode, 77. optical waveguide, 78. electronic circuit

The invention claimed is:

1. A light-emitting device, comprising: on an insulating film formed on a substrate,
   a first electrode for injecting electrons;
   a second electrode for injecting holes; and
   a light-emitting part disposed between the first electrode and the second electrode and electrically connected to the first electrode and the second electrode,
   wherein, by applying a voltage between the first electrode and the second electrode, electrons and holes are injected to the light-emitting part in a planar direction of the substrate,
   the light-emitting part is a single-crystal germanium film to which tensile strain is applied by a silicon nitride film,
   a waveguide is formed spatially apart from the first electrode and the second electrode in a vertical direction orthogonal to the planar direction of the substrate, and
   a mirror made of a dielectric is formed at an end or inside of the waveguide.

2. The light-emitting device according to claim 1, wherein the waveguide and the light-emitting part are each made of the single-crystal germanium film.

3. The light-emitting device according to claim 1, wherein the single-crystal germanium film has a film thickness of 10 nm or larger and 500 nm or smaller.

4. The light-emitting device according to claim 1, wherein a surface of the light-emitting part is covered with a first dielectric, and the waveguide is made of a second dielectric disposed adjacently to the first dielectric.

5. The light-emitting device according to claim 4, wherein the first dielectric is a silicon dioxide film or a silicon nitride film, and the second dielectric is any one of a silicon nitride film, a polycrystalline silicon firm, a SiON film, an $Al_2O_3$ film, a $Ta_2O_5$ film, a $HfO_2$ film and a $TiO_2$ film.

6. The light-emitting device according to claim 1, wherein the mirror is disposed at an end of the waveguide, and the mirror is formed by cyclically disposing small dielectric pieces.

7. The light-emitting device according to claim 4, wherein each of the small dielectric pieces forming the mirror is any one of a single-crystal silicon film, a silicon nitride film, a polycrystalline silicon film, an amorphous silicon film, a SiON film, an $Al_2O_3$ film, a $Ta_2O_5$ film, a $HfO_2$ film and a $TiO_2$ film.

8. The light-emitting device according to claim 1, wherein the mirror is arranged inside the waveguide, and the mirror is formed by disposing small dielectric pieces.

9. The light-emitting device according to claim 8, wherein each of the small dielectric pieces forming the mirror is any one of a single-crystal germanium film, a single-crystal silicon film, a silicon nitride film, a polycrystalline silicon film, an amorphous silicon film, a SiON film, an $Al_2O_3$ film, a $Ta_2O_5$ film, a $HfO_2$ film and a $TiO_2$ film.

10. The light-emitting device according to claim 1, wherein the silicon nitride film has an internal stress for applying tensile strain to the single-crystal germanium film, and
    a lattice constant of the single-crystal germanium film is larger than a lattice constant in an equilibrium state.

* * * * *